(12) United States Patent
Koike et al.

(10) Patent No.: US 8,451,394 B2
(45) Date of Patent: **\*May 28, 2013**

(54) LIQUID CRYSTAL DISPLAY DEVICE AND MANUFACTURING METHOD THEREFOR

(75) Inventors: Junichi Koike, Sendai (JP); Hideaki Kawakami, Chiba (JP)

(73) Assignee: Altiam Services Ltd. LLC, Dover, DE (US)

( \* ) Notice: Subject to any disclaimer, the term of this patent is extended or adjusted under 35 U.S.C. 154(b) by 147 days.

This patent is subject to a terminal disclaimer.

(21) Appl. No.: 12/799,163

(22) Filed: Apr. 20, 2010

(65) Prior Publication Data

US 2010/0201901 A1 Aug. 12, 2010

Related U.S. Application Data

(63) Continuation of application No. 11/801,304, filed on May 9, 2007, now Pat. No. 7,782,413.

(51) Int. Cl.
*G02F 1/136* (2006.01)

(52) U.S. Cl.
USPC ........... 349/42; 349/43; 438/30; 257/E21.001

(58) Field of Classification Search
USPC .................. 349/42, 43; 438/30; 257/E21.001
See application file for complete search history.

(56) References Cited

U.S. PATENT DOCUMENTS

| | | | |
|---|---|---|---|
| 2,701,698 A | 2/1955 | Holstein | |
| 5,598,285 A | 1/1997 | Kondo et al. | |
| 5,959,358 A | 9/1999 | Lanford et al. | |
| 6,686,661 B1 | 2/2004 | Lee et al. | |
| 7,289,183 B2 | 10/2007 | Gan et al. | |
| 7,507,666 B2 | 3/2009 | Nakao et al. | |
| 7,626,665 B2 * | 12/2009 | Koike | 349/139 |
| 7,782,413 B2 | 8/2010 | Koike et al. | |
| 2006/0046336 A1 * | 3/2006 | Shoji et al. | 438/30 |
| 2006/0208962 A1 * | 9/2006 | Sekiya | 345/45 |

(Continued)

FOREIGN PATENT DOCUMENTS

| | | |
|---|---|---|
| JP | S58-124254 | 7/1983 |
| JP | 10-153788 | 6/1998 |

(Continued)

OTHER PUBLICATIONS

Notification of Reasons for Refusal issued in Japan Patent Application No. 2007-124037, issued on Oct. 14, 2011, Japan Patent Office.

(Continued)

*Primary Examiner* — Ellen Kim
(74) *Attorney, Agent, or Firm* — Woodcock Washburn LLP

(57) ABSTRACT

The present invention includes a liquid crystal display device with an oxide film having high adhesiveness to a semiconductor layer or a pixel electrode to thereby prevent oxidation of a wiring material or the like, and includes a source electrode and a drain electrode having high conductivity, and a manufacturing method therefor. In one embodiment of the present invention, a liquid crystal display device has a TFT electrode of a TFT substrate, wherein a source electrode or a drain electrode includes a layer of mainly copper and an oxide covering an outer part of the layer. Further, in the present invention, the semiconductor layer or the pixel electrode and said source electrode or the drain electrode are in ohmic contact in the TFT electrode.

23 Claims, 48 Drawing Sheets

U.S. PATENT DOCUMENTS

| | | |
|---|---|---|
| 2006/0275618 A1 | 12/2006 | Kugimiya et al. |
| 2007/0002239 A1 | 1/2007 | Koike |
| 2008/0170193 A1 | 7/2008 | Koike et al. |
| 2008/0174729 A1* | 7/2008 | Ohta et al. ............... 349/147 |
| 2008/0252843 A1 | 10/2008 | Koike et al. |
| 2010/0117074 A1* | 5/2010 | Yamazaki et al. ............ 257/43 |

FOREIGN PATENT DOCUMENTS

| | | |
|---|---|---|
| JP | 10-301150 | 11/1998 |
| JP | H11-194361 | 7/1999 |
| JP | H11-274524 | 10/1999 |
| JP | 2000-199054 | 7/2000 |
| JP | 2000-252472 | 9/2000 |
| JP | 2002-069550 | 3/2002 |
| JP | 2003-005220 | 1/2003 |
| JP | 2004-091907 | 3/2004 |
| JP | 2004-139057 | 5/2004 |
| JP | 2004-163901 | 6/2004 |
| JP | 2004-172150 | 6/2004 |
| JP | 2005-158887 | 6/2005 |
| JP | 2005-166757 | 6/2005 |
| JP | 2005-215649 | 8/2005 |
| JP | 2007-017926 A | 1/2007 |
| JP | 2007-072428 A | 3/2007 |
| JP | 2009-004518 A | 1/2009 |
| KR | 2007-001648 | 1/2007 |
| WO | WO 2006/025347 A1 | 3/2006 |

OTHER PUBLICATIONS

Arcot et al., "Intermetallic Reactions Between Copper and Magnesium as an Adhesion/Barrier Layer", Materials Research Society Symposium Proceedings, Apr. 30-May 3, 1991, vol. 225, 231-236.

Chae et al., "Self-passivated copper as a gate electrode in a poly-Si thin film transistor liquid crystal display", Journal of Applied Physics, Jul. 1, 2001, 90(1), 411-415.

Lee et al., "Diffusion barrier and electrical characteristics of a self-aligned MgO layer obtained from a Cu(Mg) alloy film", Applied Physics Letters, Oct. 2, 2000, 77(14), 2192-2194.

* cited by examiner

FIG. 21
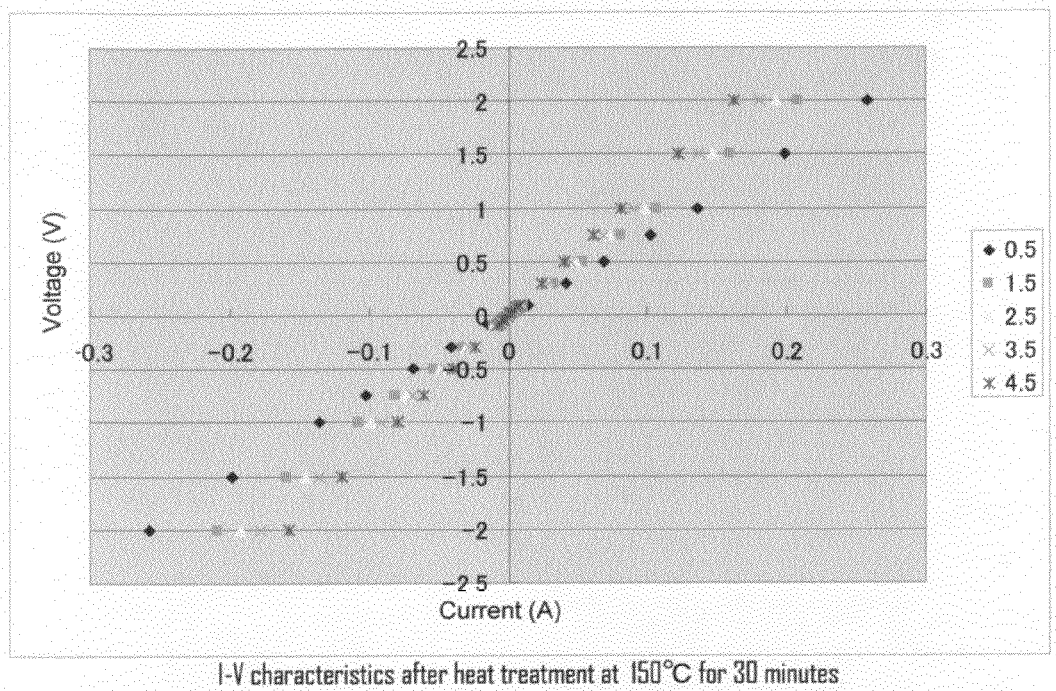
I-V characteristics after heat treatment at 150°C for 30 minutes
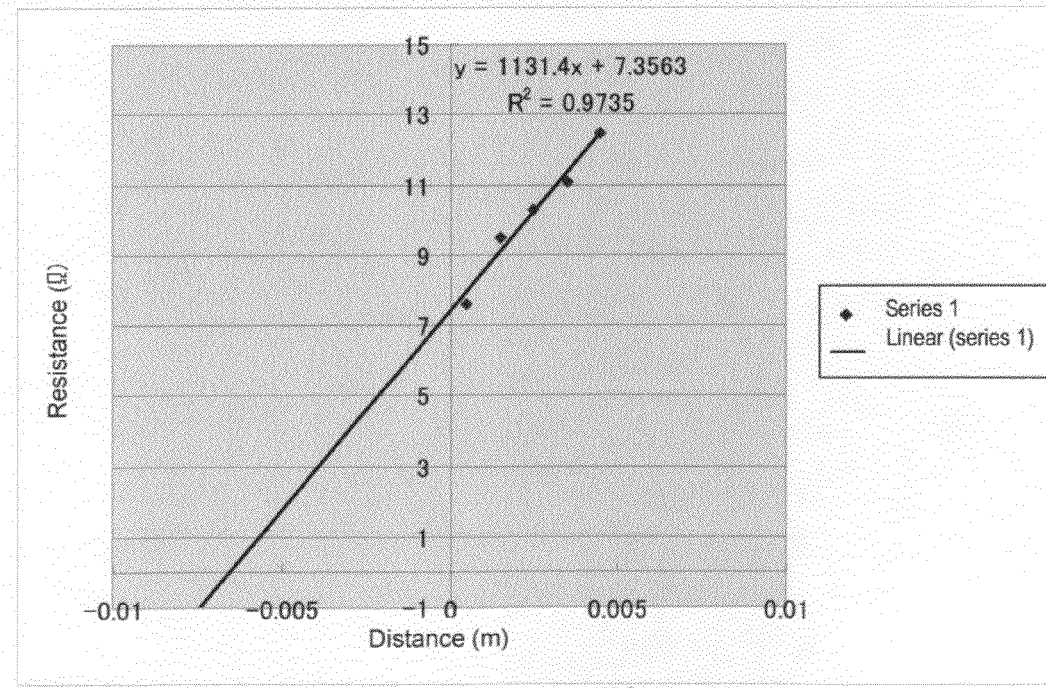
I-V characteristics after heat treatment at 150°C for 30 minutes FIG.22
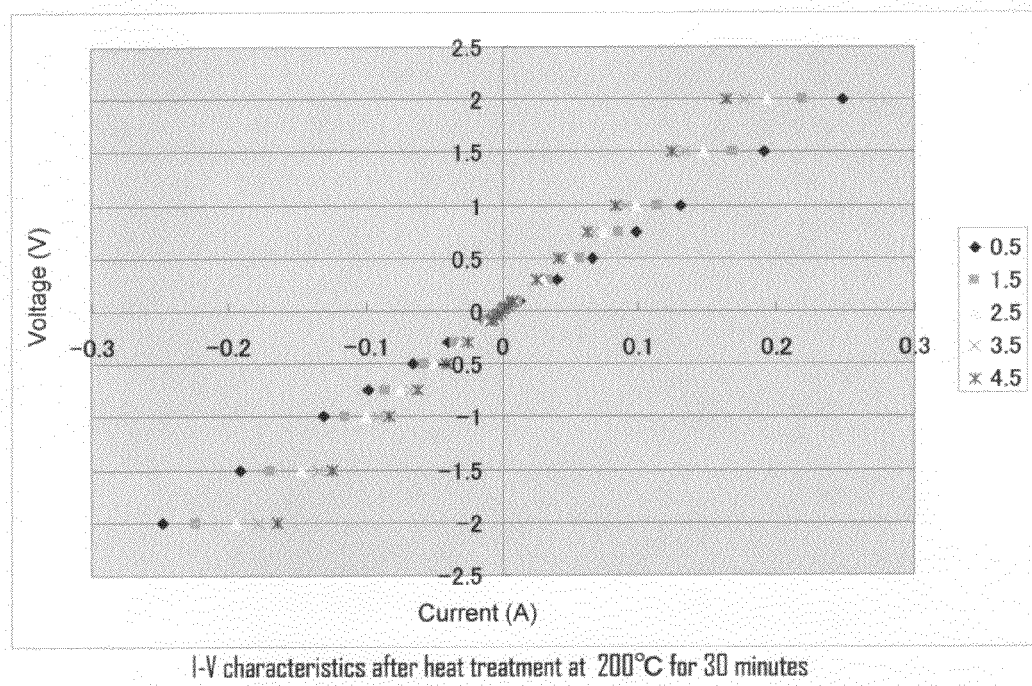
I-V characteristics after heat treatment at 200°C for 30 minutes
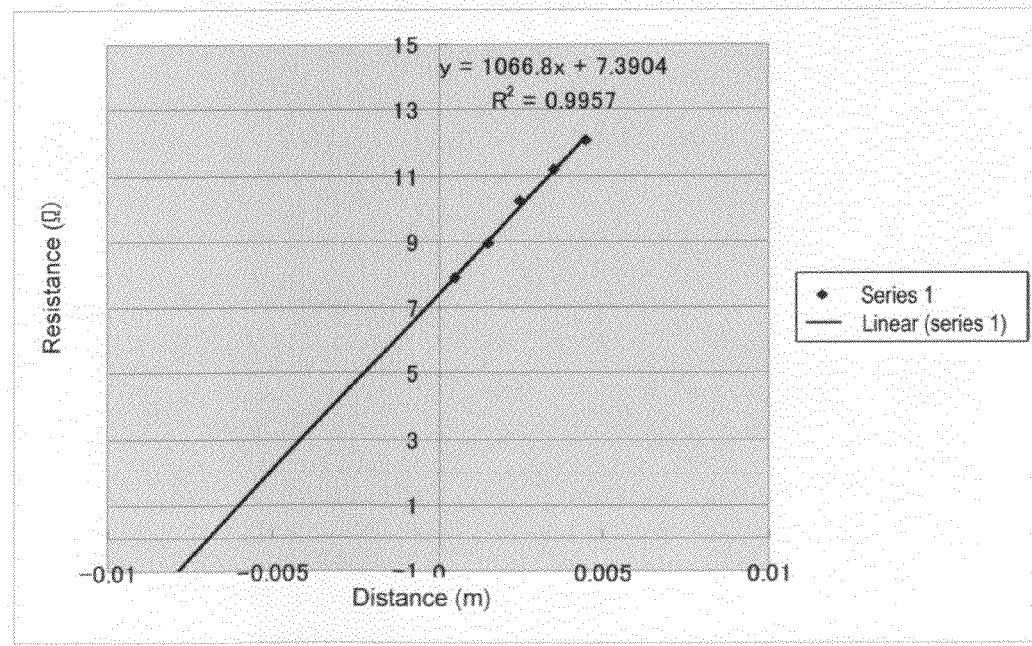
I-V characteristics after heat treatment at 200°C for 30 minutes FIG.23
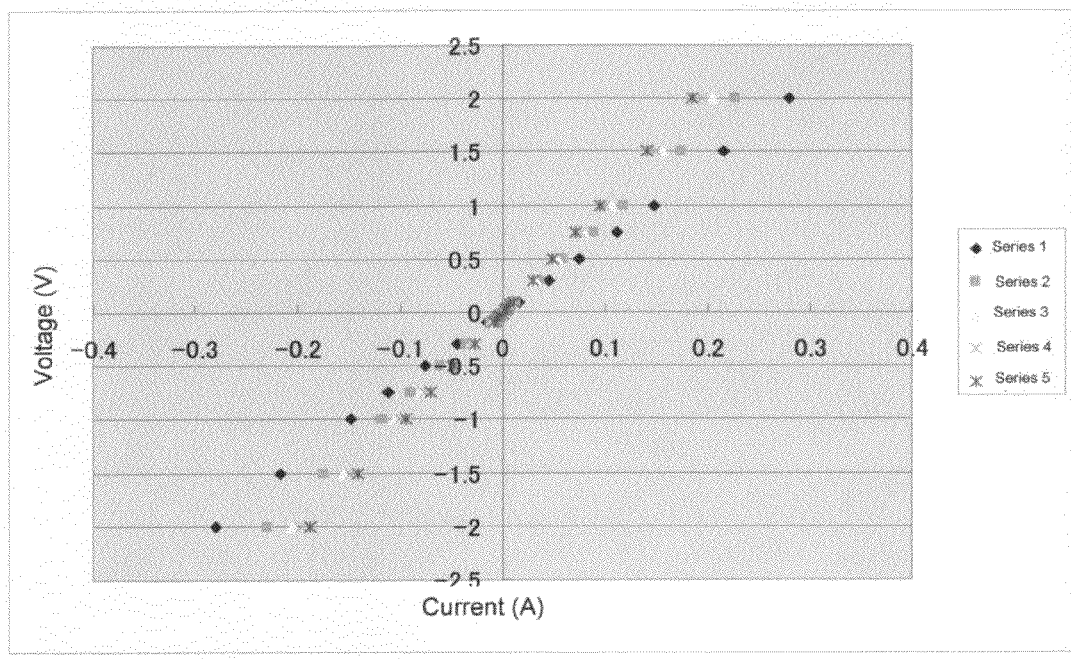
I-V characteristics after heat treatment at 250°C for 30 minutes
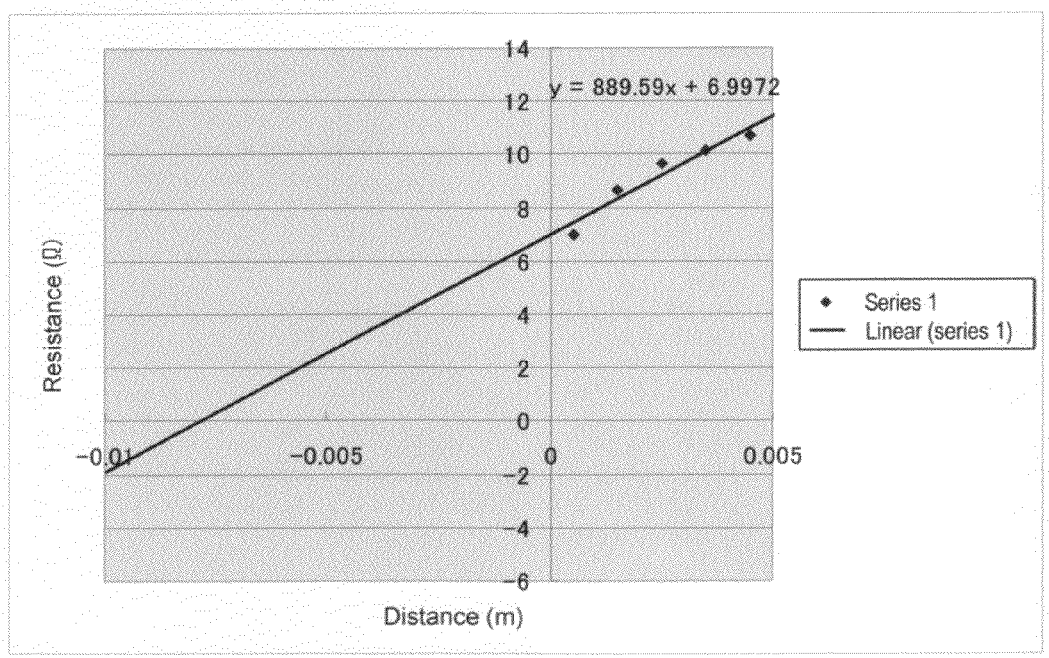
I-V characteristics after heat treatment at 250°C for 30 minutes

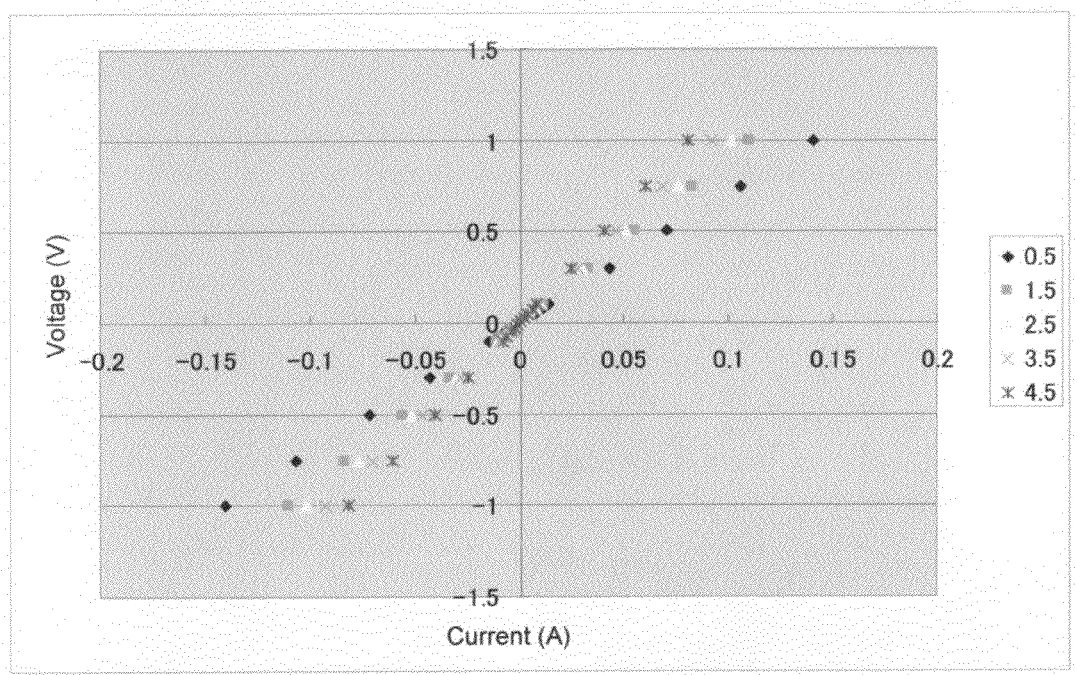
I-V characteristics after heat treatment at 300°C for 30 minutes
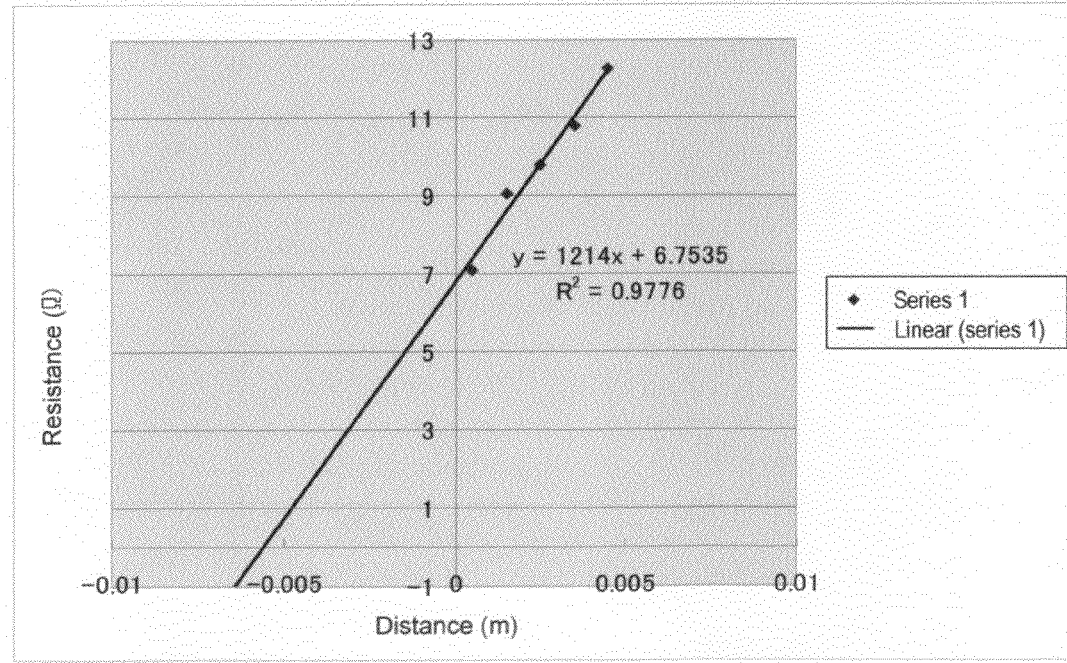
I-V characteristics after heat treatment at 300°C for 30 minutes Change in contact resistance
by thermal treatment temperature

| Temperature (°C) | $\rho$ ($\Omega\,cm^2$) |
|---|---|
| 0 | 0.0299 |
| 150 | 0.0598 |
| 200 | 0.0640 |
| 250 | 0.0688 |
| 350 | 0.0694 |

Load value required for interface peeling is measured by nano scratch method. When changing scratch time (speed), a larger load is required to peel Cu-Mn.

FIG. 35

| Temperature (°C) \ Heating time (Min) | 10 | 20 | 30 | 60 |
|---|---|---|---|---|
| 150 | × | × | × | × |
| 200 | × | △ | ○ | ○ |
| 250 | ○ | ○ | ○ | ○ |
| 300 | ○ | ○ | ○ | ○ |
| 350 | ○ | ○ | ○ | ○ |

(Cross-section of gate wiring)

LIQUID CRYSTAL DISPLAY DEVICE AND MANUFACTURING METHOD THEREFOR

TECHNICAL FIELD

This application claims priority under 35 U.S.C. §120 as a continuation of U.S. patent application Ser. No. 11/801,304, filed May 9, 2007, entitled "LIQUID CRYSTAL DISPLAY DEVICE AND MANUFACTURING METHOD THEREFOR."

The present invention relates to a liquid crystal display device consisting of a TFT electrode on a thin film transistor (TFTs) substrate, wherein a source electrode and a drain electrode consist of a layer mainly consisting of copper and an oxide covering the layer mainly consisting of copper, and to a manufacturing method therefor.

BACKGROUND OF INVENTION

In recent years, a low-power-consumption liquid crystal display device (LCD) that is thin, lightweight, and capable of being driven by a lower voltage has been widely used. In such a liquid crystal display device, a screen size has been increasing year after year and a display of moving images just like TV images has been required. To meet such requirements, wiring should be configured with a low-resistive and high-conductive material. In response, in recent years, the wring for this practice is configured to be lower in resistance compared to an aluminum alloy, that is, configured by using a copper (Cu) which is higher in conductivity.

Along with such an increase in the screen size of the liquid crystal display device, a gate wiring material has been changed from molybdenum alloy to aluminum alloy or aluminum clad. However, aluminum (Al) has problems of hillock and electromigration.

For example, as disclosed in Patent Document 1, Japanese published unexamined patent application No. 2000-199054, a wiring material consisting of Al—Nd alloy has been proposed, and anodized Al, Mo-alloy-cladded Al, or double-layered Al has been used. The Al—Nd alloy has a resistivity of 5.1 $\mu\Omega\cdot cm$ while pure Al has a resistivity of 2.5 $\mu\Omega\cdot cm$.

Therefore, in order to use pure Al in practice, wiring having a three-layered structure of Ti/Al/Ti or Mo/Al/Mo is used as measures for the hillock and electromigration. However, this causes an increase in film formation steps, which remains as a problem.

On the other hand, copper has drawn attention as a material having resistivity lower than those of the above-described gate electrode materials. However, copper has problems of not only poor adhesiveness to glass used as a TFT substrate in an LCD, but also of being easily oxidized when an insulation layer is formed For this reason, a technique using alloyed copper wiring has recently been attempted in a TFT-LCD in order to solve such problems. This technique is intended to make an alloying element form reaction products with a substrate to thereby ensure adhesiveness to the substrate as well as to make an additive element form oxide on the Cu surface to thereby make the oxide act as an oxidation resistant film for Cu.

However, with this proposed technique, the intended characteristics have not been adequately developed. That is, the electrical resistance of Cu becomes higher because the alloying element remains in Cu, and therefore advantages over wiring materials using Al or Al alloy have not been able to be exhibited.

Further, as described in Patent Document 2, Japanese published unexamined patent application No. 2004-163901, in order to use the copper wiring for a TFT-LCD, a technique to ensure adhesiveness and barrier characteristics to a substrate by the formation of a Mo alloy film between Cu and the substrate has been considered.

However, this technique has problems of an increase in process steps, i.e., a step of forming the Mo alloy film, as well as of an increase in wiring effective resistance. Further, a Cu single layer is used for source and drain electrodes, however, there remains a problem in its stability.

Also in Patent Document 3, Japanese published unexamined patent application No. 2004-139057, a technique in which a refractory nitride such as TaN, TiN, or WN is formed around Cu is proposed to solve such problems regarding the Cu wiring. However, compared with the conventional wiring materials, this technique has disadvantages of requiring another material to form a barrier layer and additional process steps, and of increasing the effective resistance of the wiring because a high-resistive barrier layer is thickly formed.

Further, Patent Document 4, Japanese published unexamined patent application No. 2005-166757 discloses a method for improving adhesiveness and oxidation resistance by the addition of one or more elements selected from Mg, Ti, or Cr to TFT-LCD wiring. However, this technique has a problem in that the additive element remains in the wiring, causing an increase in wiring resistance. Also, the additive element reduces oxide in a substrate and the reduced element is diffused in the wiring, causing a problem of an increase in the wiring resistance.

Patent Document 5, Japanese published unexamined patent application No. 2002-69550 discloses a method for improving oxidation resistance by the addition of 0.3 to 10 wt. % of Ag to Cu. However, this technique has problems in that adhesiveness to a glass substrate is not improved and oxidation resistance sufficient to resist liquid crystal processing cannot be obtained.

Patent Document 6, Japanese published unexamined patent application No. 2005-158887 proposes copper alloy prepared by the addition of 0.5 to 5 wt. % of at least one element of Ti, Mo, Ni, Al, or Ag to Cu to improve adhesiveness. However, there is a problem of an increase in electrical resistance of the wiring due to the additive element.

Patent Document 7, Japanese published unexamined patent application No. 2004-91907, proposes a method for suppressing oxidation by the addition of 0.1 to 3.0 wt. % of Mo to Cu followed by the segregation of the added Mo at grain boundaries. However, although this technique is capable of improving oxidation resistance of Cu, it has a problem of increasing wiring resistance.

In Patent Document 8, WO2006-025347, copper alloy prepared by the addition of an appropriate additive element to Cu is used, wherein the additive element forms an oxide film to become a passivation film, which suppresses oxidation of Cu, and the passivation film is also formed at an interface with an adjacent insulation layer, which suppresses interdiffusion. Consequently, copper wiring having high conductivity and superior adhesiveness to a substrate is provided. Further, a liquid crystal display device using such copper wiring is provided. In addition, it is suggested that one of such additive elements preferably be Mn. However, this technique is not sufficient for realizing characteristics of a wiring structure used in a liquid crystal display device and a electrode structure of TFT.

In Patent Document 9, Japanese granted patent publication No. 3302894, a TFT structure used in a TFT-LCD is proposed and a TFT structure, wherein a gate electrode coated with an oxide film when a Cu alloy is applied to the gate electrode, is specifically presented. In the document, it is presented that when Cu is a first metal, the second metal is at least one type chosen from Ti, Zr, Hf, Ta, Nb, Si, B, La, Nd, Sm, Eu, Gd, Dy, Y, Yb, Ce, Mg, Th, and Cr. However, the additive element of this second metal is different from that of the current invention.

A source electrode or a drain electrode structure in a TFT electrode is not mentioned in any of these documents. However, high adhesiveness to a semiconductor layer or a pixel electrode, resistance to a use environment, and stability as an electrical contact of the source electrode or drain electrode portion are required to the source electrode or the drain structure, and they are important components for a liquid crystal display device.

As described above, in these conventional techniques, an attempt to ensure adhesiveness to a semiconductor layer or a pixel electrode and oxidation resistance by the addition of an alloying additive element to Cu has been made, however, none of them has achieved a satisfactory result. Also, a satisfactory result has not been achieved regarding high adhesiveness to a semiconductor and a pixel electrode, resistance to a use environment, or stability as an electrical contact of source electrode or drain electrode which are required to the source electrode or the drain electrode structure in a TFT electrode.

Especially, although Patent Document 8, WO2006-025347, suggests a liquid crystal display device using such copper wiring, the suggested technique alone is not able to provide a satisfactory configuration to realize a gate wiring structure to be used for the liquid crystal display device. Also, in the Patent Document 9, the oxide film for coating the gate electrode is specified as the oxide film mainly comprising the second metal formed by thermally treating in an oxygen ambient environment, however, it is not only unexplained but also not even indicated in the Patent Document 9 that the thermal treatment reacting Cu alloy and Si oxide film in contact with the Cu alloy, thereby forming oxide film of gate electrode, which ensures adhesiveness with a semiconductor layer or a pixel electrode.

That is, all the difficulties in forming a Cu alloy film with less process steps, lowering the effective resistance of the wiring, and improving adhesiveness to a semiconductor layer or a pixel electrode must be solved, however, with the above conventional techniques, these difficulties cannot be solved, and product manufacturing is practically difficult.

The present invention has been made in consideration of such situations, and it is therefore one object of the present invention to form an oxide film having high adhesiveness to a semiconductor layer or a pixel electrode to thereby prevent oxidation of a wiring material including a source electrode or a drain electrode, and also to provide a liquid crystal display device consisting of a TFT structure having a source electrode or a drain electrode held between the semiconductor layer such as amorphous silicon, and a passivation layer, and a manufacturing method therefor. Further, another objective of the present invention is to form the wiring, electrode, or terminal electrode (especially the source electrode or the drain electrode) applicable to practical manufacturing processing while simultaneously accomplishing all the above objects.

BRIEF SUMMARY OF INVENTION

Exemplification of methods (1) to (25) for accomplishing the objectives of present invention are as follows:
(1) A liquid crystal display device consisting a TFT electrode on a Thin Film Transistor (TFT) substrate, wherein a source electrode or a drain electrode consisting a layer mainly consisting of copper and an oxide covering the layer mainly consisting of copper.
(2) The liquid crystal display device according to (1) above, wherein the TFT electrode includes a passivation layer, and said passivation layer is formed on said source electrode or said drain electrode.
(3) The liquid crystal display device according to (2) above, wherein said passivation layer is a silicon nitride (SiNx) layer.
(4) The liquid crystal display device according to (2) above, wherein said passivation layer is a silicon oxide (SiOx) layer or a silicon nitrided oxide (SiNyOx) layer.
(5) The liquid crystal display device according to (2) above, wherein the passivation layer is an organic layer.
(6) The liquid crystal display device according to (1) above, wherein a semiconductor layer in the TFT electrode is in an ohmic contact with said source electrode or said drain electrode.
(7) The liquid crystal display device according to (1) above, wherein a pixel electrode in the TFT electrode is in an ohmic contact with said source electrode or said drain electrode.
(8) The liquid crystal display device according to (1) above, wherein said pixel electrode consists of Indium Tin Oxide (ITO), Indium Zinc Oxide (IZO), or Indium Tin Zinc Oxide (ITZO).
(9) The liquid crystal display device according to (1) above, wherein the oxide contains Manganese mainly and Copper subsidiarily.
(10) The liquid crystal display device according to (1) above, wherein the oxide has a compositional formula of $Cu_XMn_YSi_ZO$ ($0<X<Y$, $0<Z<Y$).
(11) The liquid crystal display device according to (1) above, wherein the layer mainly consisting copper is formed from a copper alloy, and an additive element in the copper alloy is Manganese.
(12) The liquid crystal display device according to (11) above, wherein an additive amount of said Manganese is in a range of 0.5 to 25 atomic %.
(13) The liquid crystal display device according to (1) above, wherein the oxide contains Copper (Cu) and Silicon (Si).
(14) The liquid crystal display device wherein a TFT electrode of a Thin Film Transistor (TFT) substrate has a structure in which a source electrode or a drain electrode located between a semiconductor layer and a passivation layer, the source electrode or the drain electrode consisting of a first layer that includes copper mainly and a second layer consisting an oxide covering an outer circumferential part of the first layer, wherein, the second layer has a compositional formula of $Cu_XMn_YSi_ZO$ ($0<X<Y$, $0<Z<Y$).
(15) The liquid crystal display device according to (14) above, wherein the first layer is formed from a copper alloy, and an additive element in the copper alloy is at least one metal selected from the group consisting of Mn, Zn, Ga, Li, Ge, Sr, Ag, In, Sn, Ba, Pr, and Nd and a combination of two or more thereof.
(16) The liquid crystal display device according to (14) above, wherein the first layer is formed from a copper alloy and an additive element in the copper alloy is Manganese (Mn).
(17) The liquid crystal display device according to (16) above, wherein an additive amount of said Mn is in a range of 0.5 to 25 atomic %.
(18) The liquid crystal display device according to (14) above, wherein the second layer contains Manganese mainly and Copper subsidiarily.

(19) The liquid crystal display device according to (14) above, wherein said second layer contains Copper (Cu) and Silicon (Si).

(20) A method for manufacturing a liquid crystal display device consisting of a source electrode or a drain electrode on a TFT substrate, the method consisting of the step of thermally treating a copper alloy layer mainly consisting of copper at approximately 150° C. to approximately 400° C., wherein an additive element of said copper alloy reacts with a silicon oxide in a glass and forms an oxide covering an outer circumferential part of said copper alloy layer.

(21) The method for manufacturing a liquid crystal display device according to (20) above, wherein the oxide covering an outer circumferential part of the copper alloy layer has a thickness of 1 to 30 nm.

(22) An organic Electro Luminescent (EL) display device wherein a TFT electrode on a TFT substrate has a structure in which a source electrode or a drain electrode held between a semiconductor layer and a passivation layer, and the source electrode or the drain electrode consists of a first layer that includes a copper mainly and a second layer consisting of an oxide covering an outer circumferential part of the first layer, wherein the second layer has a compositional formula of $Cu_XMn_YSi_ZO$ (0<X<Y, 0<Z<Y).

(23) The organic Electro Luminescent (EL) display device according to (22) above, wherein the first layer is formed from a copper alloy, and an additive element in the copper alloy is at least one metal selected from the group consisting of Mn, Zn, Ga, Li, Ge, Sr, Ag, In, Sn, Ba, Pr, and Nd and a combination of two or more thereof.

(24) The organic Electro Luminescent (EL) display device according to (22) above, wherein the first layer is formed from a copper alloy and an additive element in the copper alloy is Manganese.

(25) The organic Electro Luminescent (EL) display device according to (22) above, wherein an additive amount of said Manganese is in a range of 0.5 to 25 atomic %.

BRIEF DESCRIPTION OF THE DRAWINGS

FIG. 21 is a measurement result of I-V characteristics.
FIG. 22 is a measurement result of I-V characteristics.
FIG. 23 is a measurement result of I-V characteristics.
FIG. 24 is a measurement result of I-V characteristics.
FIG. 35 is a result of an adhesiveness evaluation by tape test after thermally treating Cu—Mn alloy formed on a glass substrate at each temperature for a predetermined time.

DETAILED DESCRIPTION OF INVENTION

Embodiments of the present invention will hereinafter be described with reference to the drawings. In the embodiments, a technique in which copper alloy of the present invention is applied to wiring constituting each electrode and a matrix of an a-Si TFT on a TFT substrate is described. First, a liquid crystal display device used for the present invention is described below.

Figure 1:
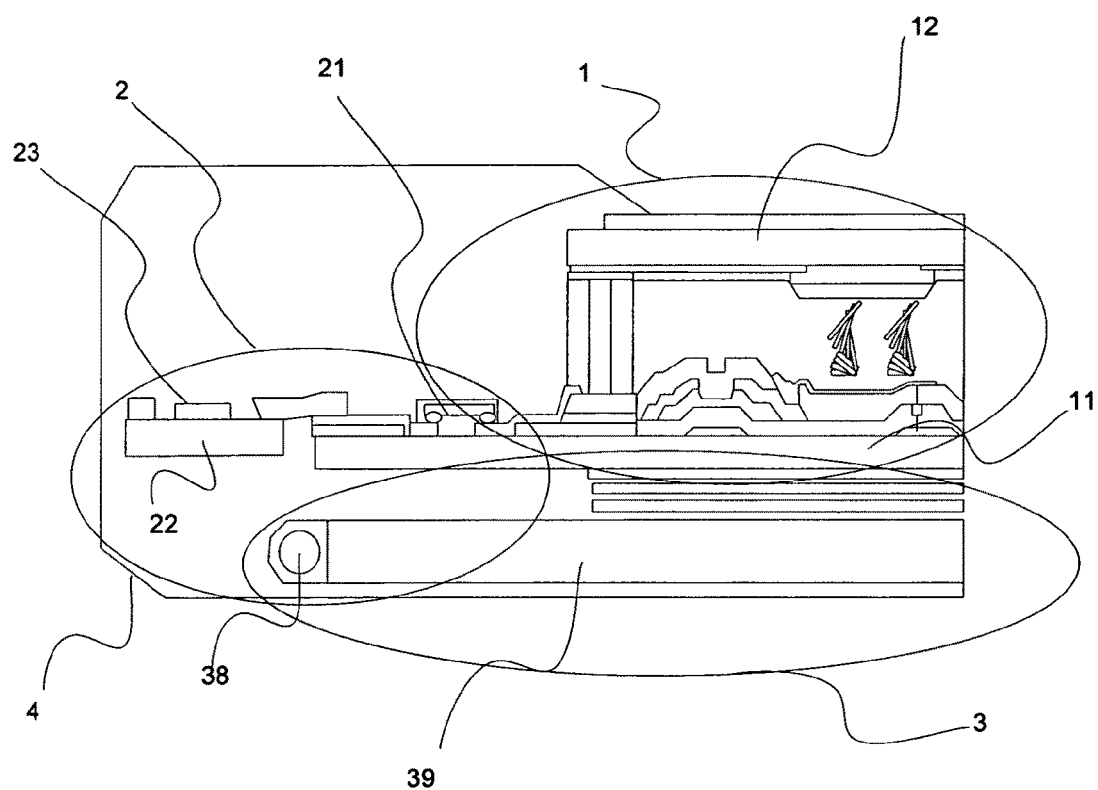
FIG. 1 is a conceptual diagram of a cross-section of a liquid crystal display (LCD) module.

FIG. 1 is a conceptual diagram illustrating a cross-section of a liquid crystal display (LCD) module. The display size of a liquid crystal display device has been increasing, and consequently an active matrix LCD is utilized. One representative of such LCDs is a TFT-LCD in which an LCD is driven by thin film transistors (TFTs). FIG. 1 represents such a TFT-LCD module. The TFT-LCD module is comprised of an LCD panel 1, a driving circuit 2, a backlight 3, and a chassis 4. The LCD panel 1 consists of a TFT substrate 11 and a color filter (CF) substrate 12, which are arranged on lower and upper sides respectively.

The driving circuit 2 serves to externally apply electrical signals to the LCD panel 1 to drive it. The driving circuit 2 is comprised of an LCD driver LSI chip 21 or an LCD driver LSI multilayered printed circuit board (PCB) 22, and a control circuit 23. The LCD driver LSI chip 21 or LCD driver LSI is electrically connected to terminal electrodes of the LCD panel through an anisotropic conductive film. To such a configuration, a fluorescent lamp 38 and a light guide plate 39 are attached, and chassis 4 completes the module structure.

Figure 2:
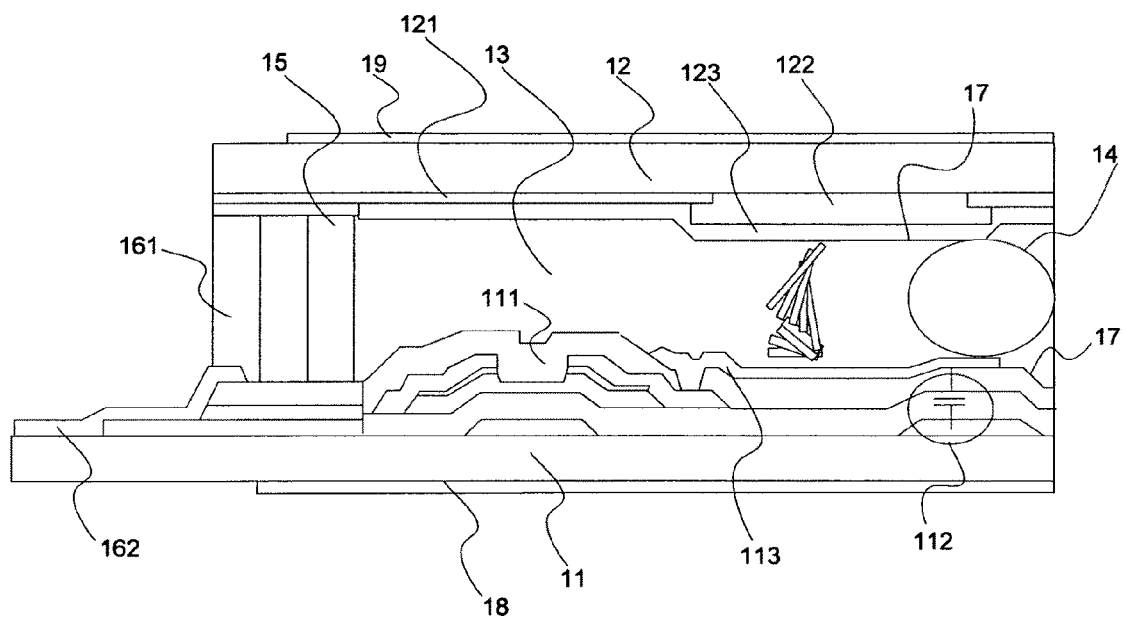
FIG. 2 is a conceptual diagram of a cross-section of an LCD panel.

FIG. 2 is a conceptual diagram illustrating a cross-section of the LCD panel 1. A liquid crystal layer (LC layer) 13 is formed in a space between the TFT substrate 11 and the CF substrate 12. A size of the space is approximately 3 to 5 μm and controlled by the arrangement of spacers 14 inside the panel. The liquid crystal layer is in a liquid state and sealed with surrounding sealing 15. In the liquid crystal layer, the arrangement of liquid crystal molecules is controlled so that they function as an optical crystal. The liquid crystal molecules are arranged vertically or horizontally with respect to interfaces that are inner faces of the substrates. This arrangement is called an orientation.

Alignment films 17 are coated onto the inner faces of the TFT substrate 11 and the CF substrate 12, i.e., on the liquid crystal layer sides. Further, polarizer films 18 and 19 are placed on the outer faces of the TFT substrate 11 and the CF substrate 12. On the TFT substrate 11, a TFT 111, a holding or a storage capacitor (Cs) 112, and a pixel electrode 113 are arranged. The combination of the TFT 111, the holding capacitor 112, and the pixel electrode 113 is a basic configuration of one pixel. Several million pixels are arranged in one LCD panel. Therefore, such pixels are connected in a matrix form through wiring on the TFT substrate 11.

Figure 3:
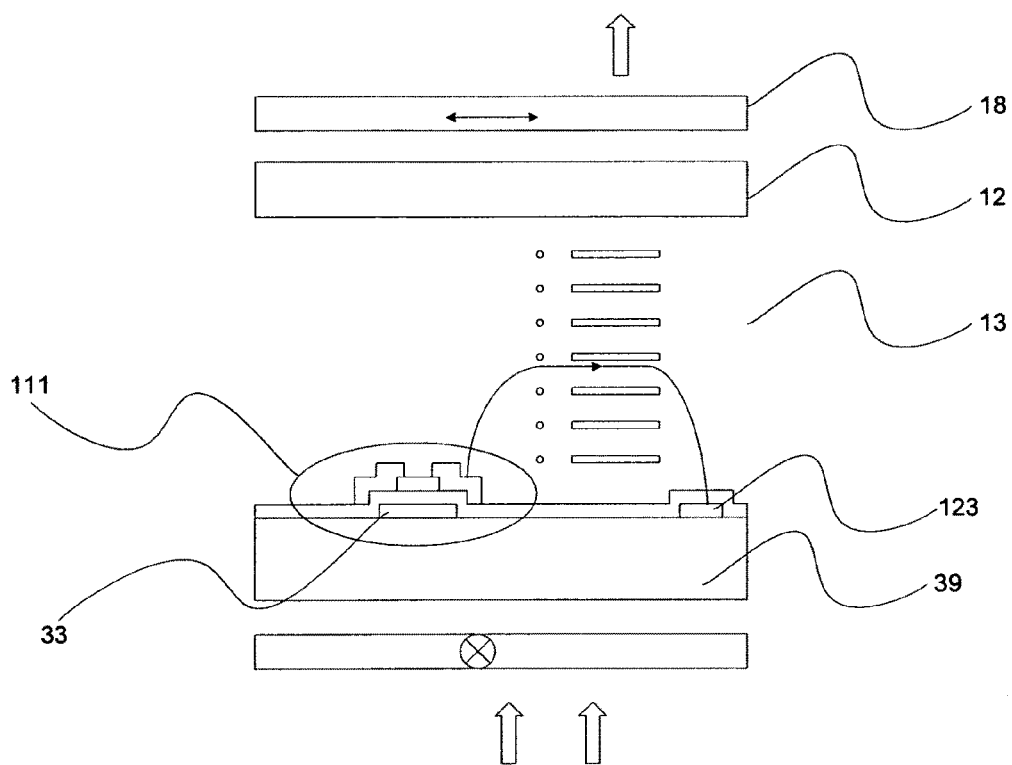
FIG. 3 is a conceptual diagram of an IPS liquid crystal.

The opposite CF substrate 12 is comprised of a black matrix (BM) 121, a color filter (CF) 122 consisting of three primary colors (red, green, and blue), and a common electrode 123. The common electrode 123 is typically placed on the CF substrate side, however, in an IPS liquid crystal (In-Plane Switching Nematic Liquid Crystal) mode, it is placed on the TFT substrate 11. A schematic diagram of the IPS liquid crystal is shown in FIG. 3.

In FIG. 2, the common electrode 123 is a transparent electrode, and uses indium tin oxide (ITO), indium zinc oxide (IZO) or indium tin zinc oxide (ITZO). In order to lead it outside, it is led to the TFT substrate 11 through a short part 161. Each electrode is electrically connected to the driving circuit 2 through a connection pad 162. Also, the TFT substrate 11 and the CF substrate 12 require transparency to light, and use hard glass. See U.S. Pat. No. 2,701,698 and U.S. Pat. No. 5,598,285 for more information on the IPS liquid crystal as shown in FIG. 3.

Figure 4:
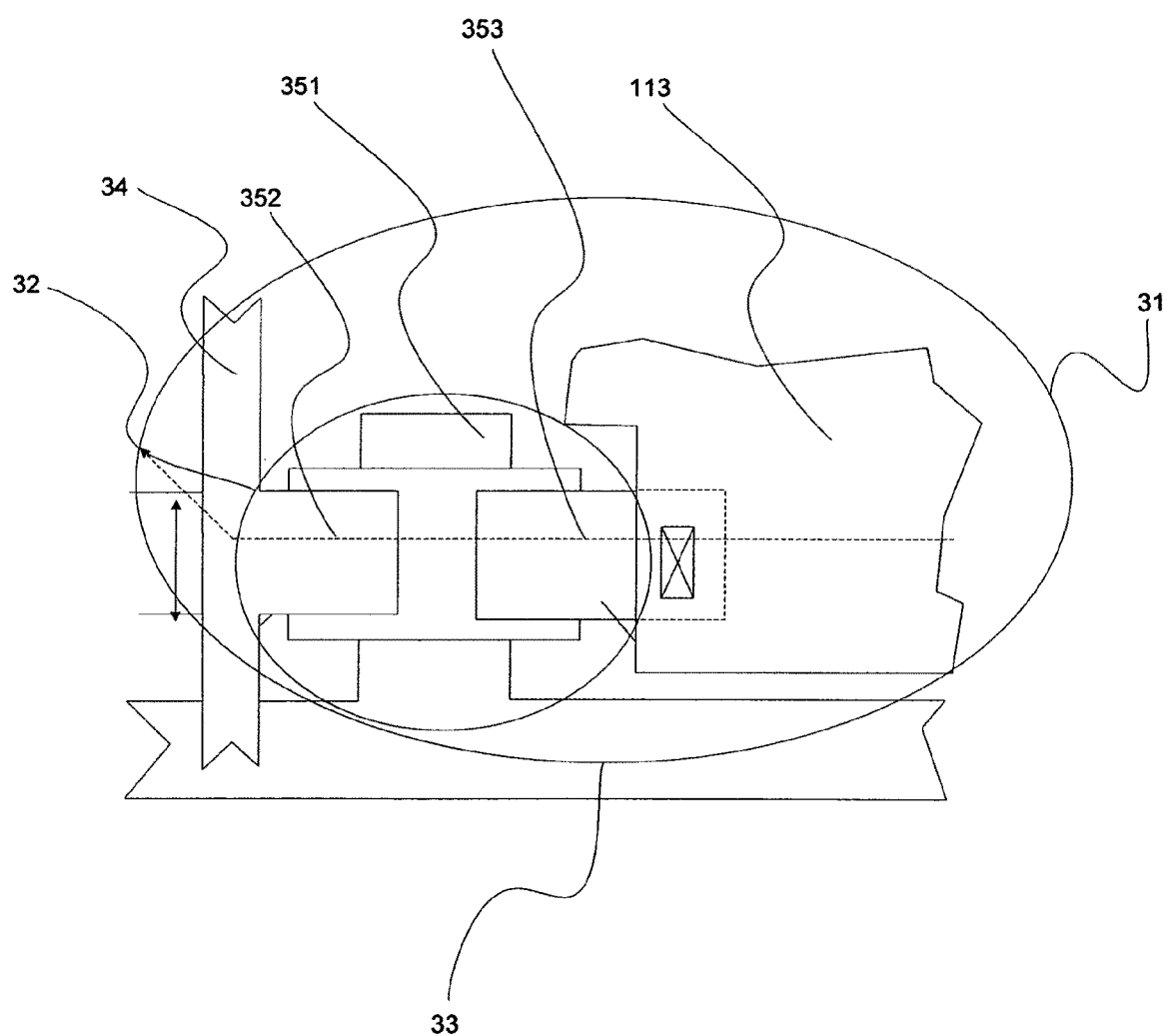
FIG. 4 is a plan view of a pixel part and a TFT part.

FIG. 4 is a plan view, a cross-sectional view, and an equivalent circuit diagram of a pixel part 31 and a TFT part 32. Each pixel is connected to gate wiring 33 and signal wiring 34.

Figure 5:
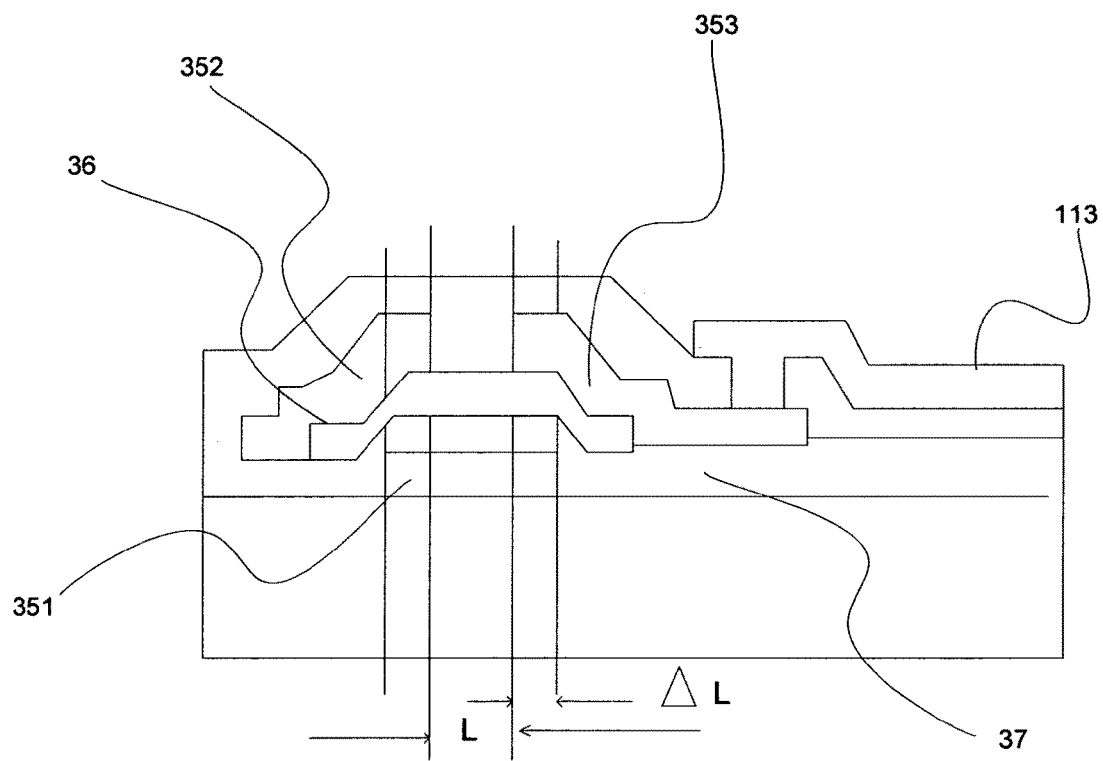
FIG. 5 is a cross-sectional view of a pixel part and a TFT part.
Figure 6:
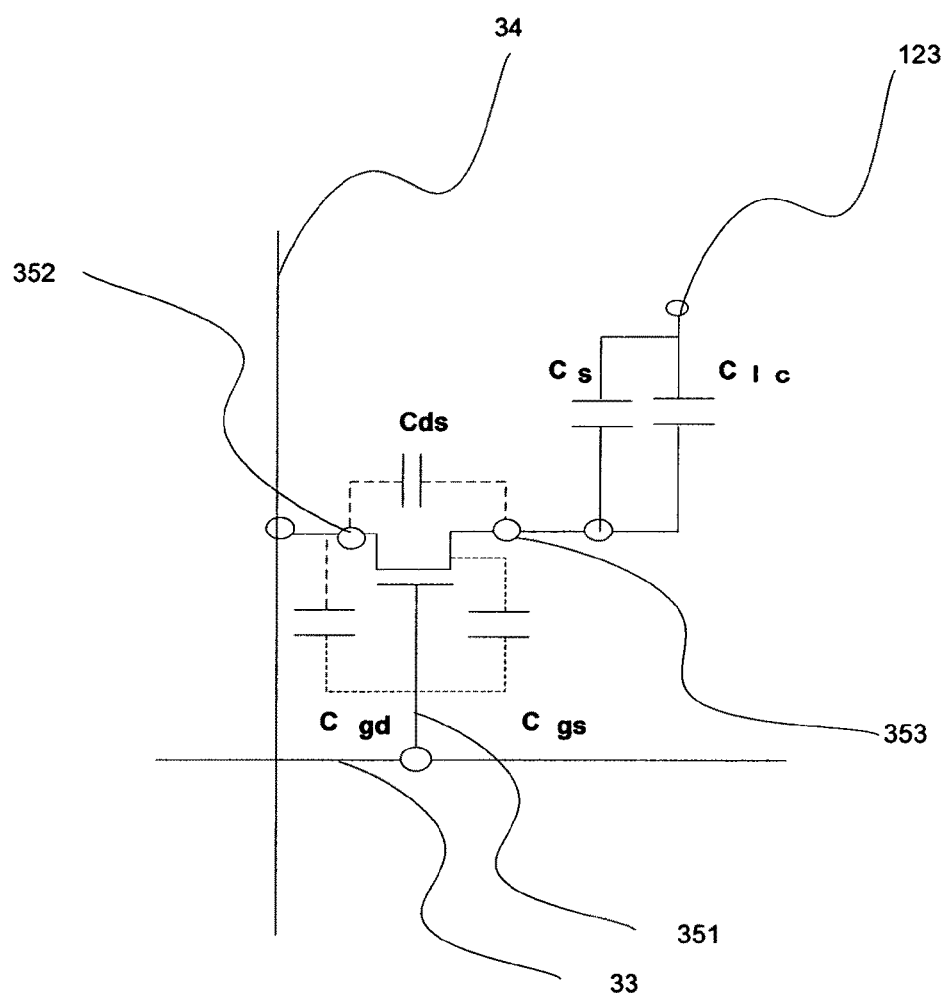
FIG. 6 is an equivalent circuit diagram of a pixel part and a TFT part.

Accordingly, as shown in the plan view of FIG. 4, the TFT part has three kinds of electrodes, i.e., a gate electrode 351, a source electrode 352, and a drain electrode 353. The drain electrode 353 is connected to the pixel electrode 113 via a through-hole As can be seen from a cross-sectional view in FIG. 5, amorphous silicon (a-Si) 36 is used as semiconductor, and silicon nitride ($SiN_x$), a silicon oxide film ($SiO_x$), a multilayered film of them, or an organic material layer is used as a gate insulation film 37. Expressing each pixel part as the equivalent circuit diagram (FIG. 6) results in the additions of parasitic capacitors $C_{gs}$, $C_{gd}$, and $C_{ds}$ between respective electrodes of the TFT. A liquid crystal layer is arranged between a common electrode 123 on an opposite substrate, and expressed as $C_{lc}$ in the equivalent circuit diagram. Parallel to $C_{lc}$, a storage capacitor $C_s$ is formed.

Figure 7:
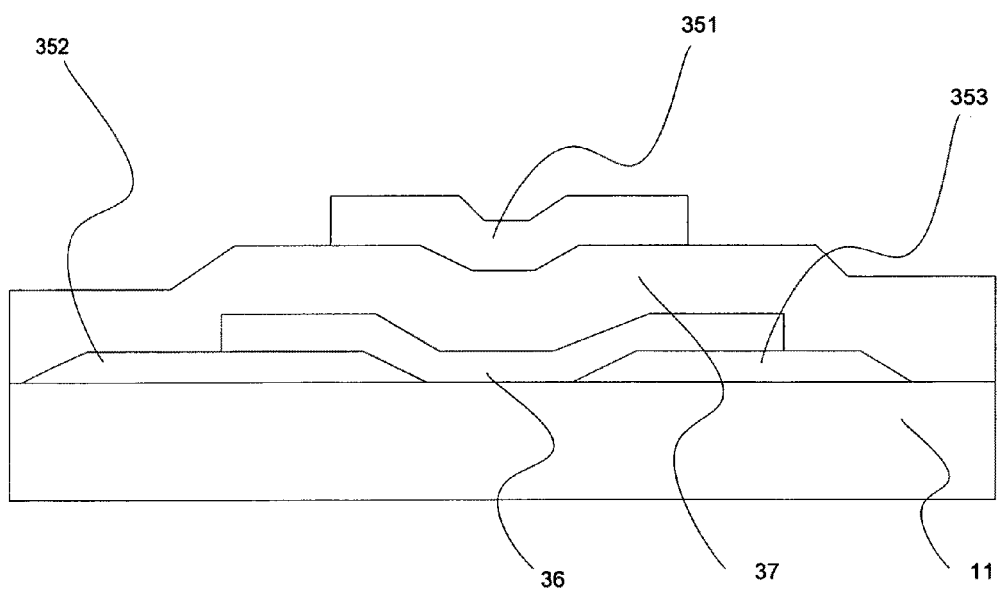
FIG. 7 is a cross-sectional view of a TFT (staggered top gate structure).
Figure 8:
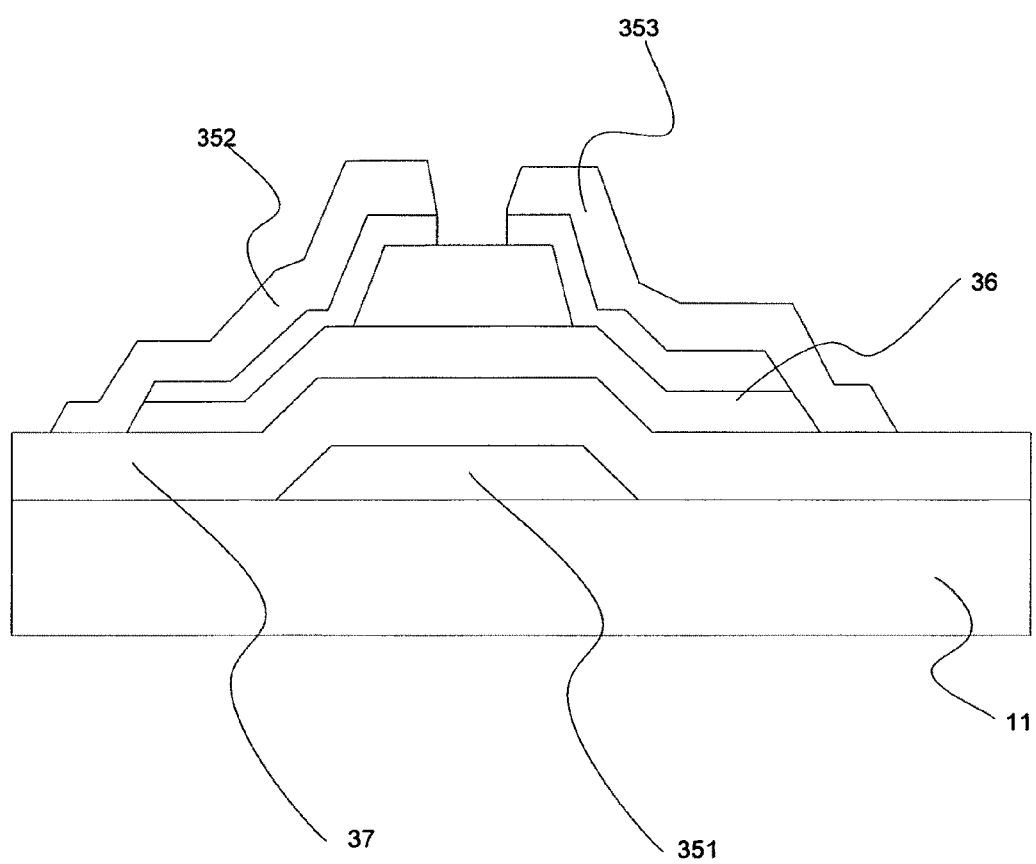
FIG. 8 is a cross-sectional view of a TFT (inversely staggered channel stopper structure).
Figure 9:
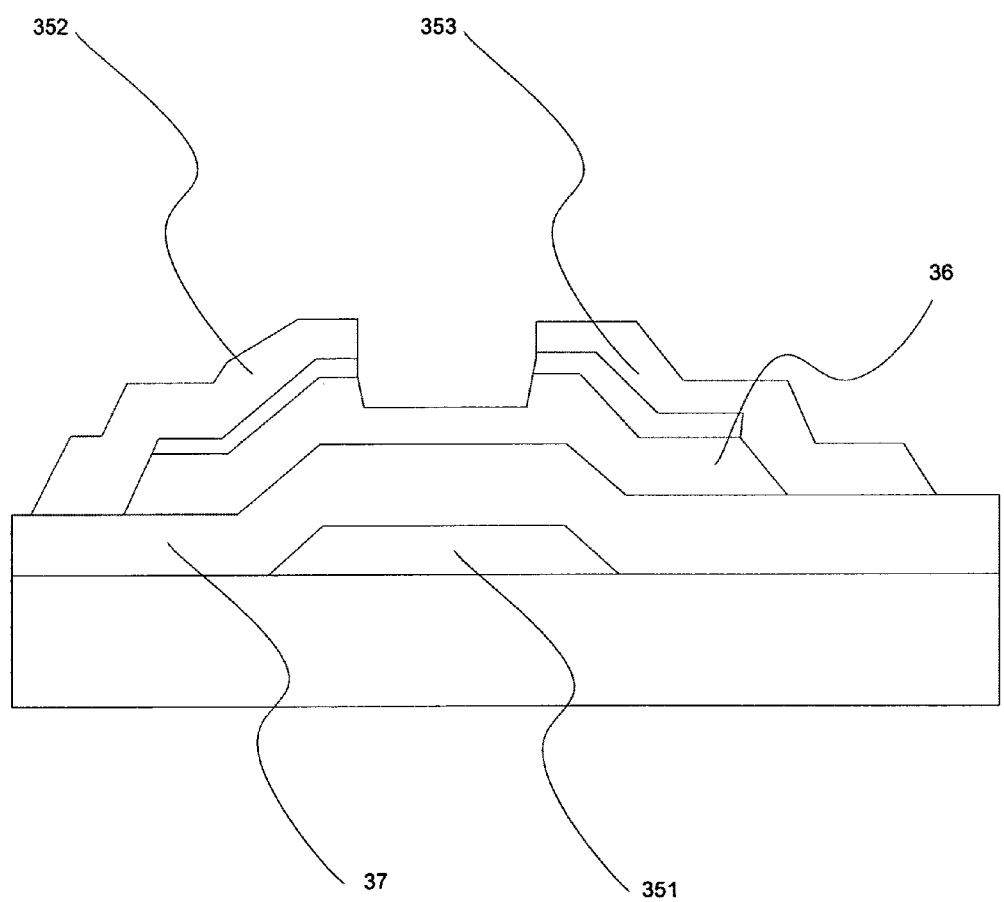
FIG. 9 is a cross-sectional view of a TFT (inversely staggered channel etch structure).

FIGS. 7, 8, and 9 show three kinds of a-Si TFT structures, i.e., a staggered top gate structure, an inversely staggered channel stopper structure, and an inversely staggered channel etch structure. Among them, the channel etch structure shown in FIG. 9 is often used in practice.

[Gate Electrode]

Next, a technique to apply a copper alloy to a gate wring of TFT electrode is explained. In many cases, an inversely staggered channel etch structure is applied to the TFT electrode using amorphous silicone, as described above. In this case, the gate electrode is formed by the Sputtering Method on a glass substrate, and a pattern is formed by Wet Etching. In such case, the gate electrode has a tapered shape to reduce mechanical stress as shown in the cross sectional view of FIG. 26.

The TFT structure using CuMn, one of the copper alloys relating to the present invention, as a gate electrode is hereinafter explained. For a glass substrate, it is preferable to use, for example, alkali-free glass. An example of the composition of alkali-free glass is as follows:

| Component | Content (%) |
|---|---|
| $SiO_2$ | 49.0 |
| $Al_2O_3$ | 11.0 |
| $B_2O_3$ | 15.0 |
| Metal (i.e. Fe) | 25.0 |
| Alkali | — |

Next, a CuMn thin film is formed on a glass substrate by sputtering a CuMn alloy. At this time, thickness of the thin film is approximately 200 nm. Thereafter, by thermally treating the glass substrate at approximately 200 to 450° C. for approximately 3 minutes to 50 hours in a slight amount of oxidized atmosphere, Mn in Cu is diffused and forms the oxide layer 47 on an interface of glass and the surface of CuMn thin film in a thickness of 2 to 10 nm. In an interface of the gate electrode 351 and the glass substrate 11, Mn, which is an additive element of CuMn, is diffused and reacts with SiO2 contained in the glass on the interface, and resulted in forming an oxide product (Cu,Mn,Si)Ox.

On the contrary, an oxide layer (Cu,Mn)Ox is formed on the surface of CuMn film in a thickness of a few nm by reacting with oxygen in an atmosphere. Patterning the gate electrode is by wet etching, and both ends of the gate electrode are formed in a tapered shape. Further, thermally treating this at approximately 200 to 450° C. in a slight amount of oxygen atmosphere, and forming oxide layer 47 on the tapered portion in a similar manner.

Another method for forming an oxide layer on the gate electrode 351 is explained. Following the formation of gate electrode, three layers, of SiN/a-Si/n+ a-Si, which are the gate insulation film and the semiconductor film, are continuously formed by the Plasma CVD (chemical vapor deposition) (hereinafter referred as plasma CVD). At this time, the temperature of the substrate is approximately 300 to 350° C. and the temperature is sufficient for a thermal treatment. Bringing the substrate temperature to approximately 300 to 350° C. when placing the substrates in a Plasma CVD device, thereby the oxide layer 47 can be formed in a slight amount of oxygen atmosphere. On the interface with the glass substrate, an oxide layer similar to that described above is formed.

On the contrary, the oxide layer 47 formed on the interface of the gate electrode 351 and the gate insulation film ultimately becomes (Cu,Mn,Si)Ox. This oxide layer 47 maintains the adhesiveness of the gate electrode 351 and the gate insulation film 37, and also prevents Cu from diffusing to the gate insulation film 37. Also, in case the gate insulation film 37 is SiON, Mn diffused in CuMn reacts with the oxygen in the gate insulation film 37, thereby forming the oxide film 47. The oxide film 47 in such case also ultimately becomes (Cu,Mn,Si)Ox, as described above.

In this way, Mn in the CuMn alloy is diffused and fixed to the oxide layer 47 thereby the gate electrode 351 will be close to pure Cu. Relative to 1.7 $\mu\Omega$·cm, the resistivity of pure Cu, the gate electrode with resistivity of 2.2 $\mu\Omega$·cm can be obtained by the thermal treatment at approximately 200 to 250° C. in a slight amount of oxygen atmosphere. This value is sufficiently lower than the resistivity of Al. Since the gate electrode 351 forms the gate wiring in this condition, the propagation delay of the gate voltage pulse as described above, is reduced, and as a result, unevenness in brightness of a LCD due to shading can be reduced.

The above technique is to apply copper alloy CuMn to the glass substrate 11, and the gate insulation film 37, the gate electrode 351 and gate wiring held between so called different types of insulating layers to form the oxide layer 47 covering the electrodes thereby preventing Cu from diffusing and penetrating to the glass substrate 11 contacting the insulating layer, and gate insulating film 37, and also ensures adhesiveness to the insulating layer adjacent to the gate electrode 351.

Further, the copper alloy CuMn which is the gate electrode 351 and the gate wiring, will be in a state close to a pure copper when Mn is diffused to the clad oxide layer 47, thereby a lower resistivity close to that of pure copper can be realized.

Still further, the CuMn layer, which is the gate electrode, may be a film of a single layer, and by forming the clad oxide layer 47 realizes lower resistance close to the pure copper, thereby image shading can be reduced. Also, unlike the conventional Cu wiring which deposited three layers of Cu alloy/pure copper/Cu, the present technique may be a film of a single layer of copper alloy (for example, CuMn alloy), which is effective for shortening the deposition process and reducing cost.

[Source Electrode or Drain Electrode]

Next, detail of the present invention which is to apply a copper alloy (especially CuMn) to a source electrode or a drain electrode of TFT in the liquid crystal display according to the present invention consisting of a TFT electrode on a TFT substrate, is explained.

For example, a Silicone Nitride (SiNx) layer, a Silicone Oxide (SiOx) layer, a Silicon Nitride Oxide (SiNyOx) layer, or an organic layer can be considered as a passivation layer to be used in the present invention. For example, polyimide with high fluidity can be considered for the organic layer. As a conductive layer used in the present invention, for example, an amorphous silicone (a-Si) layer, or an amorphous silicone (n+ a-Si) layer containing impurities can be considered.

Next explained is an example of a manufacturing process for the present invention in which the copper alloy (such as CuMn) as a source electrode or a drain electrode is employed.

After patterning the three layers consisting of SiH/a-Si/n+ a-Si by dry etching, depositing copper alloy (such as CuMn) by sputtering, and forming this to a pattern of the source electrode or drain electrode by wet etching. Thereafter, an oxide layer, (Cu,Mn,Si)Ox or (Cu,Mn)Ox, with a thickness of a few nm is formed to cover the source electrode or the drain electrode by thermally treating at approximately 200 to 450° C. in a slight amount of oxygen atmosphere. At this time, on the interface in which the semiconductor layer (such as a-Si layer) or the insulating layer (such as SiN layer) contacts the source electrode or the drain electrode, the oxygen remaining in the semiconductor layer (such as a-Si layer) or the insulating layer (such as SiN layer) reacts with copper alloy (such as CuMn alloy) and forms an oxide layer.

After forming the channel of TFT, forming and patterning a passivation film (such as SiN layer) by the Plasma CVD at the substrate temperature of approximately 250 to 300° C. is accomplished. During this course, the oxide layer ultimately becomes (Cu,Mn,Si)Ox in a thickness of a few nm by going though the process of bringing substrate temperature of approximately 250 to 300° C. Alternatively, when forming a passivation film without a special thermal treatment after patterning the source electrode or the drain electrode, Mn is diffused by the heating of the substrate to approximately 250 to 300° C. and forms an oxide layer, thereby a film layer is formed on the source electrode or the drain electrode.

In the oxide layer obtained from this result, adhesiveness of the insulating layer and the semiconductor layer with the source electrode or the drain electrode can be ensured. Further, since the oxide layer functions as the high resistivity layer with a thickness of a few nm in the electrical connection of the semiconductor layer (such as n+ a-Si layer) with the source electrode or the drain electrode, the ohmic contact is not obstructed in the electrical connection.

An oxide film layer is formed on the interface of the source electrode or the drain electrode and the semiconductor layer (such as n+ a-Si layer), at this time, a thin film consisting of a copper alloy (such as CuMn) held between the insulation layer (such as silicone nitride) and the semiconductor layer (such as amorphous silicone) forms an oxide layer on the interface of the insulation layer (such as silicone nitride) and the semiconductor layer (such as amorphous silicone) by a thermal treatment, and its composition is (Cu,Mn,Si) Ox.

Further, Cu and Si are alternatively diffused from the copper alloy film and the silicone film onto the oxide layer of the interface, thereby the oxide layer acts as a high resistivity layer and the connection of ohmic contact is maintained. Still further, a few 10V of voltage is applied for aging after the completion of the TFT substrate or TFT-LCD panel and causes a dielectric breakdown to the thin oxide layer in a thickness of a few nm, which results in a conductivity of the oxide layer, thereby the connection of ohmic contact through the oxide layer can be maintained.

Further, as described above, the source electrode or the drain electrode is in low resistivity close to that of a pure copper, thereby reducing failures due to propagation delay. Also, since only a single layer of copper alloy (such as CuMn) is required, it shortens the film forming process and is effective for cost reduction compared to the conventional technique.

Next, an example of the source electrode or the drain electrode in the crystal liquid display device according to the present invention is explained referring to the drawings 10, 11, 12, and 13.

Figure 10:
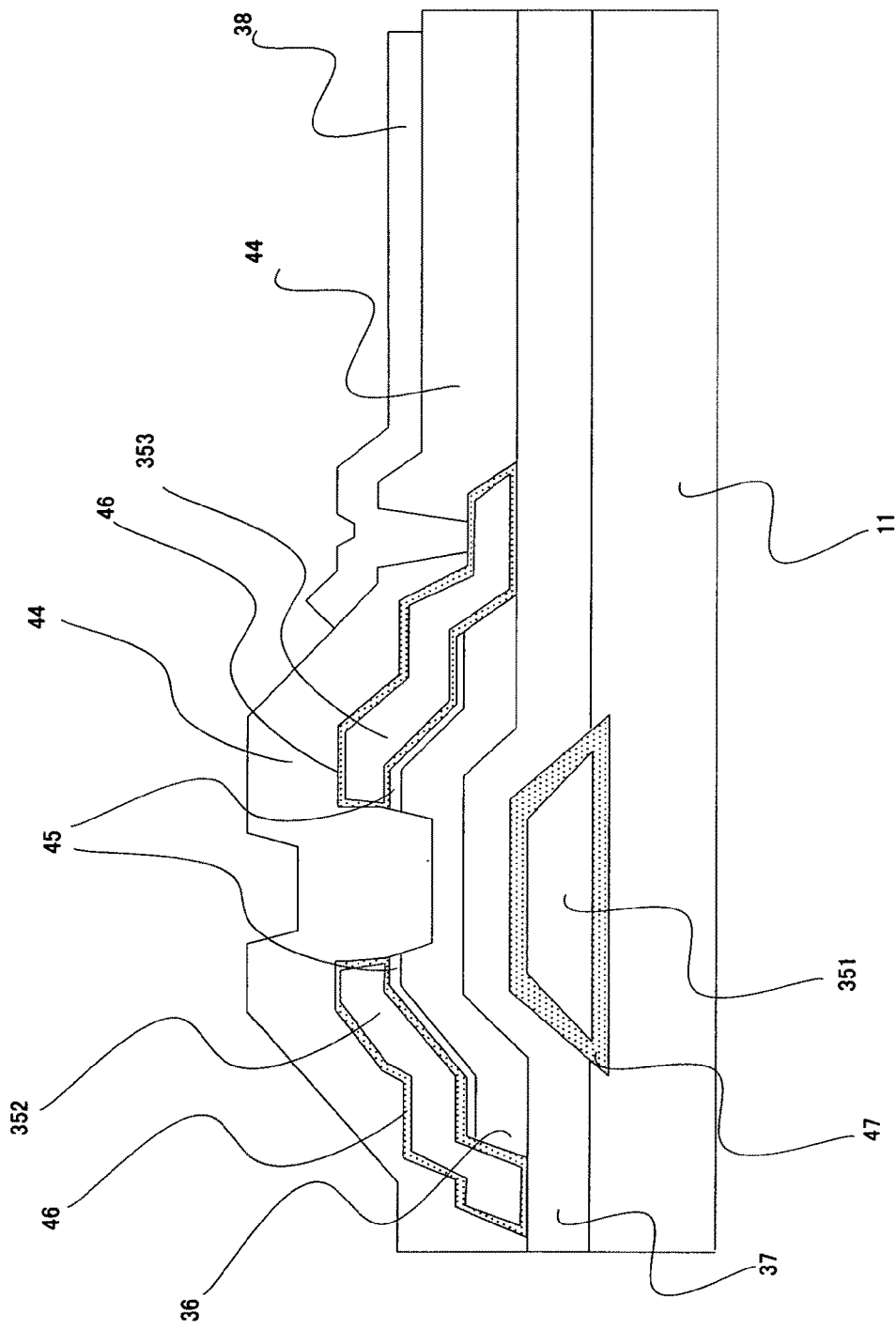
FIG. 10 is one (1) example of a cross-section of a pixel part and a TFT according to the present invention.

FIG. 10 shows the source electrode and the drain electrode structures covered the oxide layer 46 when a semiconductor layer is the amorphous silicone (a-Si) layer 36 and the amorphous silicone (n+ a-Si) layer 45 contains impurities, and has the oxide layer 47 around the gate electrode 351.

Figure 11:
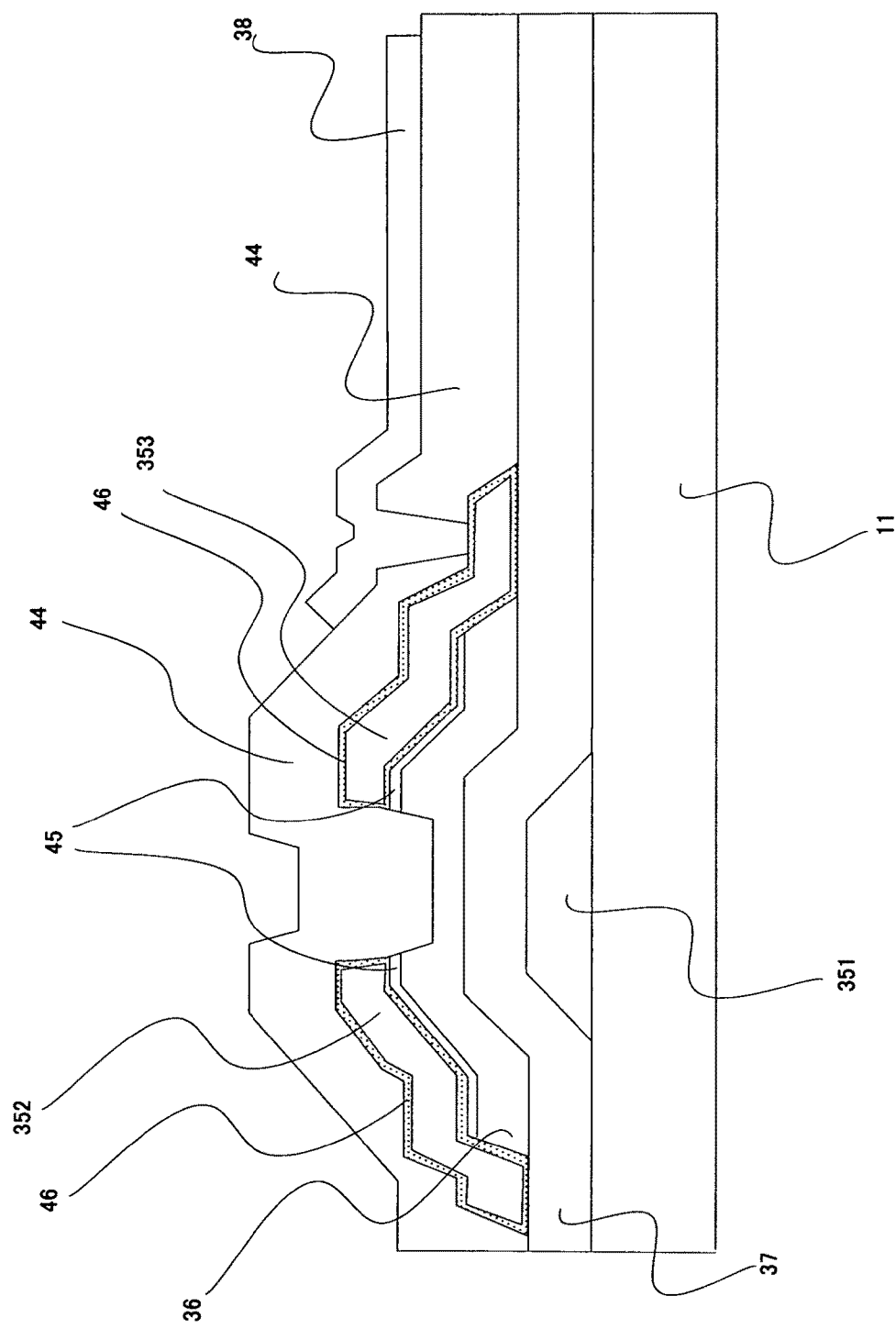
FIG. 11 is one (1) example of a cross-section of a pixel part and a TFT according to the present invention.

FIG. 11 shows the source electrode and the drain electrode structures covered the oxide layer 46 when a semiconductor layer is the amorphous silicone (a-Si) layer 36 and the amorphous silicone (n+ a-Si) layer 45 contains impurities, but not having the oxide layer 47 around the gate electrode 351.

Figure 12:
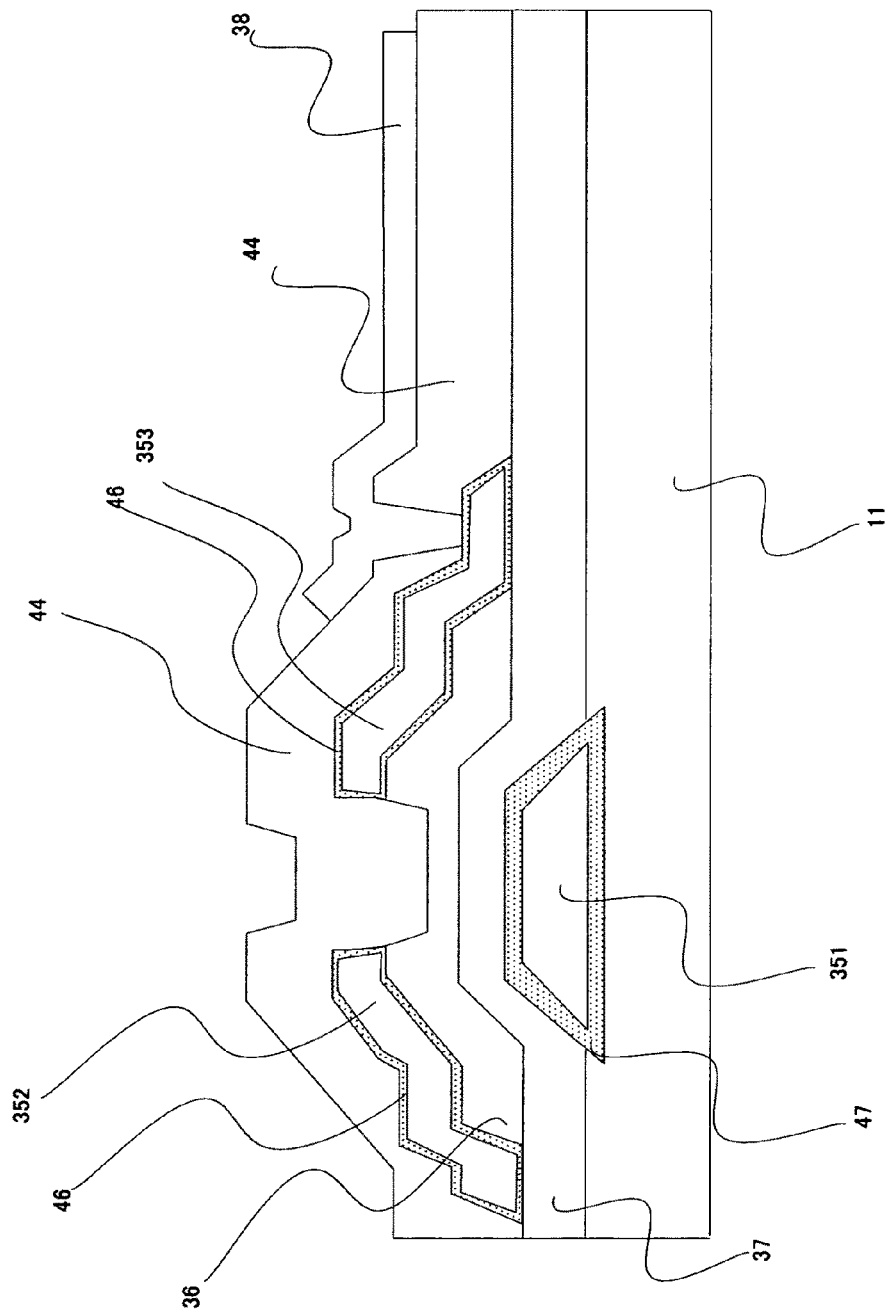
FIG. 12 is one (1) example of a cross-section of a pixel part and a TFT according to the present invention.

FIG. 12 shows the source electrode and the drain electrode structures covered the oxide layer 46 when a semiconductor layer is the amorphous silicone (a-Si) layer 36, and has the oxide layer 47 around the gate electrode 351.

Figure 13:
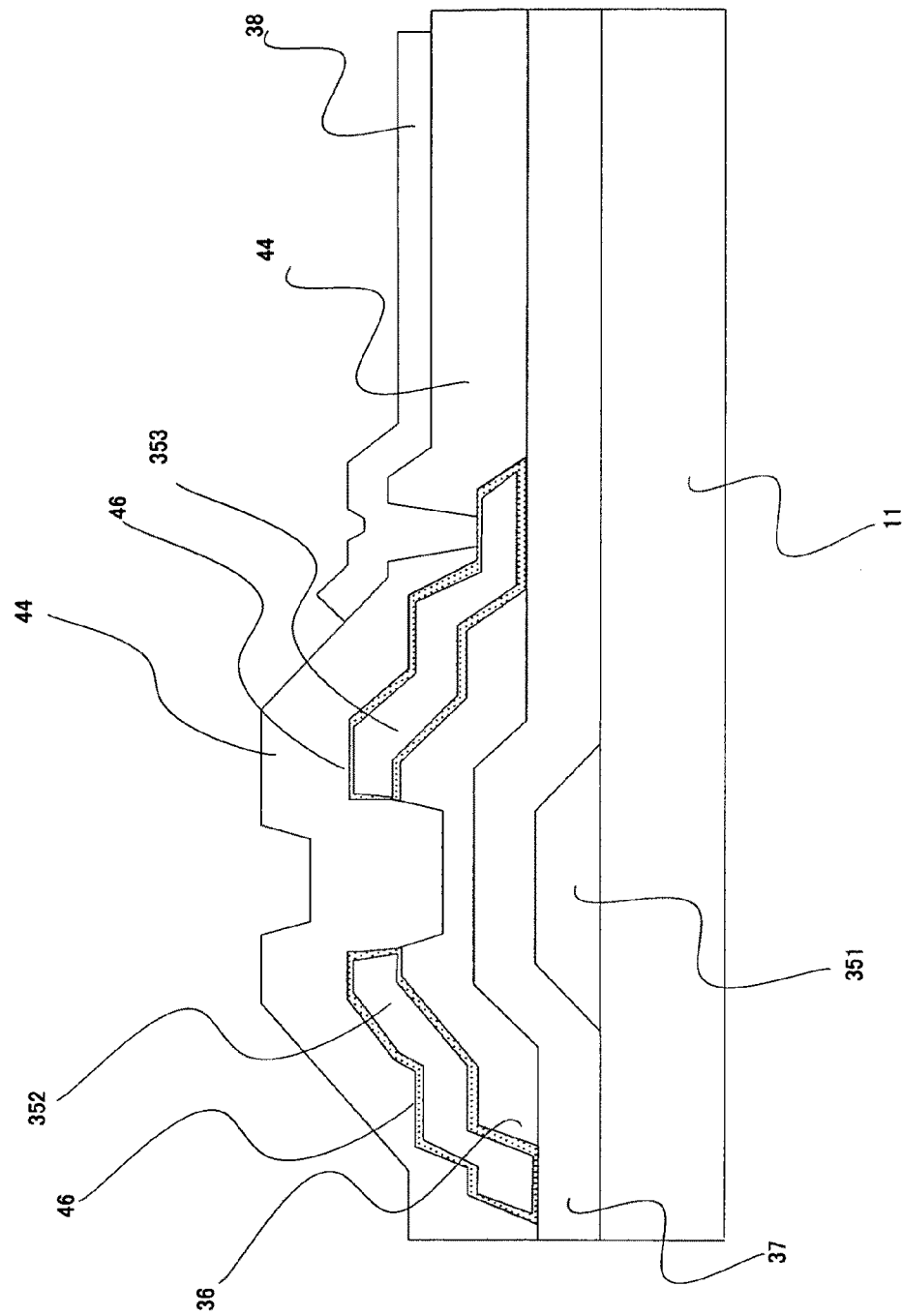
FIG. 13 is one (1) example of a cross-section of a pixel part and a TFT according to the present invention.

FIG. 13 shows the source electrode and the drain electrode structures covered the oxide layer 46 when a semiconductor layer is the amorphous silicone (a-Si) layer 36, but not having the oxide layer around the gate electrode 351.

A manufacturing process of the TFT electrode structure according to the present invention described above is, for example, as follows. First, after forming a thin silicone oxide layer SiOx in a thickness of approximately 1-2 nm on an upper face of the semiconductor layer 45 (such as the amorphous silicone a-Si layer 36 or the amorphous silicone n+ a-Si containing impurities), forming a thin film of copper alloy (such as CuMn) and thermally treating it at approximately 200 to 350° C., thereby Mn from the CuMn layer moves to the intermediate layer between the semiconductor layer (such as a-Si layer or n+ a-Si layer) and the copper alloy (such as CuMn) and forms a (Mn,Cu,Si)Ox layer which is an oxide layer mainly consisting MnOx in a thickness of a few nm.

The oxide layer is a layer with electrically high resistivity, and the interface of the semiconductor layer (such as the amorphous silicone layer or the amorphous silicone containing impurities) and the source electrode 352, or the drain electrode 353 mainly consisting of copper is connected as an electrically ohmic contact.

As for the method of forming the thin silicon oxide layer on the interface in a thickness of approximately 1 to 2 nm, the Ozone Oxidation Method or the Plasma Oxidation Method can be considered. Alternatively, the method of depositing a hydroxylation radical (—OH) on an upper face of the amorphous silicone a-Si layer, or the amorphous silicone layer n+ a-Si layer containing impurities by atomizing water vapor is also effective.

Figure 14:
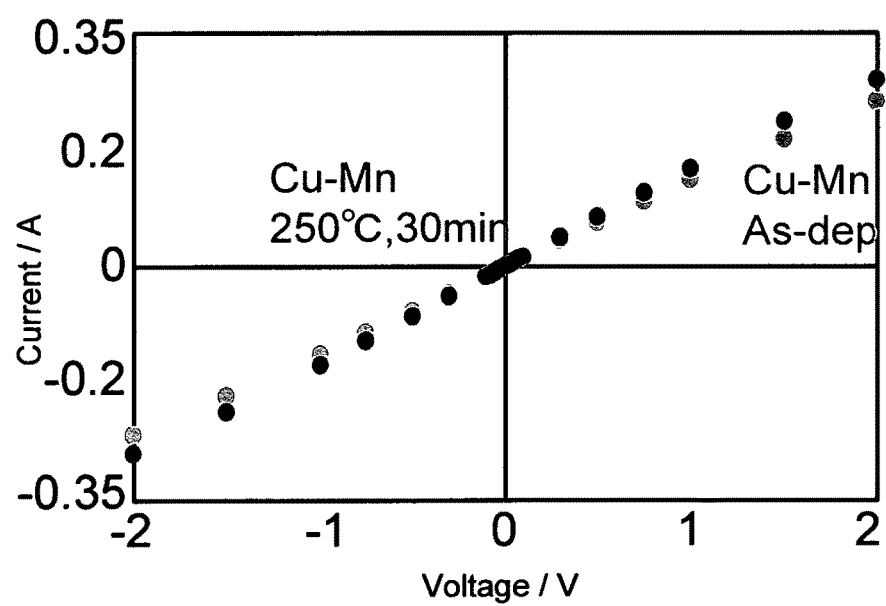
FIG. 14 is a measurement result of I-V characteristics.
Figure 15:
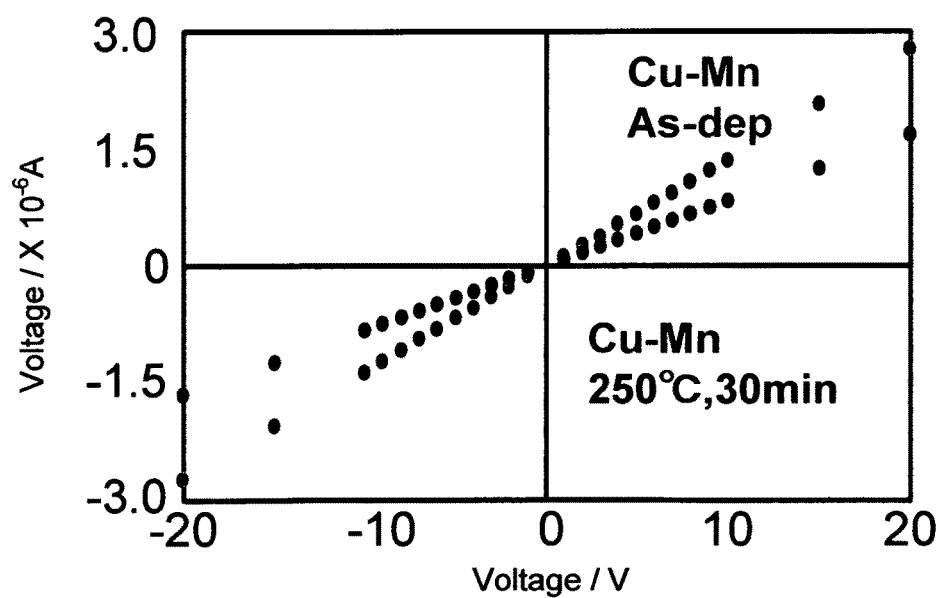
FIG. 15 is a measurement result of I-V characteristics.

Next, FIG. 14 which demonstrates that the source electrode, or the drain electrode and the pixel electrode (ITO) are in ohmic contact in the above TFT electrode structure of the present invention, and FIG. 15 which demonstrates the source electrode, or the drain electrode and the amorphous Si (a-Si) are in ohmic contact, are explained.

In the TFT electrode structure of the present invention, a stability in an electrical contact is required in the source electrode or the drain electrode structure. For this reason, each contact portion is preferably in ohmic contact electrically. In the present invention, the source electrode or the drain electrode mainly consisting of copper is covered by an oxide layer mainly consisting of manganese oxide. Although such thin oxide layer mediates, stable ohmic contact is shown. Such an experimental example is described below. Contact resistance is measured by the Transfer Length Method (TLM method).

FIG. 14 shows Cu-4 at. % Mn formed on a transparent electrode (ITO) substrate in a thickness of approximately 200 nm. Onto the substrate, placing a molybdenum mask with an opening diameter of 0.5 mm and a distance of an opening edge of 0.5 mm (distance between the center of the opening is 1 mm), then Cu—Mn is formed. Thereby, round electrodes are formed at equal intervals. On the contrary, FIG. 15 shows Cu-4 at. % Mn formed on an amorphous Si (a-Si).

FIGS. 14 and 15 show measurement results of I-V characteristics by contacting a probe to two different electrodes. The spacing between electrodes was changed to obtain the I-V characteristics. The contact resistance value was obtained from these measurement results.

FIG. 14 showing the I-V characteristics between the source electrode or the drain electrode (CuMn) and the pixel electrode (ITO) in a case of thermally treating at 250° C. for 30 minutes after forming CuMn in thin film, and in a case of no thermal treatment after forming CuMn in a thin film (hereinafter, this condition is referred as As-dep). FIG. 15 showing the I-V characteristics between the source electrode or the drain electrode (CuMn) and the amorphous silicone (a-Si) in a case of thermally treating at 200° C. for 30 minutes after forming CuMn in a thin film, and in a case of As-dep.

In these figures, I-V relationships are in linear proportion, thus the contacts are proved to be in ohmic contacts. Therefore, the ohmic contacts are established in all the conditions in these figures.

And, detail for applying this copper alloy to the electrode terminal for extracting outward, which connects the TFT-LCD panel and the driver LSI as a drive circuit, in the liquid crystal display device according to the present intervention is now explained. In the TFT-LCD of the liquid crystal display device according to the present invention, gate wiring using copper wiring typified by CuMn, and the electrode terminal 33 of the signal wiring comprise a structure that covers a wiring with the oxide product 47 by going through a production process as described later.

This oxide product 47 mainly consists of manganese oxide, and may include copper (Cu) or silicone (Si). This enables stability to the atmosphere, and additionally, as for connectivity to the drive circuit, sufficient conductivity of the contact portion can be secured by a thermal compression bond or a voltage application because this oxide layer 47 has a thickness of a few nanometers (nm). Further, the oxide product is formed between the substrate which is an insulator, such as glass, and has a high adhesiveness with the substrate.

Figure 16:
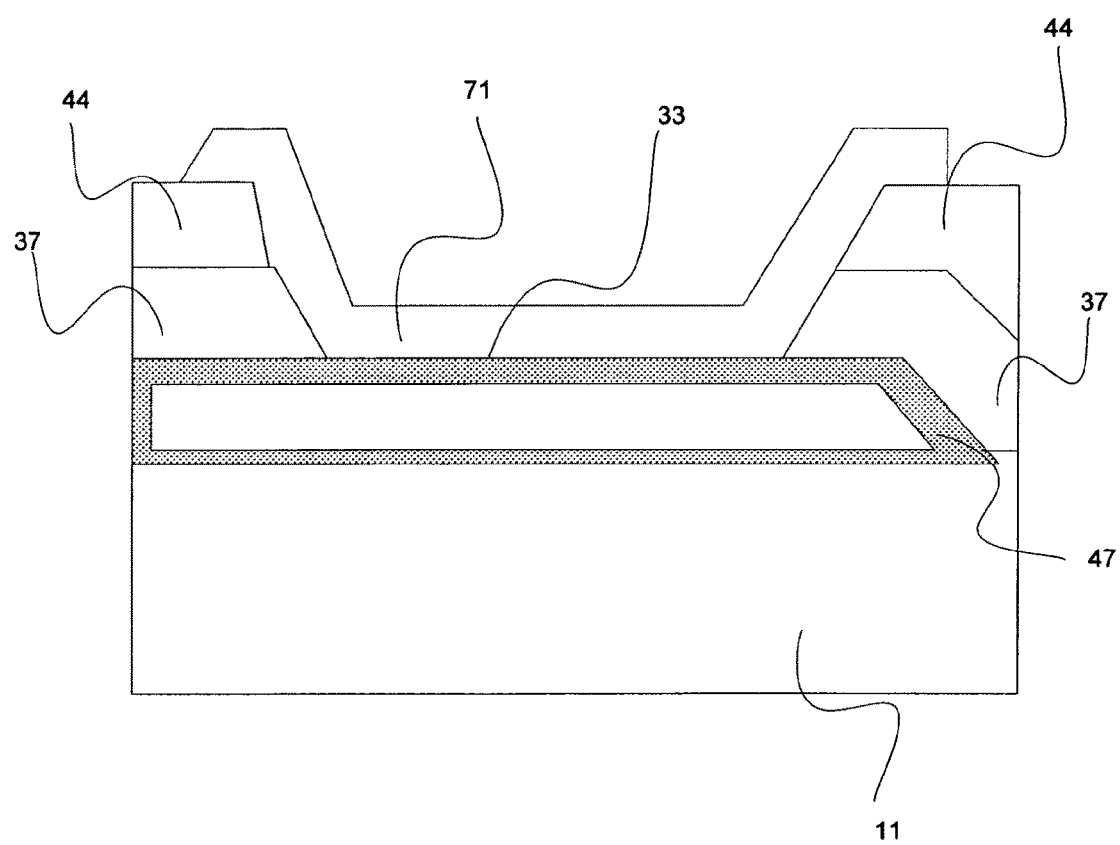
FIG. 16 is a cross-sectional view of a terminal portion of a liquid display device (LCD) module.
Figure 17:
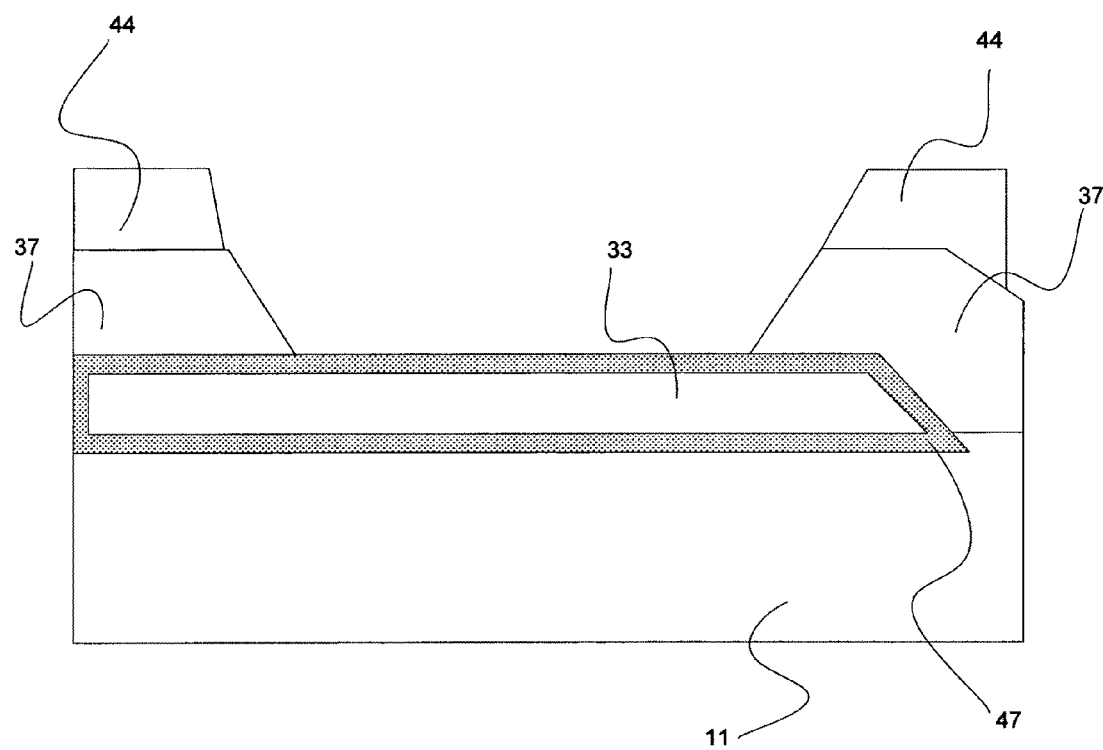
FIG. 17 is a cross-sectional view of a terminal portion of a liquid display device (LCD) module.
Figure 18:
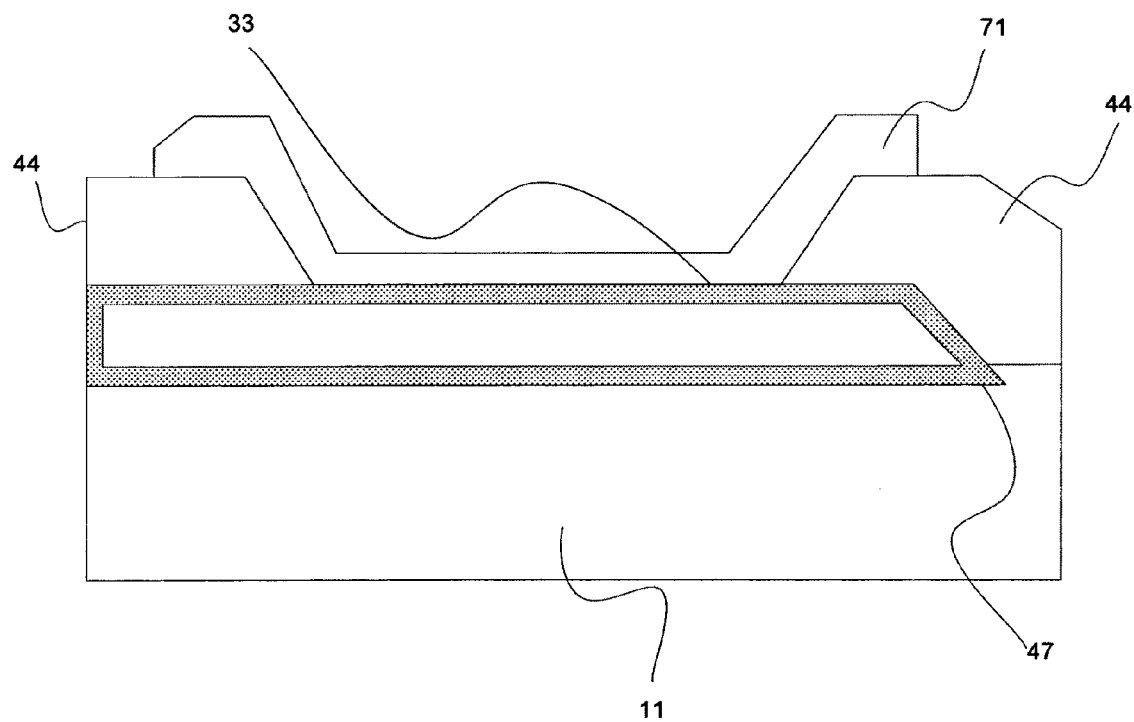
FIG. 18 is a cross-sectional view of a terminal portion of a liquid display device (LCD) module.

Such embodiments are shown in FIG. 16 to FIG. 25. Normally, a layer structure with ITO, IZO, or ITZO which is a transparent electrode 71, such as FIGS. 16 and 17, is employed to ensure environmental resistance. The thickness of this oxide layer 47 is a few nm in this structure thereby adequate conductivity can be secured by a voltage application. In addition, by configuring as shown in FIG. 26 of the present invention, the current process can be used as the manufacturing method for a TFT electrode according to the present invention, thereby the present invention can be realized without significantly changing the manufacturing process.

Figure 19:
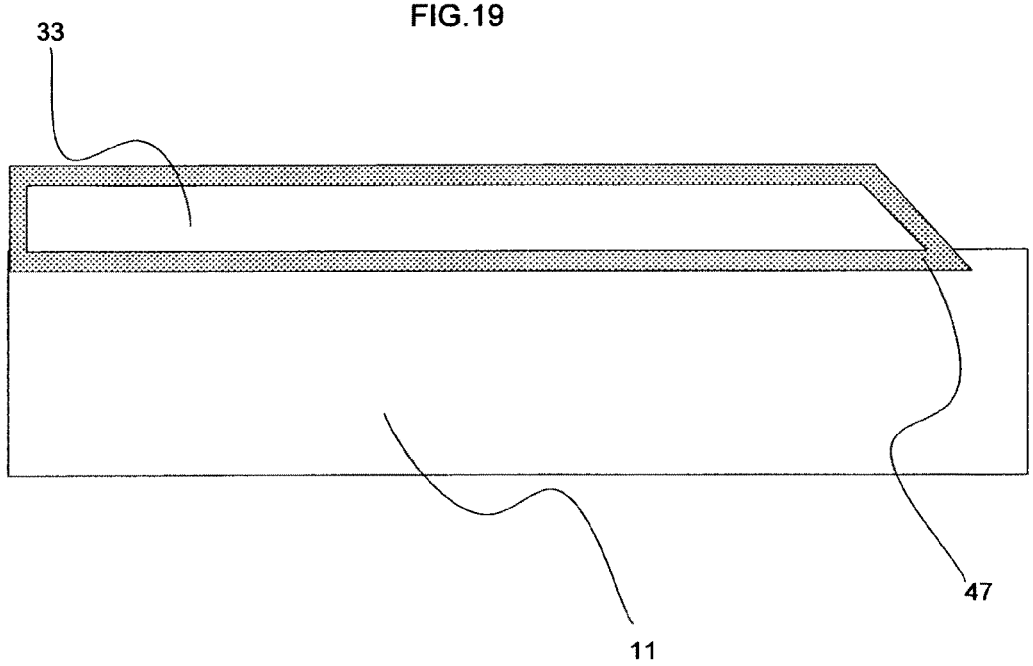
FIG. 19 is a cross-sectional view of a terminal portion of a liquid display device (LCD) module.

Further, this oxide product 47 prevents Cu from penetrating into the transparent electrode 71, thereby providing a terminal structure having a superior environmental resistance. Still further, as shown in FIGS. 17 and 19, the environmental resistance can be secured when a film pressure of this oxide layer is 10 nm to tens of nm, and the electrode terminal can be formed by a single layer of a copper electrode. In this case, an electrical connection with an anisotropically-conductive film can be made by a thermal compression bond.

Figure 20:
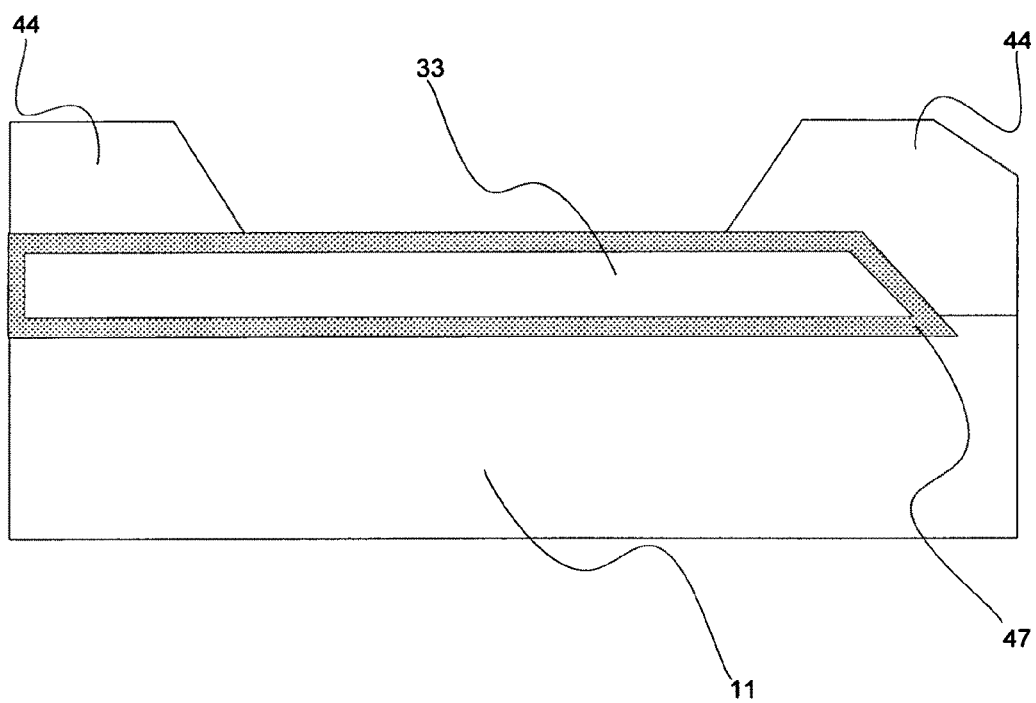
FIG. 20 is a cross-sectional view of a terminal portion of a liquid display device (LCD) module.

Moreover, FIG. 20 shows a structure of an electrode terminal that has a passivation film 44 (protective film) removed.

(Ohmic Contact)

In the source electrode structure or the drain electrode structure, stability of electrical contact is required. A contact portion with the semiconductor layer is preferably to be in ohmic contact electrically. In the present invention, an alloy layer mainly consisting of copper for the source electrode or the drain electrode is covered by an oxide layer mainly consisting of manganese oxide. Such thin oxide layer mediates, and stable ohmic contact is shown. Such an experimental example is described below. The result of contact resistance is measured by the Transfer Length Method (TLM method). Cu-4 atomic % Mn is formed on a transparent electrode (ITO) substrate in a thickness of 200 nm. Onto the substrate, placing a molybdenum mask with an opening diameter of 0.5 mm and a distance of an opening edge of 0.5 mm (distance between the center of the opening is 1 mm), then Cu—Mn is formed. Thereby, round electrodes are formed at equal intervals.

FIGS. 21 to 24 shows measurement results of I-V characteristics by contacting a probe to two different electrodes. The spacing between electrodes was changed to obtain the I-V characteristics. The contact resistance value was obtained from these measurement results. In FIGS. 21 to 24, I-V characteristics show linearity at each experiment parameter, thus demonstrating that ITO and CuMn are in ohmic contact. Results for the thermal treatment with various temperatures showing similar results and ohmic contacts are formed. At this time, FIG. 21 shows I-V characteristics when the thermal treatment temperature is 150° C. and the treatment time is 30 minutes. FIG. 22 shows I-V characteristics when the thermal treatment temperature is 200° C. and the treatment time is 30 minutes. FIG. 23 shows I-V characteristics when the thermal treatment temperature is 250° C. and the treatment time is 30 minutes. FIG. 24 shows I-V characteristics when the thermal treatment temperature is 300° C. and the treatment time is 30 minutes.

Figure 25:
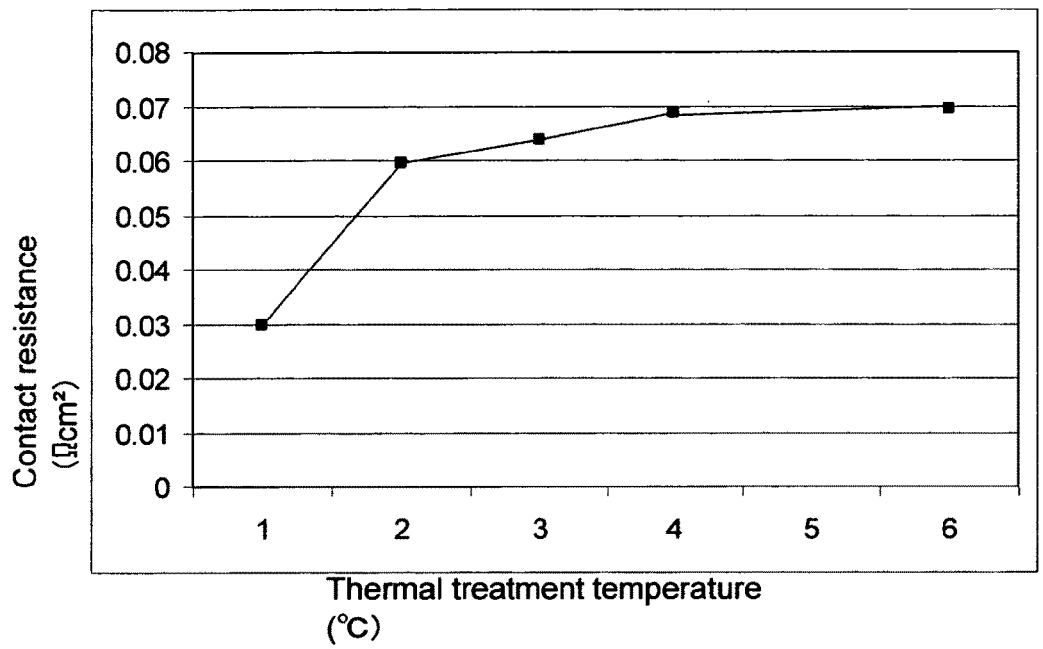
FIG. 25 is a measurement result of I-V characteristics.
Figure 26:
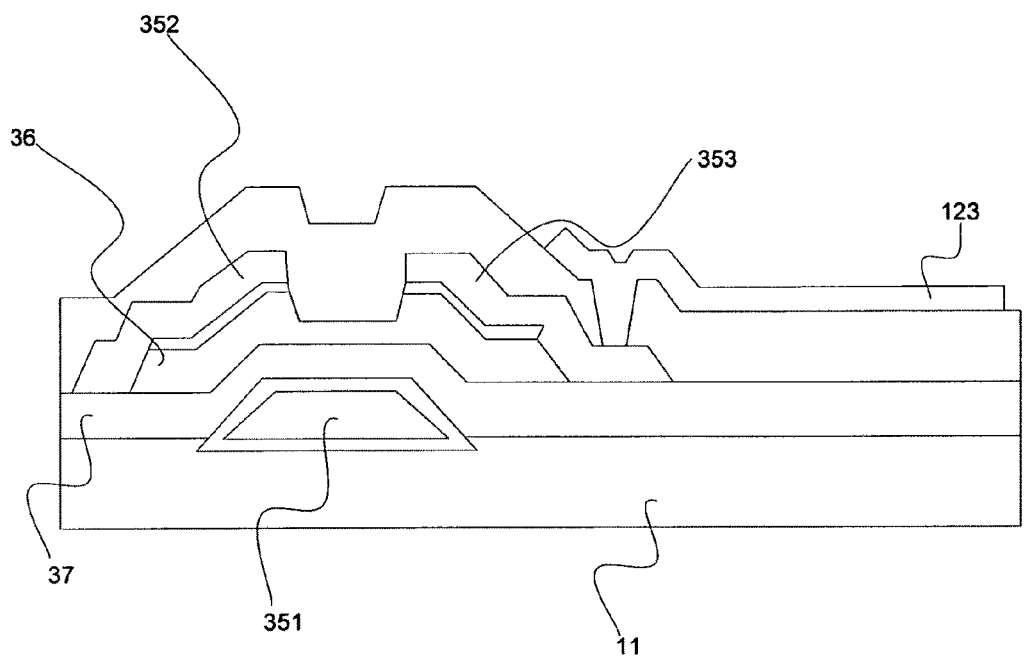
FIG. 26 is one example (1) of a cross-section of a pixel part and a TFT part of the present invention.

Regarding the results for heat treatment with these various temperatures, FIG. 25 plots the contact resistance in the vertical axis and the thermal treatment temperature in the transverse axis. As the heat treatment temperature rises, the value of the contact resistance also increases because the thickness of the barrier layer increases. This result verifies that the electrode mainly comprised of copper, which has an oxide layer mainly comprised of manganese oxide mediated, and the semiconductor layer or the transparent electrode is in ohmic contact. For this reason, this experiment result shows stability as an electrical contact, instead of the ohmic contact from the tunnel effect that we initially anticipated. In FIG. 25, when the thermal treatment temperature exceeds 250° C., the contact resistance value virtually saturates. For this reason, a source electrode or a drain electrode with an appropriate contact resistance value can be formed during normal manufacturing processes of liquid crystal display devices without providing a special thermal treatment process.

Also, the oxide layer mainly comprised of Mn oxide has a thickness of a few nm, thus an application of voltage may cause a dielectric breakdown and leads to conductivity. However, slight instability remains in this conductivity that causes dielectric breakdown. From the experiment results of the present invention, which demonstrates that the contact with ITO that mediates the oxide layer, and CuMn is ohmic, instead of the contact that causes such dielectric breakdown. For this reason, the contact of the present invention shows electrical stability.

[Cu Alloy]

An additive element in the copper alloy applied to the liquid display device of the present invention will be described below. The additive element in the copper alloy applied to the gate wiring 33, the signal wiring 34, the gate electrode 351, the source electrode 352, and the drain electrode 353 in the TFT-LCD regarding the liquid display device of the present invention is a metal that has an oxide formation free energy with a negative value larger than that of Cu and a diffusion coefficient of the additive element in Cu (hereinafter referred to as a "diffusion coefficient" unless otherwise noted) larger than a self-diffusion coefficient of Cu.

By selecting the additive element of which the diffusion coefficient is larger than the self-diffusion coefficient of Cu, the additive element can reach the Cu surface faster to preferentially form an oxide film layer comprising the additive element on the Cu alloy surface.

In other words, if the diffusion coefficient of the additive element is smaller than the self-diffusion coefficient of Cu, the additive element requires a significant amount of time to reach the Cu alloy surface, and therefore a Cu oxide film layer consisting of CuO, $Cu_2O$, and the like is formed on the Cu alloy surface.

In this case, because the Cu oxide film layer is not robust, oxygen intrudes into the inside of the Cu oxide film layer and forms oxide of the additive element in the Cu alloy. In addition, an amount of Cu in a metal state decreases as the oxidation of Cu progresses, and if such Cu alloy is used for wiring of a liquid crystal display device, its electrical resistance would be increased.

Accordingly, the copper alloy applied to the present invention was intended to provide a solution to such a problem by the selection of the additive element of which the diffusion coefficient is larger than the self-diffusion coefficient of Cu.

The additive element in the copper alloy, which is applied to the present invention, is now described in detail. It is preferable that the additive element in the copper alloy forms a solid solution in an additive amount ranging from 0.1 to 25 atomic % in the Cu alloy. It is further preferable that the additive element in the copper alloy forms a solid solution in an additive amount ranging from 0.5 to 15 atomic % in the Cu alloy. The most preferable additive amount ranges from 0.5 to 5 atomic % in the Cu alloy. This is because the additive element cannot be easily diffused if it is not within the solid solution range in the Cu alloy. Especially, if the additive element forms an intermetallic compound with Cu, it is hardly diffused.

Also, if the additive amount of the additive element in the Cu alloy is lower than 0.1 atomic %, the oxidation of Cu cannot be prevented because the oxide film layer to be formed becomes thin. On the other hand, if the additive amount of the additive element exceeds 25 atomic %, the additive element is sometimes precipitated as a secondary phase.

Specifically, the additive element in the Cu alloy applied to the present invention is at least one of the elements selected from the group consisting of Mn, Zn, Ga, Li, Ge, Sr, Ag, In, Sn, Ba, Pr, and Nd. Also, it is further preferable that the additive element is at least one of the metals selected from the group consisting of Mn Zn and Ga. A single element may be used, or a plurality of additive elements may be applied together. Especially, Manganese (Mn) is the most preferable for an additive element. Into the Cu alloy, an impurity such as S, Se, Te, Pb, or Si may be mixed in, however, this is acceptable as long as the characteristics of the Cu alloy, including electrical conductivity and tensile strength are not deteriorated.

In the present invention, a method for forming the Cu alloy is not particularly limited. That is, a plating method such as electric field plating or molten plating, or a physical vapor deposition method such as vacuum evaporation or sputtering may be used. The Cu alloy deposited by any of the methods is thermally treated to form an oxide film layer.

Temperature for the thermal treatment is, for example, approximately 150 to 400° C., preferably approximately 150 to 350° C., and further preferably approximately 150 to 300° C. In the present invention, it is possible to thermally treat independently to form a CuMn wiring, however, the independent thermal treatment for forming the CuMn wiring can be omitted from a manufacturing process because the CVD treatment at 150 to 400° C. is conducted when forming a passivation layer on CuMn. Further, in the present invention, it is preferable for such CVD thermal treatment temperature to be 150 to 300° C., and the CuMn wring can also be formed sufficiently in this temperature range. This is to respond to the demand in recent years of reducing the CVD thermal treatment temperatures.

And a time period for the thermal treatment is, for example, in a range of 2 minutes to 5 hours. If the thermal treatment temperature is lower than 150° C., productivity is reduced because the formation of the oxide film is time-consuming. On the other hand, if it exceeds 450° C., it causes a problem that Cu is oxidized to form an oxide film before an additive element in the Cu alloy is diffused and reaches a surface. Also, if the thermal treatment time period is shorter than 2 minutes, thickness of the oxide film is too thin, while if it exceeds 5 hours, the formation of the oxide film is too time-consuming.

One example providing low resistivity in one of the copper alloys used in the present invention, CuMn, is now described. By the thermal treatment, CuMn constitutes wiring or an electrode, and an oxide film layer covering it. An example of a relationship between the thermal treatment time period (second) and resistivity (μΩ·cm) of the wiring body is shown in FIG. 27, using oxygen concentration (ppm) in a thermal atmosphere as a parameter.

Figure 27:
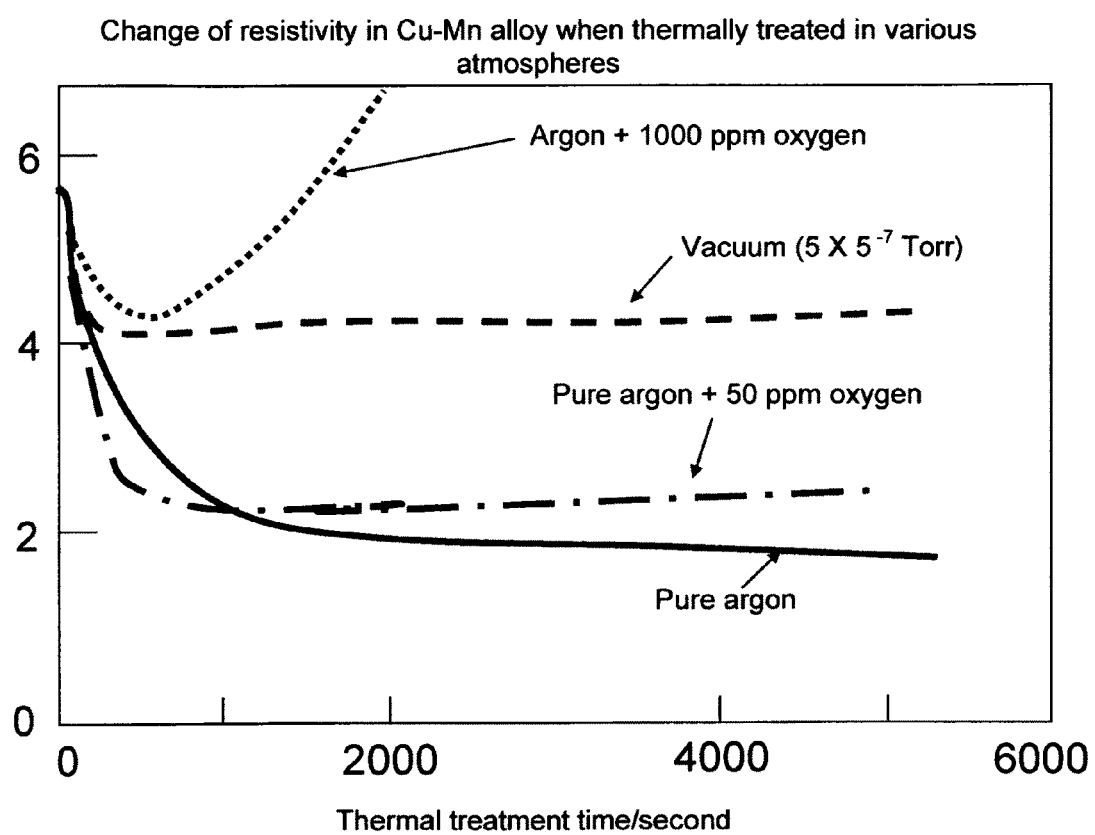
FIG. 27 is a graph illustrating electrical resistivity (1) of copper alloy (CuMn).

Measurements in FIG. 27 were carried out in such a way that Cu and Mn containing oxide was first formed also in a surface layer portion on the top side of the wiring body, then the oxide layer in the top surface layer portion was removed to expose the Cu wiring body, and the electrical resistivity of the Cu wiring body was measured. According to the result, the resistivity of the Cu wiring body was extremely low, and 2.2 μΩ·cm under the conditions of an oxygen concentration of 50 ppm and a thermal treatment time period of 4 minutes. This value was close to an electrical resistivity of 1.7 μΩ·cm of a pure Cu bulk material. That is, a satisfactory value to provide low resistive wiring and to promote an image quality improvement in a TFT-LCD was realized.

Because most of the Mn escapes from the thin film of CuMn by the thermal treatment and forms an oxide layer, thus the wiring body can realize the resistivity close to that of a pure copper.

Figure 28:
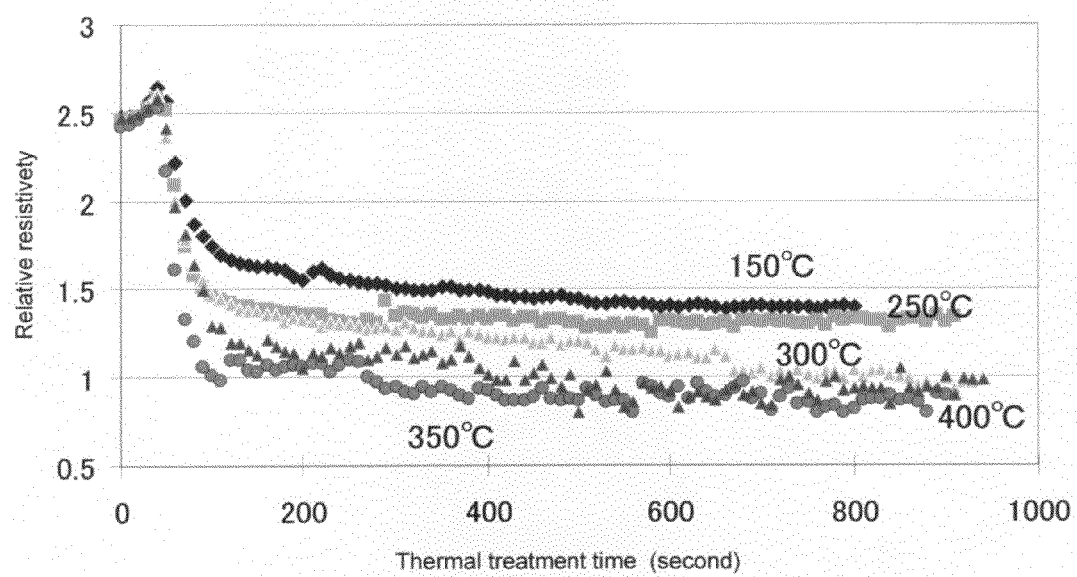
FIG. 28 is a graph illustrating electrical resistivity (2) of copper alloy (CuMn).

Similarly, FIG. 28 shows an example of relative resistivity against thermal treatment temperature using a thermal treatment time period as a parameter. It turns out that the resistivity is saturated to low resistivity at a thermal treatment temperature of 150 to 400° C. and a thermal treatment time period of approximately 2 minutes. The time period is short enough for processing time, and is an adequate value for manufacturing a TFT-LCD.

[Shading]

Among improvements of image quality obtained by lowering the wiring resistance, which are remarkable effects of the present invention, a shading reduction effect will be described below. First, an operation of a TFT-LCD is described in detail. A display device used in the present invention is an LCD in which pixels are arranged in a matrix form. This LCD is called an active matrix LCD (AM-LCD).

Figure 29:
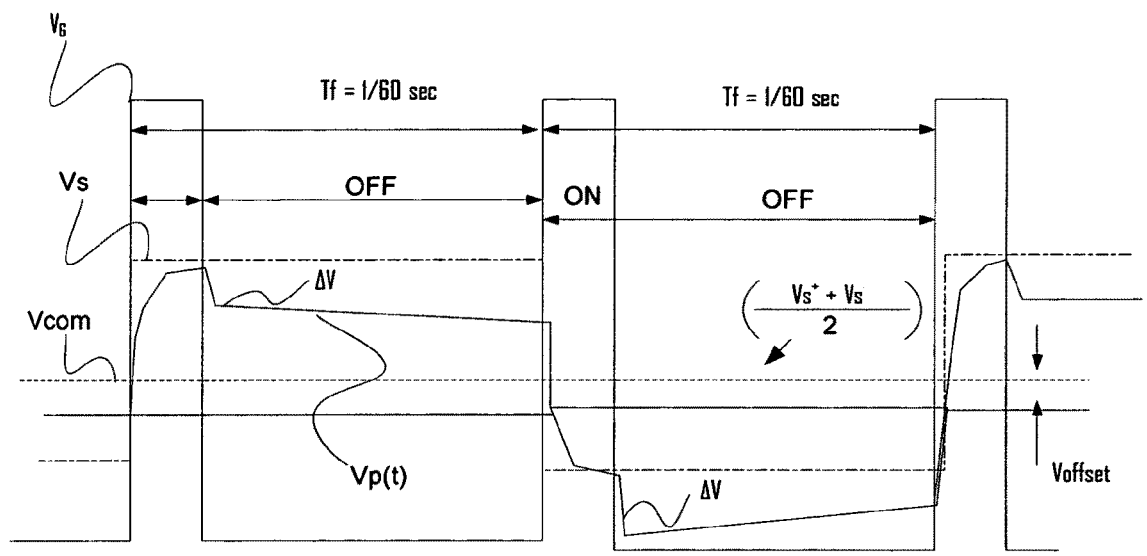
FIG. 29 is an operating waveform diagram of a TFT.

For example, in the case of a TFT-LCD for a digital TV, the number of pixels in a full HD specification is (1920×3)×1080. That is, the number of scanning lines is 1080, and the number of signal lines is 5760 because one pixel consists of three primary colors (red, green, and blue) and therefore the number of pixels in a horizontal direction is tripled. In this TFT-LCD, gate voltage $V_G$ shown in FIG. 29 is applied to a gate electrode of the TFT constituting the pixel. Typically, $V_G$ is 10 to 15 V.

On the other hand, signal voltage $V_S$ is applied to a source electrode, and a gate voltage pulse serves as a scanning signal. Given that a frame frequency to display one screen is 60 Hz, a frame time is 16.7 ms. If the 1080 scanning lines are scanned in a line sequential scanning mode, a gate voltage pulse width becomes approximately 16 μs.

As illustrated in FIG. 29, a cycle of the gate voltage pulse is 16.7 ms, and the pulse width is approximately 16 μs. On the other hand, given that a LCD drive voltage $V_{lc}$ is approximately 5 V, the signal voltage applied to the source electrode to drive a liquid crystal is approximately 10 V that is a double of the voltage amplitude. A difference between the signal voltage and a common voltage $V_{com}$ applied to the common electrode provides a liquid crystal layer drive voltage $V_p$ (t), and FIG. 29 exemplifies a driving waveform in a frame inversion system in which a polarity of $V_p$ (t) is inverted for each frame to transform it into an alternating voltage.

In this case, transmittance of the LCD modulates brightness of the display by voltage modulation of the signal voltage. Further, the liquid crystal drive voltage is retained while the gate voltage pulse is off (approximately 16 ms that substantially corresponds to the frame time).

FIG. 29 illustrates such a situation. The liquid crystal layer drive voltage consists of a writing state and a holding state. Also, the transmittance of the LCD depends on a root-mean-square (r.m.s.) value of the liquid crystal layer drive voltage $V_p$ (t). For this reason, the LCD drive voltage $V_{lc}$ is expressed by the following equation 1:

$$< Vlc > \text{rms} = \frac{1}{2Tf} \sqrt{\int_{t=0}^{2Tf} [Vp(+) - Vcom]^2 \, dt} \quad (1)$$

Meanwhile, a switching time of the a-Si TFT is of the order of μs because capacitance loads are driven and mobility of a-Si is as low as 0.3 to 1.0 cm²/V sec. Accordingly, a few μs required for switching-on of the TFT during the gate voltage pulse width of 16.7 μs.

Further, because the liquid crystal layer is a capacitance load, an application of the signal voltage is delayed. As a result, rise of the liquid crystal layer drive voltage $V_p$ (t) is also delayed. In addition, in a TFT-LCD for TV with a full HD specification, 5760 pixels are arranged in one line. A plurality of TFTs arranged in one line are simultaneously excited by applying the gate voltage pulse to an end part of the gate wiring.

At this time, the gate voltage pulse is propagated from the end part to gate electrodes of respective pixels. A propagation speed decreases as a resistance value and a parasitic electrical capacitance of the gate wiring are increased. This phenomenon is referred to as a propagation delay of the gate voltage pulse. As the propagation delay becomes larger, adequate time to input the liquid crystal layer drive voltage cannot be obtained, and therefore the liquid crystal drive voltage for each pixel cannot reach a predetermined value. As a result, the transmittance of the liquid crystal layer becomes uneven, i.e., the screen brightness becomes uneven, causing the shading. It should be appreciated that also in the above-described IPS liquid crystal and VA liquid crystal, it may cause the shading in the same manner.

A model of the propagation delay of the gate voltage pulse described above is shown in FIG. 30. Each pixel on the gate wiring can be equivalently expressed using resistance R and parasitic capacitance C. An RC delay of the gate voltage pulse in each column is accumulated, and at a terminal node n5760, the propagation delay reaches several µs.

If a distribution of the LCD brightness at this time is schematically illustrated, the brightness is gradually varied along the gate wiring in a normally white mode LCD, and at the terminal, the screen is bright instead of black as originally intended due to insufficient liquid crystal layer drive voltage. Therefore, the propagation delay of the gate voltage pulse is reduced by lowering the gate wiring resistance. Consequently, the unevenness in the screen brightness, in other words, the shading can be suppressed.

Figure 30:
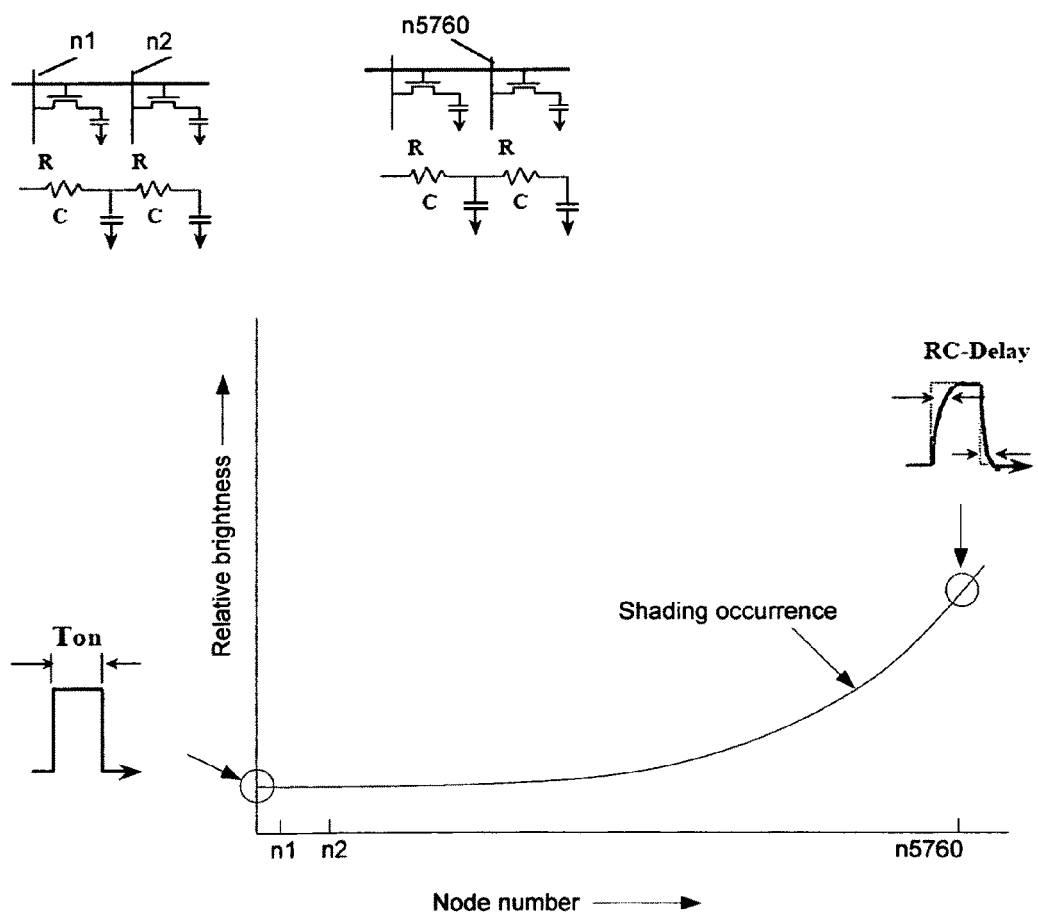
FIG. 30 is a diagram illustrating a model of a propagation delay of a gate voltage pulse.

The present invention enables a reduction in such shading by using the above-described copper wiring close to pure copper, as illustrated in FIG. 30.

On the other hand, the number of nodes in the source wiring is 1080, and the problem of propagation delay is low compared to the gate wiring. However, as the size of a LCD panel increases, the value of propagation delay in the source wiring reaches a considerable amount, such as 1-3 µs, thus decreasing this propagation delay by applying a CuMn alloy to the source wiring is effective for decreasing the unevenness in the LCD display brightness.

[Adhesiveness to Glass]

Adhesiveness of copper alloy CuMn and glass that is another remarkable effect of the present invention herein described. Thin film wiring and electrodes formed from the copper alloy CuMn are covered with the oxide layer formed by the thermal treatment.

In a liquid crystal display device, such wiring and electrodes are essentially required to have excellent adhesiveness to a glass substrate and the insulation layer. The adhesiveness is typically determined by performing a tape test. As shown in Table 1, if a pure Cu thin film is formed on an insulation film $SiO_2$, sufficient adhesiveness cannot be obtained, causing separation.

As the tape test to evaluate the adhesiveness, a separation state was evaluated when a tape was peeled off after the tape had been stuck on a Cu thin film surface. Before the tape is peeled off, it is bonded onto the surface by pressing with a nail.

This procedure is repeated 10 times on a same position of the thin film to check the adhesiveness to a substrate. Results of the tape test were analyzed in detail.

According to the results, the CuMn double-layered thin film exhibited low electrical resistivity by being thermally treated at 200° C. or higher. On the other hand, regarding the adhesiveness, partial separation was observed when the film was thermally treated at 150° C. By a thermal treatment at 250° C., excellent adhesiveness was exhibited in all the thermal treatment time periods, which are 3 minutes, 30 minutes, 1 hour, 20 hours, and 100 hours. Similarly, excellent adhesiveness was obtained when the thermal treatment temperature was 350° C.

Figure 31:
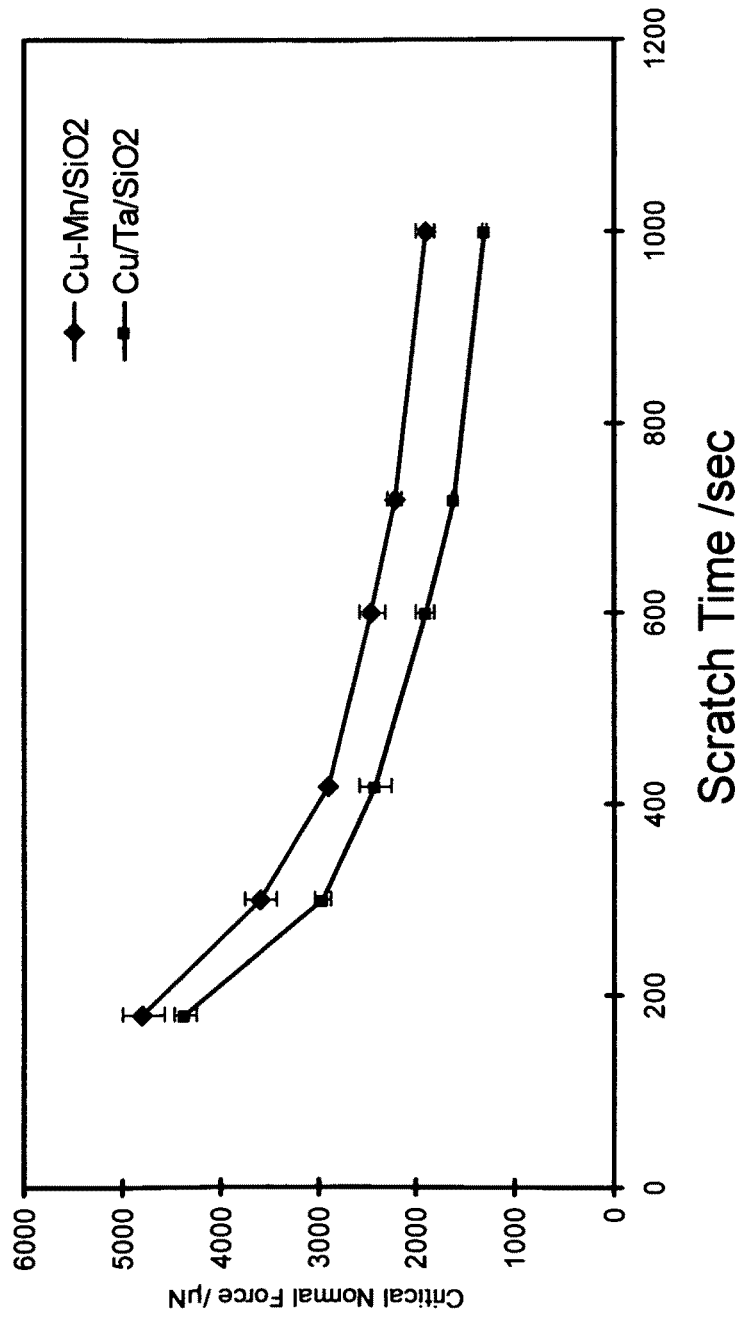
FIG. 31 is an example of adhesion strength measured by a nanoscratch test, compared with a case of forming Ta that is frequently used in semiconductor wiring.

FIG. 31 shows an interface adhesion strength in the case of thermally treated Cu-4 atomic % Mn alloy at 400° C. for 30 minutes after forming in film on a SiO2 substrate, compared with a case of forming Ta (frequently used for semiconductor wiring), between pure Cu and SiO2. The adhesion strength is measured by a nano scratch method. A horizontal axis indicates a scratch time required to scan a length of 6 µm on the film surface. A smaller time corresponds to a faster scratch speed. At any scratch speed, the load value required for interface separation is larger in Cu—Mn/SiO2 compared to Cu/Ta/SiO2, showing a high adhesion strength.

Figure 32:
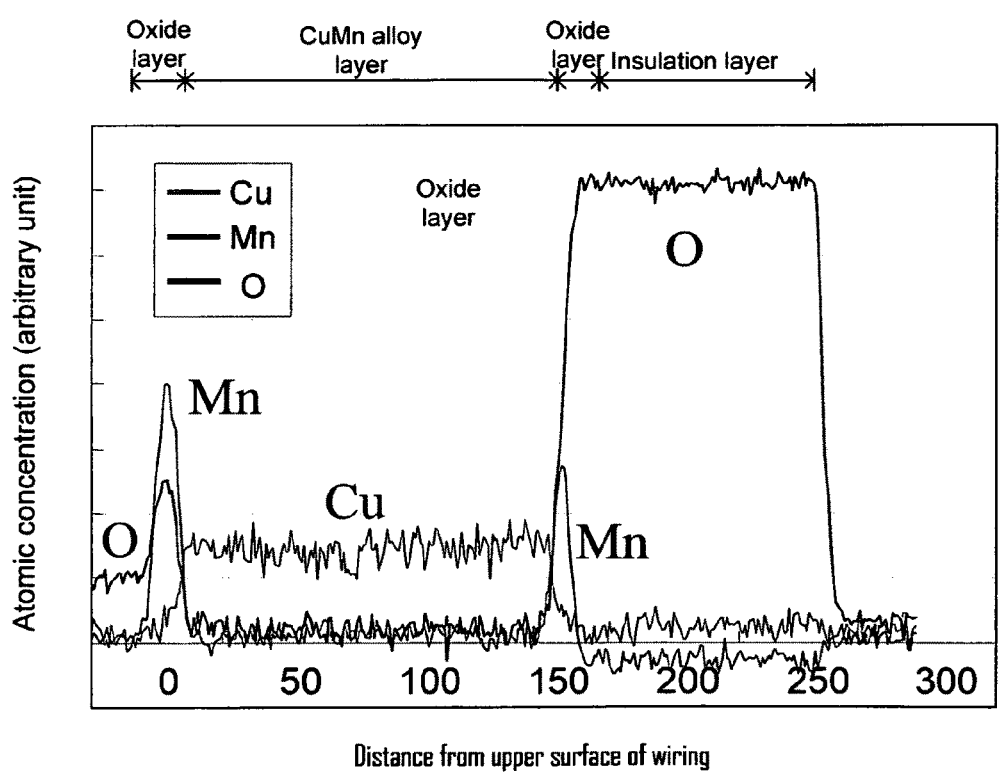
FIG. 32 is a composition diagram of a wiring structure.
Figure 33:
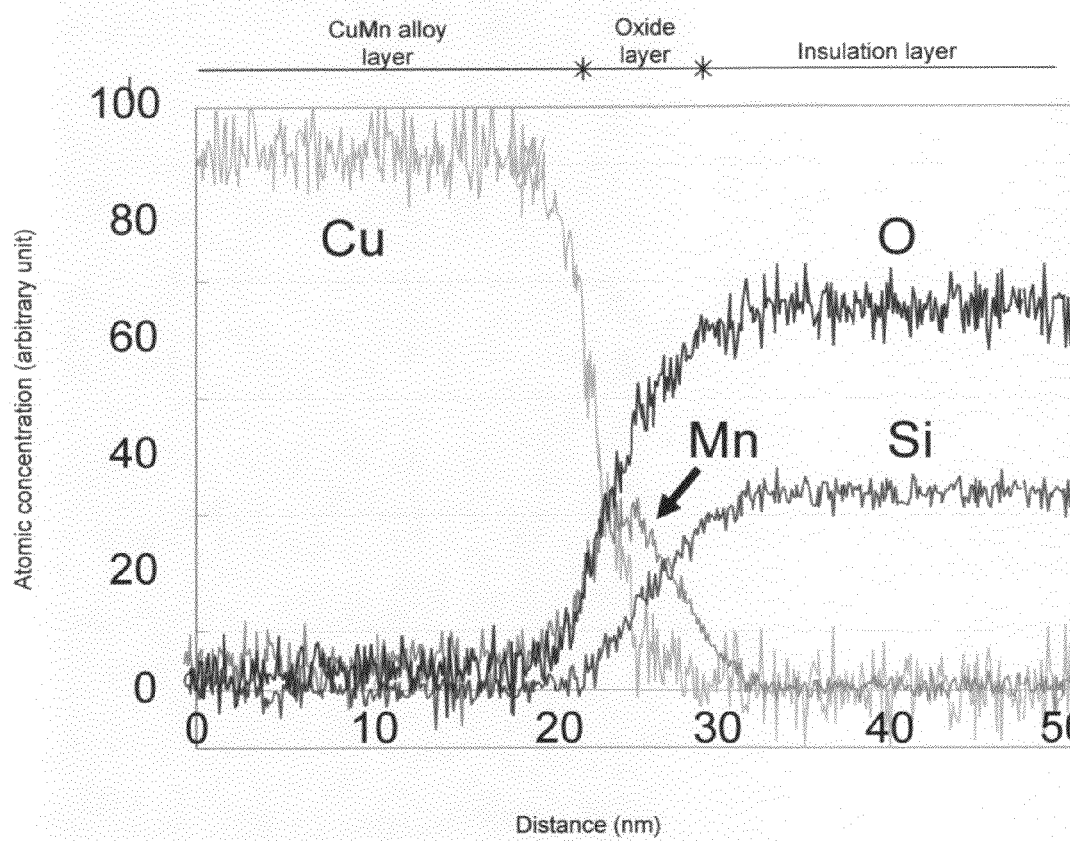
FIG. 33 is an enlarged view of a composition of a wiring structure across the interface between Cu and SiO2.

The oxide layer constituting the interface with the wiring and the electrodes on the insulation film $SiO_2$ has the composition of $Cu_XMn_YSi_ZO$ as shown in FIGS. 32 and 33, and is amorphous. As described, at the interface, the oxide layer containing mainly Mn acts as an excellent diffusion barrier to prevent interdiffusion between Cu wiring and the insulation layer. The gradual concentration change near the interface of the oxide layer promotes an excellent adhesion of the oxide layer with the Cu and with the Si. It can be considered that this provides the excellent adhesiveness.

This enables the oxide film with high adhesiveness to a semiconductor layer or a pixel electrode to be formed to prevent oxidation of a wiring material or the like, and a liquid crystal display device having wiring, an electrode, or a terminal electrode (especially a source electrode or a drain electrode) with high electrical conductivity and a manufacturing method therefore are provided. All difficulties are simulta-

TABLE 1

Tape test results of Cu and Cu/Mn double layered film on an insulation film $SiO_2$

| Material (thickness: nm) | Thermal treatment temperature (° C.) | | | | | | |
|---|---|---|---|---|---|---|---|
| | 150° C. | 200° C. | 250° C. | 300° C. | 350° C. | 400° C. | 450° C. |
| Cu (150 nm) | X | X | X | X | X | X | X |
| Cu(150)/Mn(2)stacked layer | Δ | ○ | ○ | ○ | ○ | ○ | ○ |
| Cu(150)/Mn(20) stacked layer | Δ | ○ | ○ | ○ | ○ | ○ | ○ |

○: Good adhesiveness
X: Separation (poor adhesiveness)
Δ: Partial Separation

On the other hand, in a case of a double-layered thin film of Cu and Mn, interdiffusion of Cu and Si occurs at an interface between them by a thermal treatment, and an oxide layer having a composition of $Cu_XMn_YSi_ZO$ (0<x<Y, 0<z<Y) is formed at the interface. This enables excellent adhesiveness to the insulation layer $SiO_2$ to be obtained.

neously overcome, and the wiring, electrode, or terminal electrode (especially a source electrode or a drain electrode) applicable to a practical manufacturing process can be formed.

In addition, Cu-4 atomic % Mn alloy is formed in a film on the glass substrate using a spatter device in the current invention. Thereafter, the film is thermally treated in a pure argon atmosphere within a temperature range of 150-350° C. The time required for the thermal treatment was 10 to 60 minutes. An evaluation (a tape test) is performed to find out whether the thin film strips off or not by peeling a piece of scotch tape adhered to the alloy thin film surface for both specimens with or without thermal treatment after forming a film. As a result, the alloy thin film without thermal treatment separated from the glass substrate. On the other hand, as shown in FIG. 29, when thermally treated for over 20 minutes in temperatures of 200° C. or above, or over 10 minutes in temperatures of 250° C. or above, the alloy thin film was adhered to the glass substrate. Similar tape tests have been done to pure Cu thin film, however, separation occurred to all heat treatment conditions. Based on this, it became apparent that favorable adhesiveness to a glass substrate was presented by thermally treating in a temperature of 200° C. or above using the Cu—Mn alloy.

Figure 34:
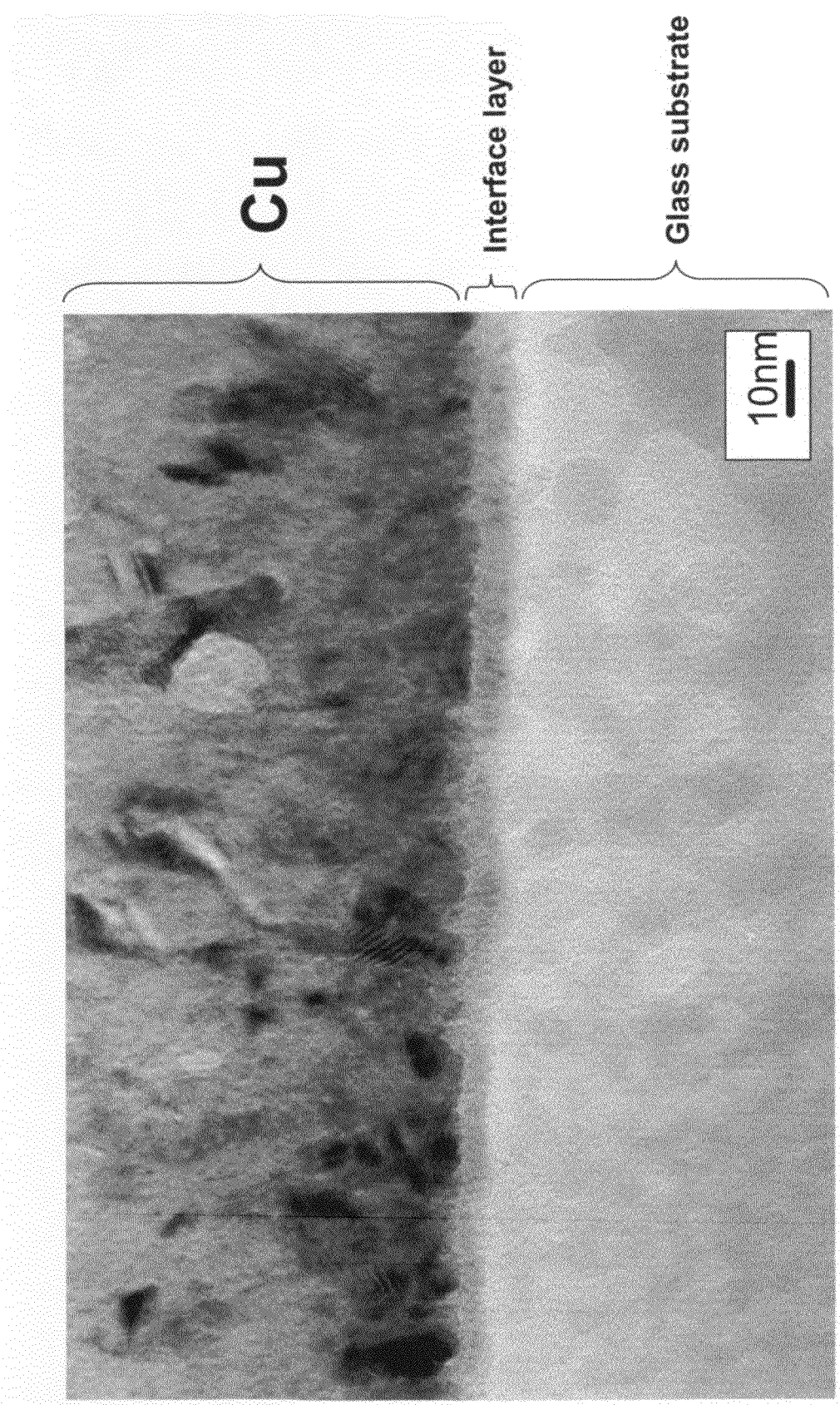
FIG. 34 is a cross-section TEM picture after thermally treating Cu—Mn alloy on the glass at 250° C. for 20 minutes.

FIG. 34 shows a cross-section TEM image after thermally treating the Cu—Mn alloy at 250° C. for 10 minutes. At the top of FIG. 28 is the Cu—Mn alloy thin film portion and at the bottom is the glass substrate. A reaction layer having an even contrast is observed along an interface of both layers. As a result of analysis using an X ray energy dispersive spectroscopy (XEDS) device attached to TEM, the reaction layer along the interface turned out to be an oxide mainly composed of Mn. Forming of this oxide is the reason for the improvement in adhesiveness of the interface.

In order to decrease resistivity, it is ideal to add only enough Mn to sufficiently form the interface layer. For example, when thermally treating 200 nm alloy film at 250° C. for 10 minutes, an interface layer with 6 nm thickness is formed. An amount of Mn contained in the interface layer is approximately 50%, which is equivalent to a pure Mn layer of approximately 3 nm in thickness. Therefore, a Mn concentration to be added to the alloy is Mn of 3 parts of 200 in a volume ratio, thus Cu (1-2) atomic % Mn is ideal considering the density of Cu and Mn. When the thickness of the alloy film is 100 nm, twice the Mn concentration is required, and when the thickness of alloy film is 300 nm, 1.5 times the Mn concentration is required.

Also, FIG. 35 shows the result of adhesiveness evaluation by a tape test after thermally treating a Cu—Mn alloy formed in film on a glass substrate at each temperature for a predetermine time. In this figure, X indicates separation occurred, Δ indicates separation occurred in some cases, ○ indicates separation did not occur at all. In addition, separation occurred for pure Cu in all conditions. Based on FIG. 29, no separation occurred for the present invention in a case of 250° C. or above.

Figure 36:
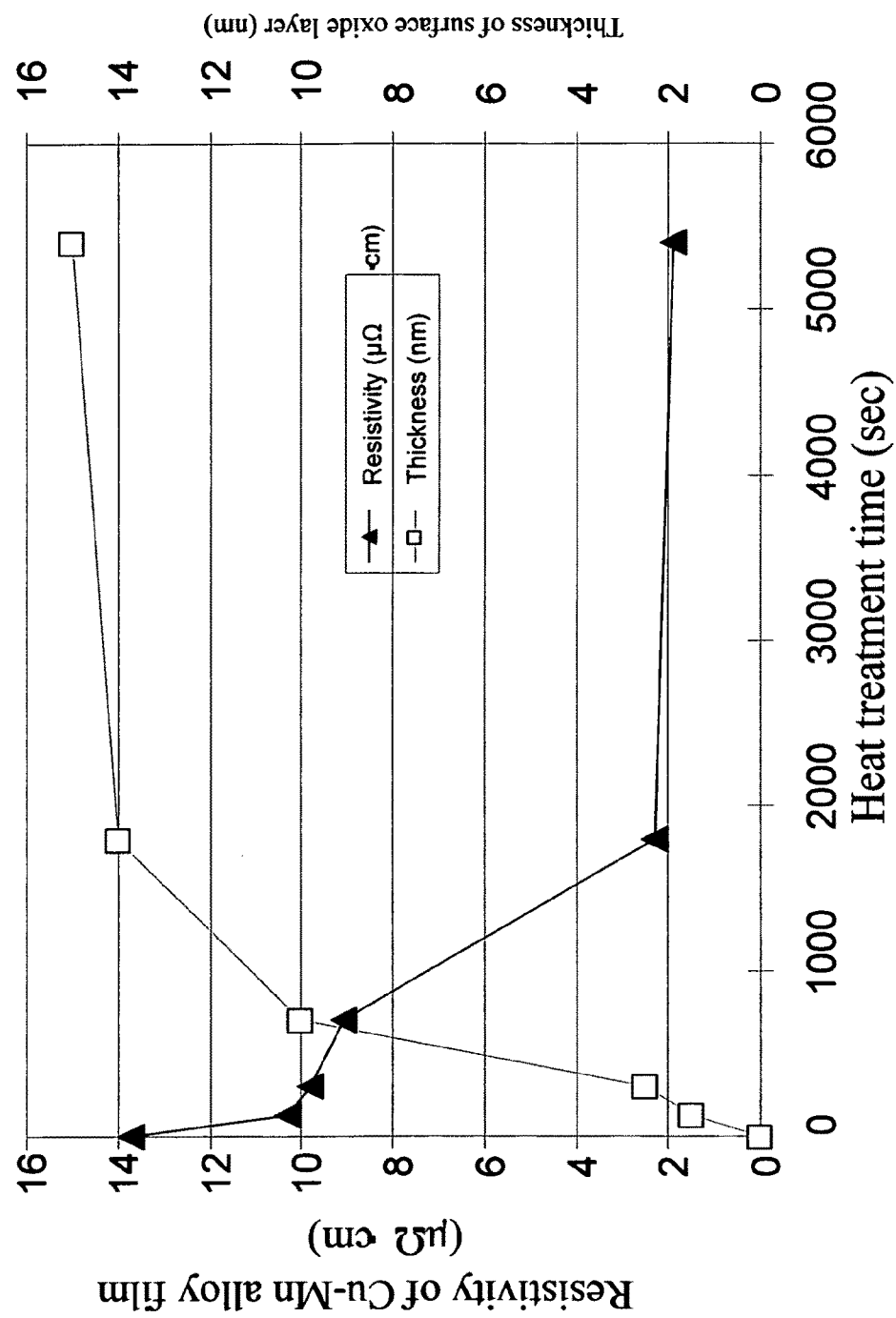
FIG. 36 shows resistivity of the alloy thin film that was thermally treated at 350° C., and a time change in thickness of a Mn oxide formed on the Cu surface.

In addition, in a case of an alloy with more than a sufficient amount of Mn is added to form an interface layer, heat treatment should be done in a high purity Ar gas (oxygen concentration of 0.1 ppm or below) atmosphere that contains oxygen as an inevitable impurity. FIG. 30 shows the resistivity of an alloy thin film on glass when thermally treated at 350° C., and the time evolution of a Mn-oxide thickness formed on the surface. As shown in FIG. 30, Mn remaining in the alloy film after forming an interface layer can be discharged from the alloy film by reacting with oxygen of less than 0.1 ppm contained in pure Ar and forming an oxide on the surface. As shown in FIG. 36, it became apparent that the resistivity decreases as the Mn oxide layer on the surface grows in thickness. Resistivity after 30 minutes of heat treatment decreases to a value equivalent to pure Cu thin film. XEDS analysis of the Mn concentration indicated no Mn in the alloy film, which revealed that excess Mn can be discharged from the alloy film completely.

[Manufacturing Process]

Regarding the liquid crystal display device according to the present invention, the oxide layer associated with the copper alloy used as a wiring and electrode material of a TFT-LCD (thin film transistor-liquid crystal display), and a manufacturing process of the oxide layer are described below.

Figure 37:
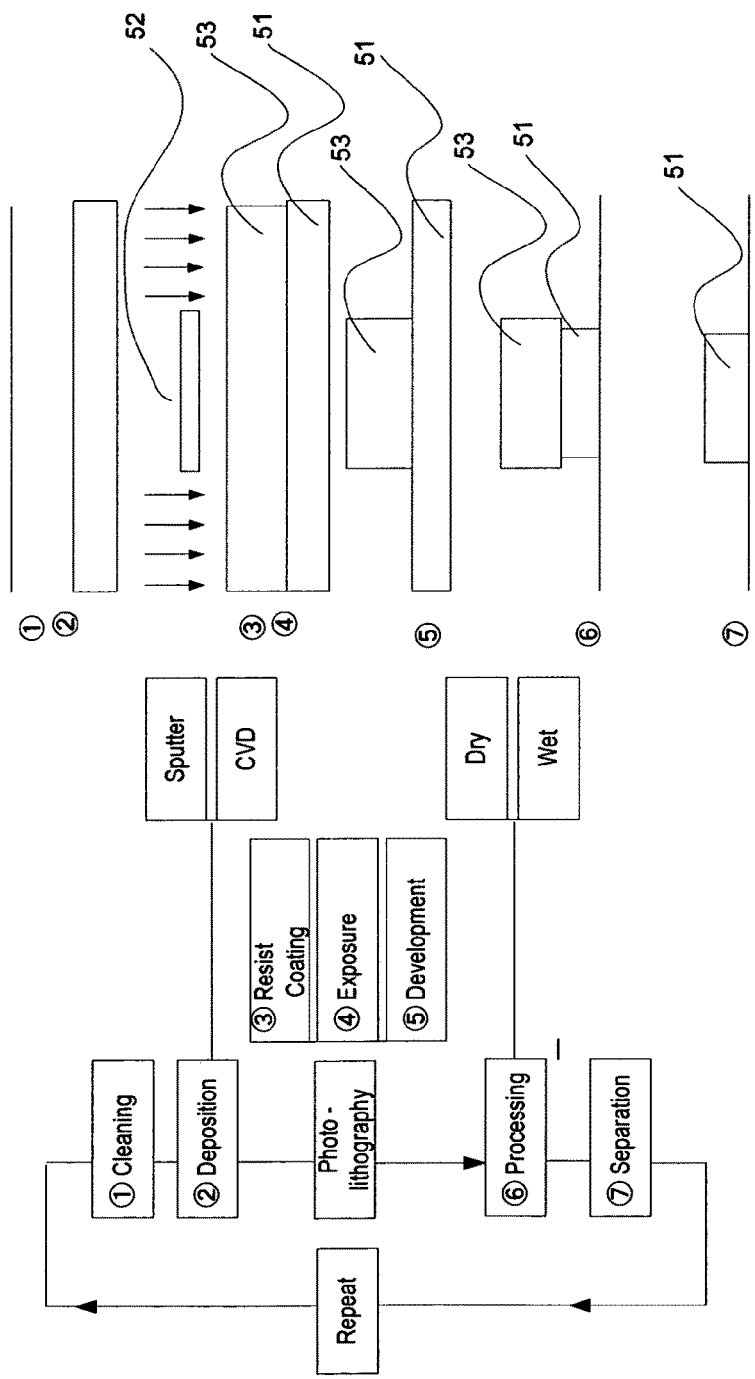
FIG. 37 is a diagram illustrating the fundamentals of a TFT manufacturing process.

FIG. 37 shows the fundamentals of a TFT manufacturing process. Thin films 51 of metal, semiconductor, and insulator are respectively deposited, and they are patterned by photo-etching using mask 52 and resist coating 53. Sputtering is used for the metal film deposition, and CVD (Chemical Vapor Deposition) is used for the semiconductor and insulator depositions. For etching, either dry or wet etching is used. The wet etching is often used for the metal to form into the wiring. These steps are repeated four to five times to manufacture a TFT.

Figure 38:
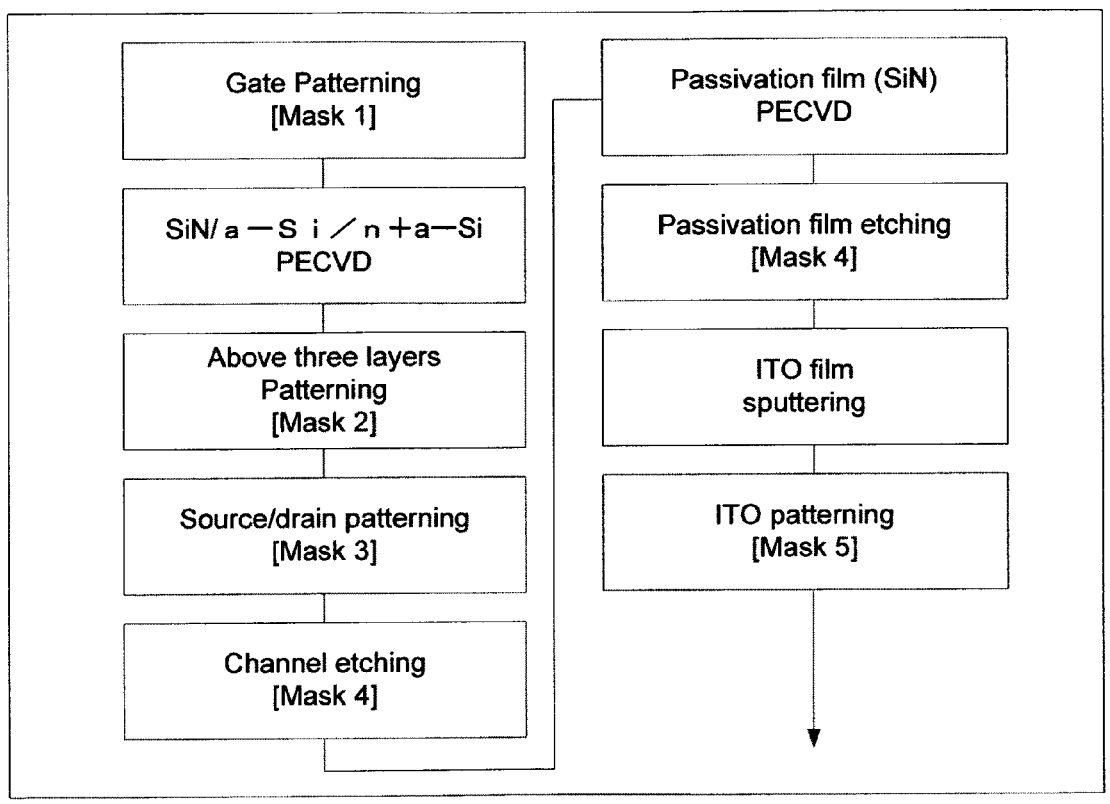
FIG. 38 is a diagram illustrating a five-mask process in TFT manufacturing.

Among them, FIG. 38 shows a five-mask process that uses five kinds of photomasks for exposure. The process sequence comprises the steps of: (1) forming a gate pattern by wet etching using a mask 1; (2) simultaneously processing three layers of SiN/a-Si/n$^+$ a-Si by dry etching using a mask 2 to form a pattern; (3) forming a source/drain electrode pattern by wet etching using a mask 3; (4) fabricating the amorphous silicone (n$^+$ a-Si) containing impurities into a channel structure by dry etching using the mask 3; (5) patterning the SiN passivation film using a mask 4; and (6) patterning an ITO (Indium Tin Oxide) film, which is a transparent electrode, using a mask 5. This allows a TFT substrate to be manufactured.

Figure 39:
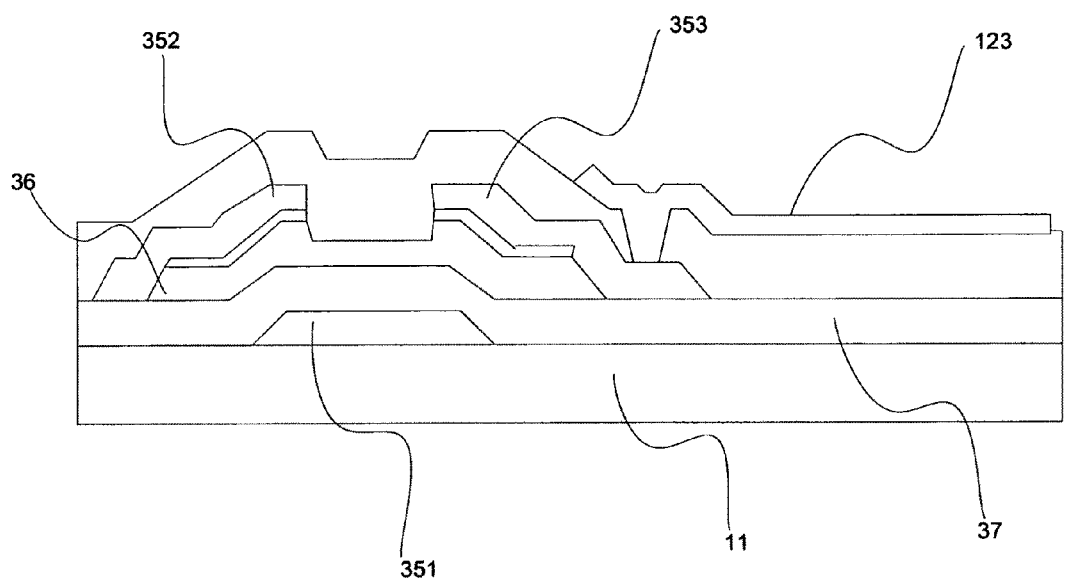
FIG. 39 is a cross-sectional view of a TFT manufactured by the five-mask process.
Figure 40:
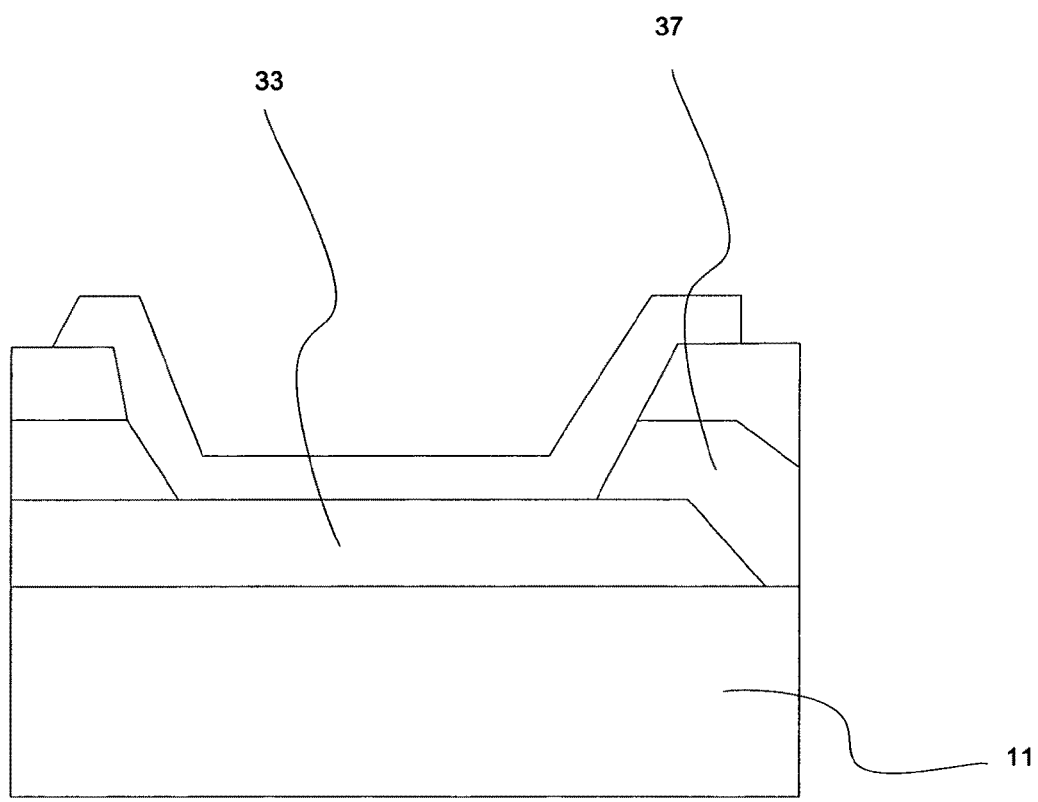
FIG. 40 is a cross-sectional view of an electrode terminal led outside.
Figure 41:
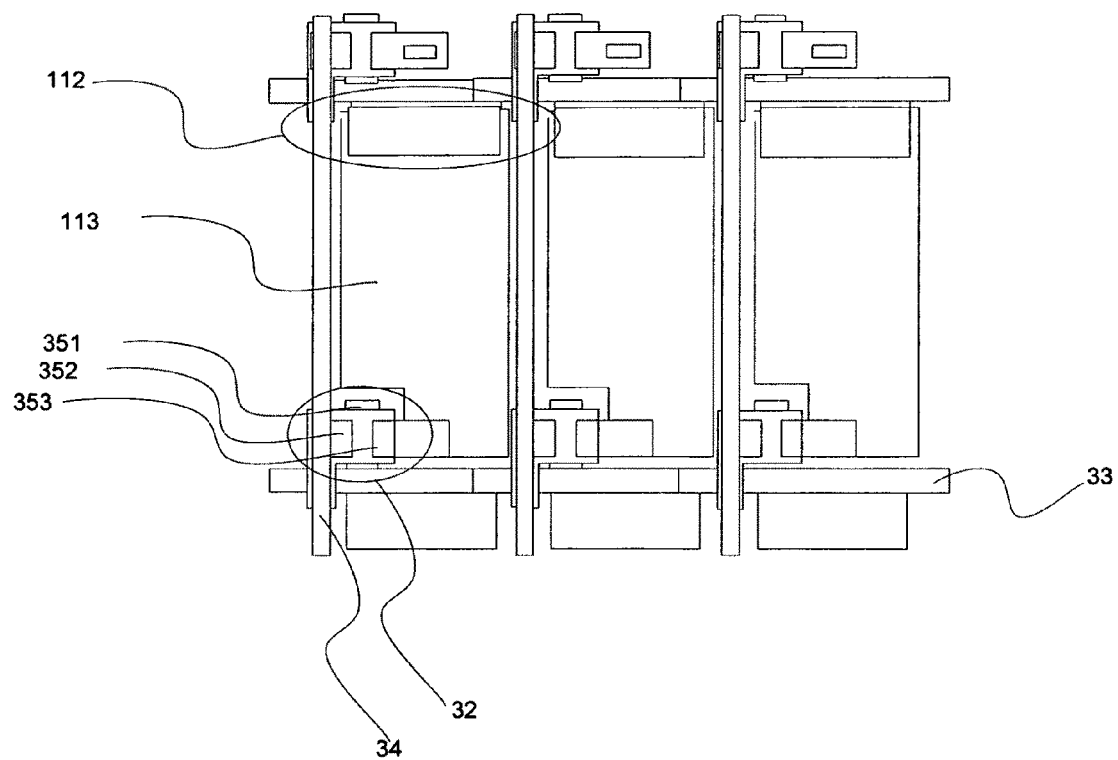
FIG. 41 is a plan view of a pixel part.

FIG. 39 shows a cross-section of a structure of a TFT manufactured by a standard five-mask process. As illustrated in FIG. 40, a gate terminal part constituting an external electrode has a stacked structure of a metal thin film and an ITO film. FIG. 41 shows a plan view of each pixel.

Selecting an additive element in the copper alloy according to the present invention such that the element has oxide formation free energy with a negative value larger than those of elements of an oxide layer enables an oxide film layer to be formed through reduction of the above-described oxide. Besides, in an oxidative atmosphere, the oxide film layer can be formed without the reduction of the oxide.

Further, if the Cu alloy applied as a wiring and electrode material in the TFT-LCD of the present invention is brought into contact with an insulation film containing oxygen, the additive element in the Cu alloy is diffused to the interface and thereby the additive element is oxidized to form the oxide film layer.

Still further, metal elements in the insulation layer, and Cu and the additive element in the Cu alloy form oxides respectively, and these oxides are combined together to form a compound oxide film. For example, if a TFT substrate contains oxide such as $SiO_2$, and gate wiring inside the Cu alloy provided on the substrate is thermally treated, the additive element in the Cu alloy forming the gate wiring is diffused to an interface between the substrate and the gate wiring and reacts with oxygen in the substrate to form into oxide, which forms an oxide film layer.

Also, for example, a gate insulation film 37 consisting of SiNO or the like is provided on a gate electrode 351, and by applying a thermal treatment in the manufacturing process, an oxide layer expressed by (Cu,Si, additive element)$O_X$ is formed at an interface between the gate electrode 351 and the gate insulation film 37. In this way, the oxide layer can be provided on a surface of Cu alloy by using the Cu alloy as a wiring and electrode material for a TFT-LCD.

A method for manufacturing a liquid display device according to the present invention is provided. The manufacturing process of a TFT substrate 11 of the TFT-LCD according to the present invention comprises a step of depositing copper alloy on a substrate by physical evaporation or chemical vapor deposition, which mainly consists of Cu and forms an oxide layer of an additive element to said Cu on the Cu surface or at an interface with the substrate; and a step of photo-etching the obtained copper alloy film to form at least one of each wiring or each electrode.

In this case, the additive element in the above copper alloy is preferably at least one type of metal selected from the group consisting of Mn, Zn, Ga, Li, Ge, Sr, Ag, In, Sn, Ba, Pr, and Nd. Also in this case, a step of forming an oxide layer on a surface of at least one of the formed wiring or electrode may be included.

Also, an oxygen concentration in atmosphere gas used in the above-described oxide layer formation step is preferably an inert gas such as argon containing oxygen no less than 1 ppm and no more than 100 ppm. Further, the oxygen concentration in the atmosphere gas is preferably 5 to 50 ppm. Alternatively, argon gas containing oxygen as an inevitable purity may also be used. Further, the oxide layer formation step may be a step of forming at least one of the wiring or electrode and then heating at 150 to 400° C. for 2 minutes to 50 hours to form an oxide layer of the additive element in the copper alloy on the surface of at least one of the wiring or electrode.

A thin film of an alloy was deposited on an insulation film $SiO_2$ using Cu-2 atomic % Mn alloy comprised of Cu with a purity of 99.9999% and Mn with a purity of 99.98% as a target material, and thermally treated at a temperature not less than 150° C. and not more than 450° C. Subsequently, a depth compositional profile was analyzed from a surface of the thin film using Auger electron spectroscopy.

Figure 42:
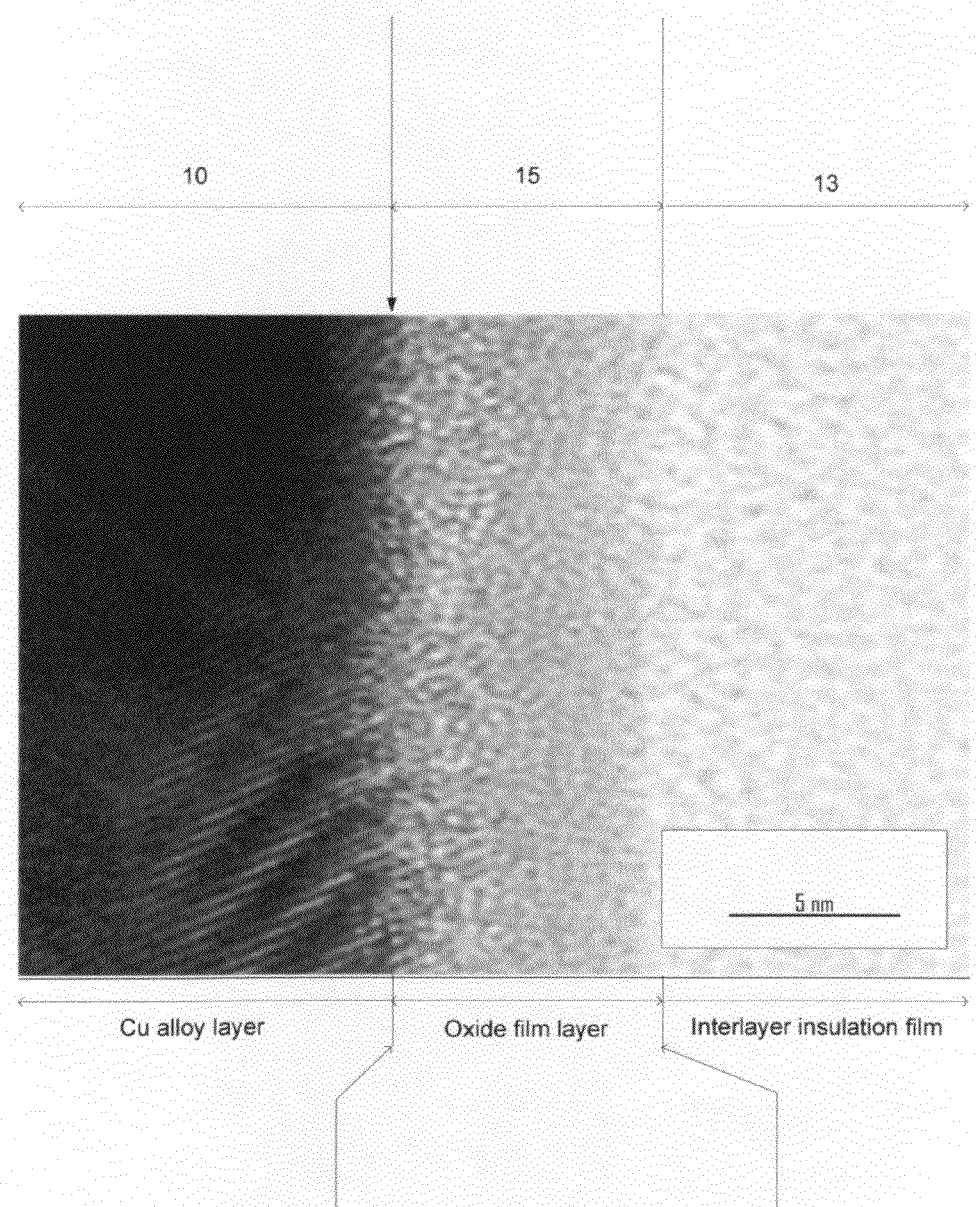
FIG. 42 is a cross-sectional photograph of an oxide film layer for wiring.
Figure 43:
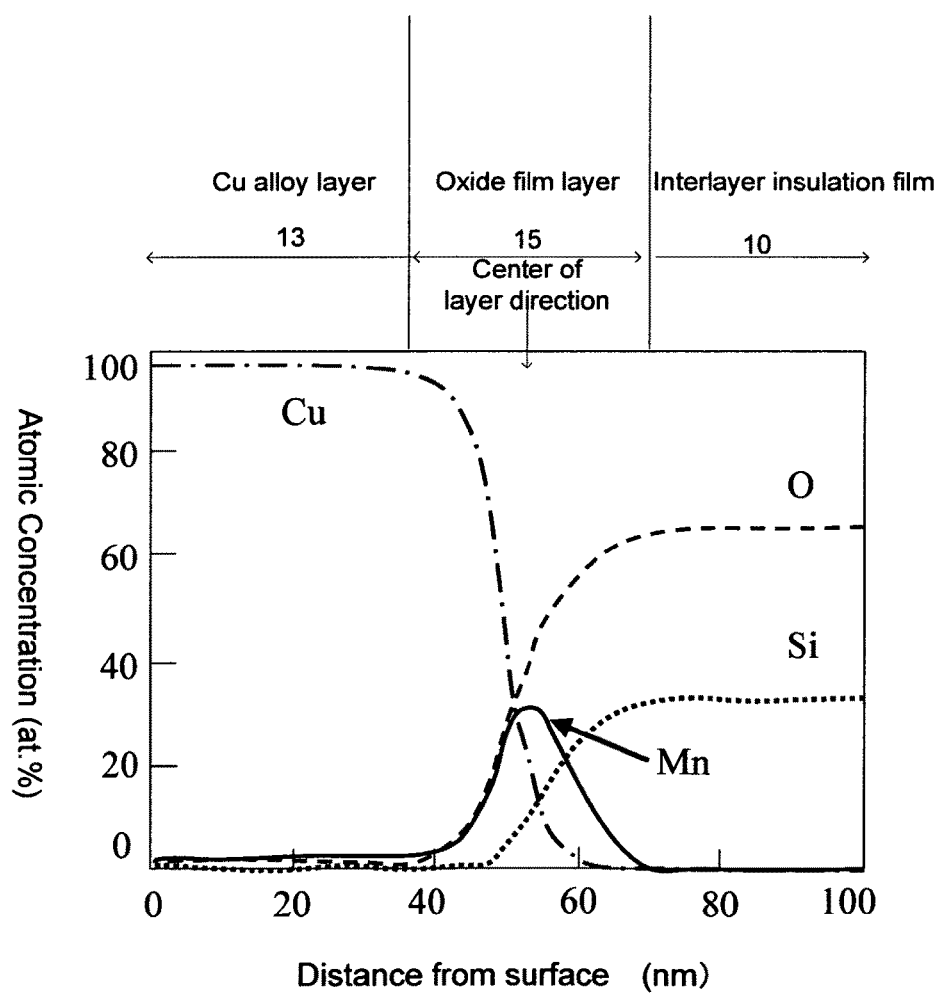
FIG. 43 is a diagram illustrating a composition of an oxide film layer for wiring.

Also, a cross-sectional sample was prepared, and a cross-sectional photograph thereof is shown in FIG. 42. Further, structural observation and compositional analysis were carried out using a transmission electron microscope and X-ray energy-loss spectroscopy (EELS). One example of the results is shown in FIG. 43. A stable oxide layer that contains Mn as a main element and has a thickness of a few nm to 20-odd nm is formed around an interface between the Cu—Mn alloy and the insulating substrate and around a surface of the Cu—Mn alloy.

Figure 44:
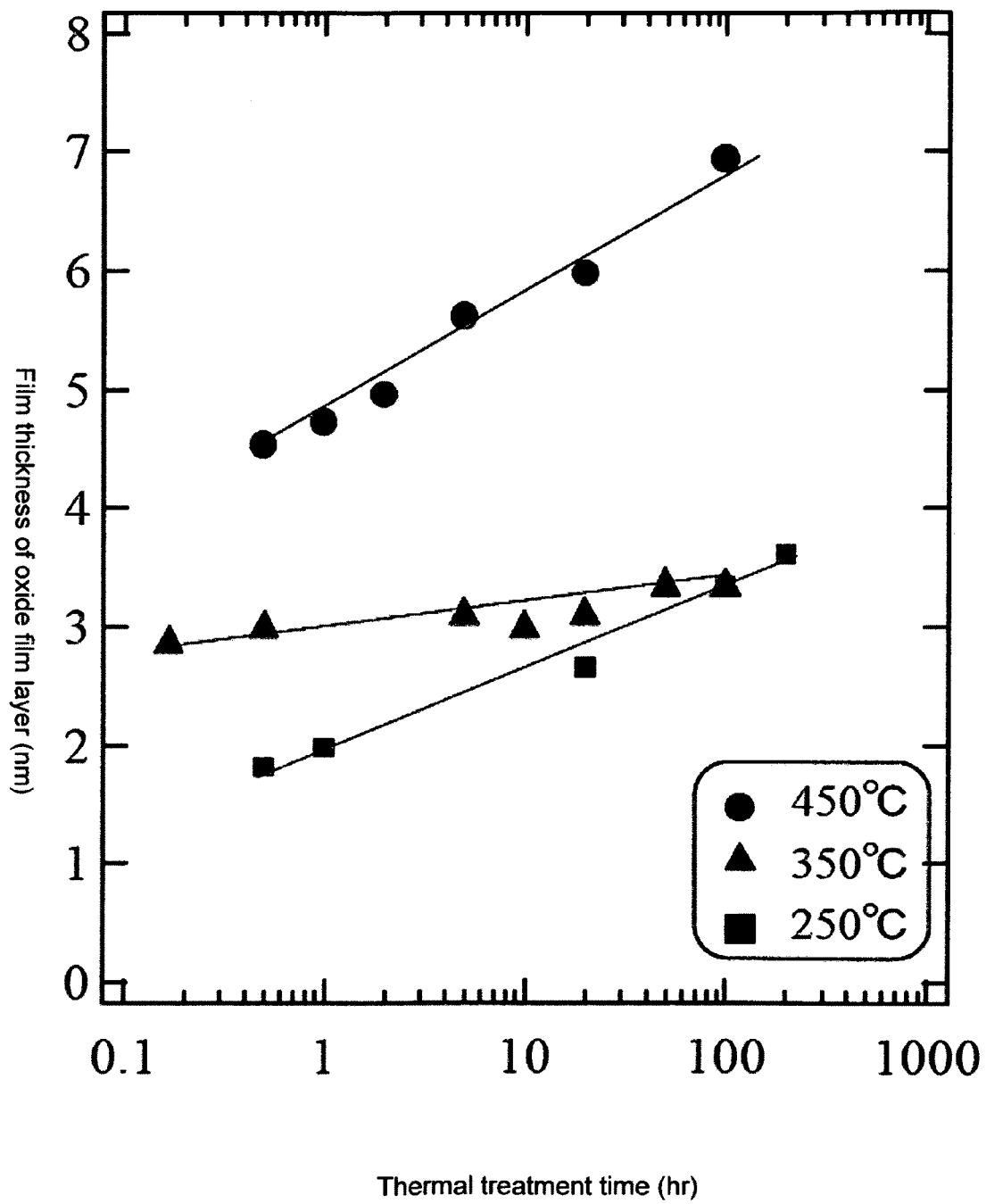
FIG. 44 is a film thickness of an oxide film layer.

FIG. 44 shows a variation in film thickness of the oxide layer against a thermal treatment time period. Table 2 shows a film thickness of the obtained oxide layer against a Mn atomic concentration in the CuMn alloy, a thermal treatment time period, and thermal treatment temperature. FIGS. 32 and 33 shows an enlarged view of a compositional distribution of the oxide layer. The distribution in which Mn has a peak around a center of the oxide film is exhibited. Cu intrudes from the wiring body to the oxide layer; however, the Cu intrusion into the insulation film is prevented.

TABLE 2

Thickness of formed oxide film layer

| Atomic concentration in CuMn alloy (at · %) | Thermal treatment time (minute) | Thermal treatment temperature (° C.) | |
| --- | --- | --- | --- |
| | | 350° C. | 450° C. |
| 10% | 20 min | 3.2 nm | 6.1 nm |
| 20% | 30 min | — | 8.2 nm |

Requirements for a sputtering target are provided in the case where CuMn is used as the copper alloy in the liquid crystal display device of the present invention. In a TFT-LCD of the present invention, a propagation delay in gate wiring is particularly large. In order to reduce the delay, it is preferable to use copper wiring to provide wiring having low resistance close to that of pure copper, as described above.

Figure 45:
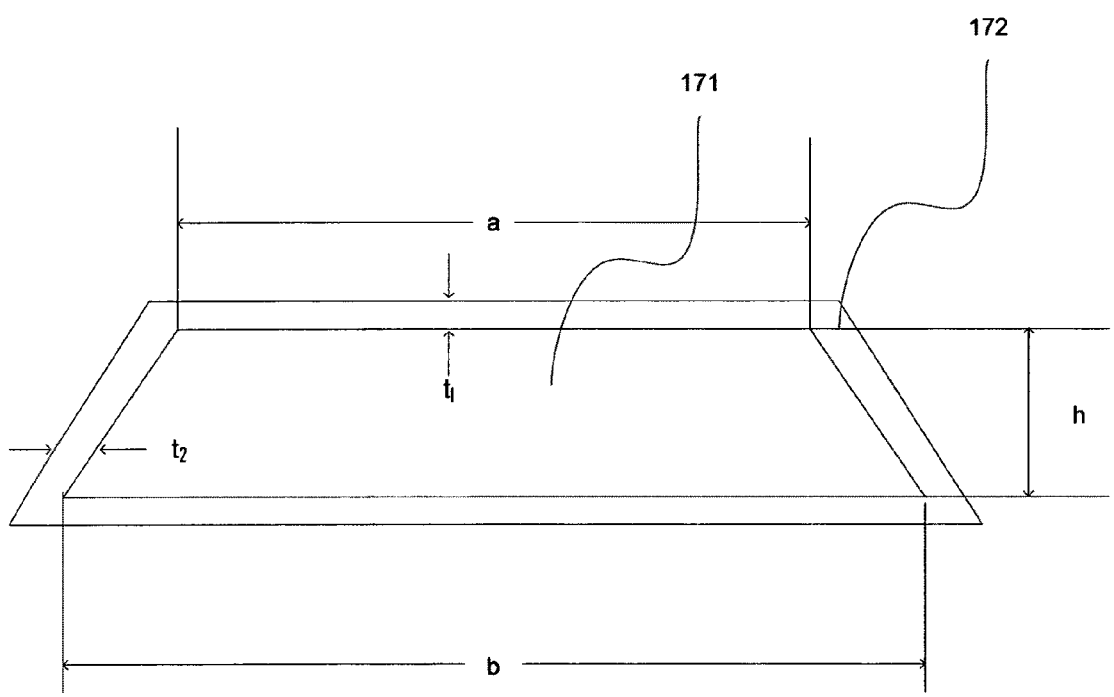
FIG. 45 is diagram of a cross-sectional model of a wiring structure according to the present invention.

FIG. 45 shows a cross-sectional view of gate wiring using CuMn. The gate wiring is comprised of a wiring body 171 and an oxide film layer 172. Parameters a, b, h, $t_1$, and $t_2$ in FIG. 45 represents sizes of respective parts. a and b are a few µm to 10-odd µm, and h is 200 to 500 nm. $t_1$ and $t_2$ are 2 to 10 nm. In this case, in order for the wiring body 171 to provide low resistivity close to that of pure copper, an amount of Mn corresponding to that contained in the oxide film layer 172 formed by a thermal treatment is preferably contained in the wiring body 171, CuMn, before the thermal treatment. Accordingly, a content of Mn that is an additive element contained in the sputtering target is provided.

[Organic EL]

Figure 46:
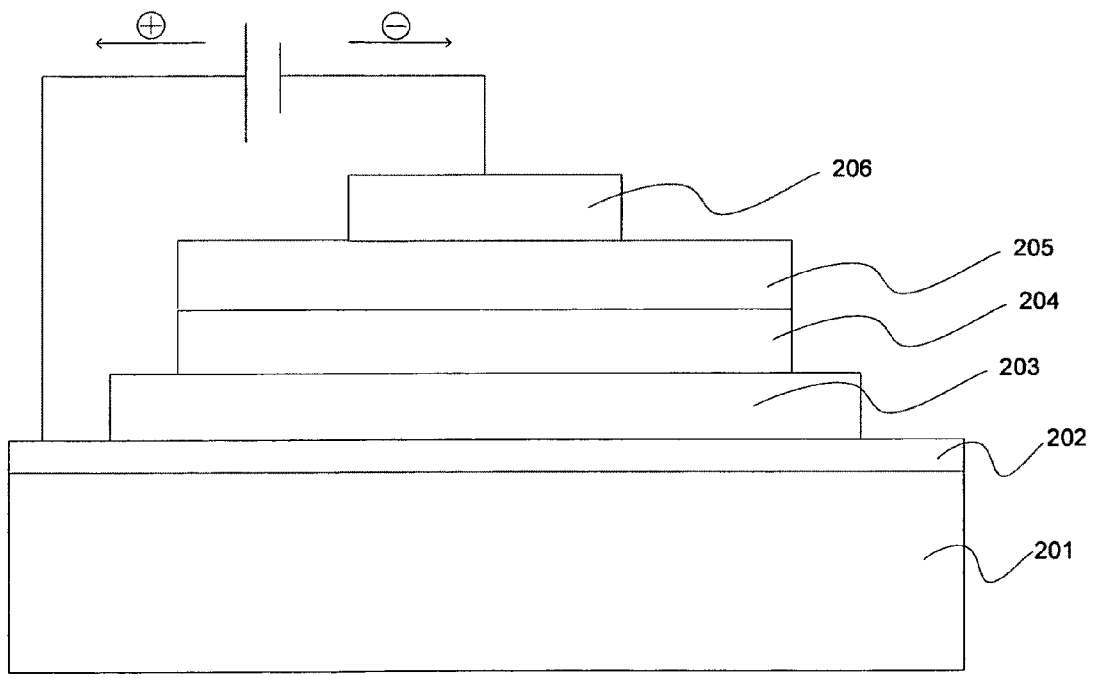
FIG. 46 is one (1) example of a cross-section of an organic EL element.

The present invention is not limited to a TFT liquid crystal display device, but applicable to an organic EL display device. One example of organic EL according to the present invention is illustrated in FIG. 46. It is mainly comprised of a glass substrate 201; an anode (ITO) 202, a hole transport layer (HTL) 203, an emission layer (EML) 204, and an electron transport layer (ETL) 205, which are sequentially stacked on the glass substrate 201; and a cathode 206 arranged on the electron transport layer 205. For the emission layer, an organic matter such as a diamine system is used. The anode 202 and the cathode 206 are electrically connected to each other with an electrode line through a power supply. Each of the layers has a thickness of, for example, approximately a few tens of nanometers (nm).

The organic EL display device comprises a scanning line 194, a signal line 195, and a power line 196, which intersect with one another in a matrix form on the substrate 181 (shown in FIG. 48), and a pixel area 198 surrounded by the scanning line 194, the signal line 195, and the power line 196, and as one example, the pixel area 198 has an organic EL element 191, a driving TFT 192, and a switching TFT 193.

The organic EL comprises the anode, the hole transport layer, the organic emission layer, the electron transport layer, and the cathode, which are stacked on the glass substrate. One pixel is comprised of a TFT circuit and the organic EL element, and a plurality of pixels are arranged in a matrix form, which is a so-called active matrix organic EL display device.

Figure 47:
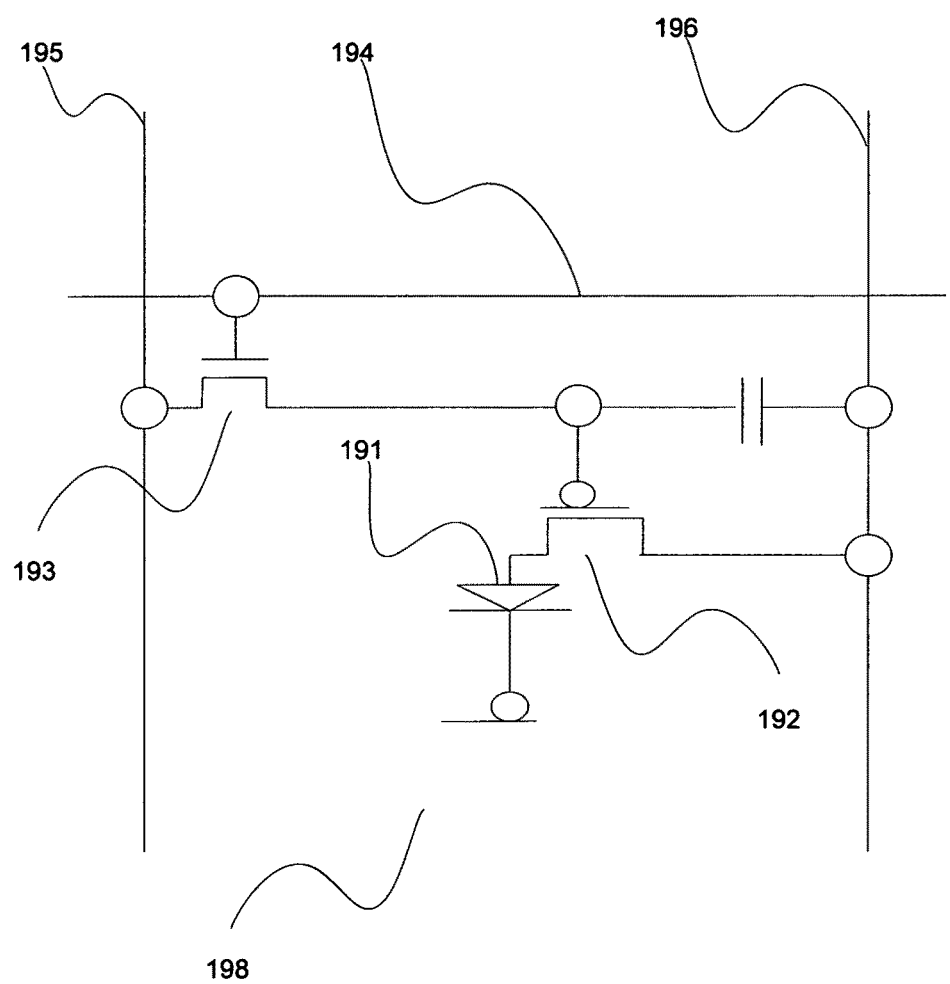
FIG. 47 is one (1) example of an equivalent circuit diagram of a pixel in an organic EL display.
Figure 48:
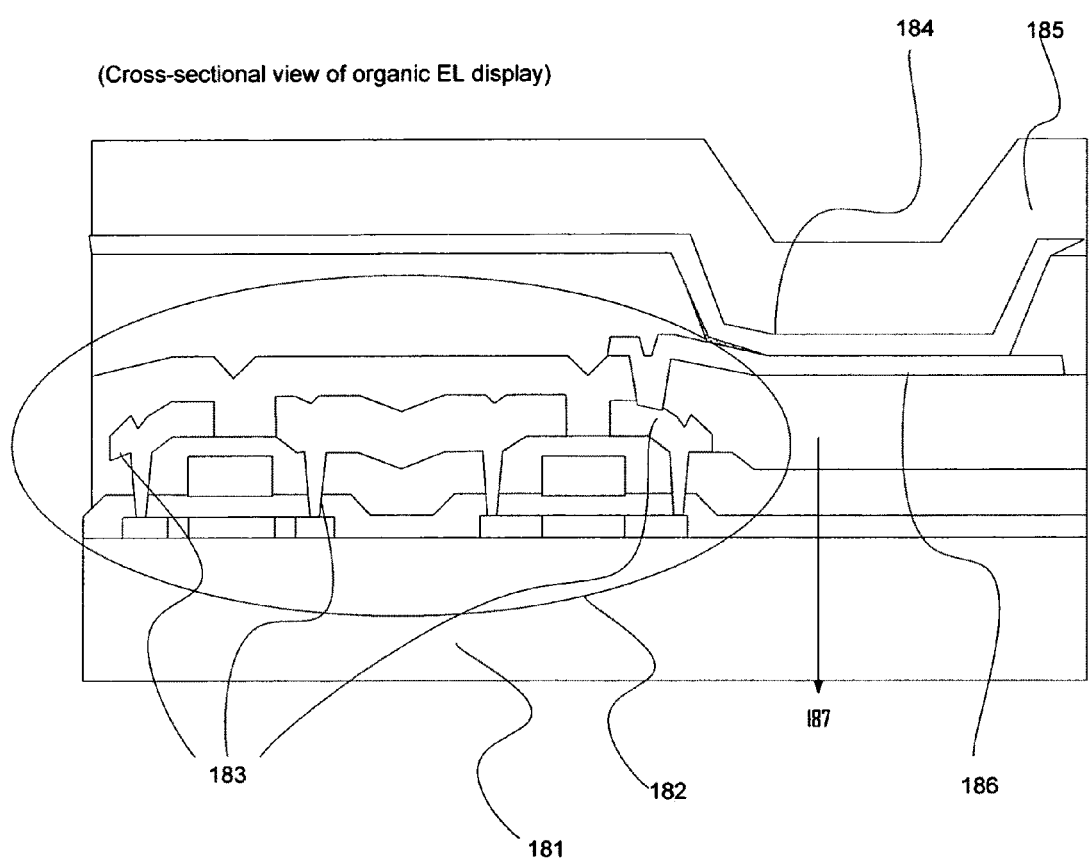
FIG. 48 is one (1) example of a cross-section of an organic EL display.

An equivalent circuit of one pixel is shown in FIG. 47. Also, FIG. 48 shows a cross-sectional view of the pixel. For example, on a glass substrate 181, there are a driving TFT part 182 and an organic EL element 184, in which electrodes 183 for a TFT, a cathode 185 made of metal, and a transparent electrode 186 are present, and in this example, light 187 is emitted toward a lower part of the substrate.

In the active matrix organic EL display device, unevenness of an image caused by a propagation delay of a gate voltage pulse generated in an active matrix liquid crystal display device occurs. To deal with it, copper alloy is used as a wiring material having high conductivity.

The copper alloy of the present invention is useful for a scanning line and a signal line. In the organic EL display device according to the present invention, at least one of the scanning line, the signal line, the power line, or the TFT electrode uses copper as a main component, and consists of copper alloy that forms an oxide layer of an additive element to Cu, which covers wiring or the electrode. A cross-section of the wiring is a structure such as FIG. 45.

Further, regarding the copper alloy, copper alloy in which an additive element is diffused to a surface of the copper alloy to form an oxide film layer of the additive element may be used. Still further, the additive element may be at least one type of metal selected from the group consisting of Mn, Zn, Ga, Li, Ge, Sr, Ag, In, Sn, Ba, Pr, and Nd. Also, the additive element is preferably at least one type of metal selected from the group consisting of Mn, Zn, and Ga. Still further, the additive element is preferably Mn.

Further, the configuration of the external extraction electrode terminal is preferably to be those of FIGS. 16, 17, 18, and 19.

What is claimed is:

1. A thin film transistor comprising:
   an electrode terminal comprising at least one electrode, the at least one electrode comprising a layer comprising copper and an oxide covering the layer, wherein the oxide is formed as a single layer, and wherein a composition formula of the oxide is $Cu_xMn_ySi_zO$ ($0<x<y$, $0<z<y$).

2. The thin film transistor of claim 1, wherein the TFT electrode terminal comprises a passivation layer, and the passivation layer is formed on the at least one electrode.

3. The thin film transistor of claim 2, wherein the passivation layer comprises a silicon nitride ($SiN_x$) layer.

4. The thin film transistor of claim 2, wherein the passivation layer comprises at least one of a silicon oxide ($SiO_x$) layer and a silicon nitride oxide ($SiN_yO_x$) layer.

5. The thin film transistor of claim 2, wherein the passivation layer comprises an organic layer.

6. The thin film transistor of claim 1, wherein the TFT electrode terminal further comprises a semiconductor layer having an ohmic contact with the at least one electrode.

7. The thin film transistor of claim 1, wherein the TFT electrode terminal further comprises a pixel electrode having an ohmic contact with the at least one electrode.

8. The thin film transistor of claim 7, wherein the pixel electrode comprises one or more of indium tin oxide (ITO), indium zinc oxide (IZO), and indium tin zinc oxide (ITZO).

9. The thin film transistor of claim 1, wherein the layer comprises a copper alloy, and wherein the copper alloy comprises manganese (Mn).

10. The thin film transistor of claim 9, wherein an amount of the manganese (Mn) is in a range of 0.5 to 25 atom %.

11. The thin film transistor of claim 1, wherein the oxide comprises silicon (Si).

12. The thin film transistor of claim 1, wherein the oxide comprises manganese (Mn) and copper (Cu).

13. A thin film transistor comprising:
   at least one electrode, the at least one electrode comprising a layer comprising copper and an oxide directly covering the layer, wherein the oxide is a single layer having a composition formula of $Cu_xMn_ySi_zO$ ($0<x<y$, $0<z<y$).

14. The thin film transistor of claim 13, wherein the thin film transistor includes a passivation layer, and wherein the passivation layer is formed on the at least one electrode.

15. The thin film transistor of claim 14, wherein the passivation layer comprises a silicon nitride ($SiN_x$) layer.

16. The thin film transistor of claim 14, wherein the passivation layer comprises at least one of a silicon oxide ($SiO_x$) layer and a silicon nitrided oxide ($SiN_yO_x$) layer.

17. The thin film transistor of claim 14, wherein the passivation layer comprises an organic layer.

18. The thin film transistor of claim 13, wherein the TFT electrode terminal further comprises a semiconductor layer having an ohmic contact with the at least one electrode.

19. The thin film transistor of claim 13, wherein the TFT electrode terminal further comprises a pixel electrode having an ohmic contact with the at least one electrode.

20. The thin film transistor of claim 19, wherein the pixel electrode comprises one or more of indium tin oxide (ITO), indium zinc oxide (IZO), and indium tin zinc oxide (ITZO).

21. The thin film transistor of claim 13, wherein the layer comprises a copper alloy, and wherein the copper alloy comprises manganese (Mn).

22. The thin film transistor of claim 21, wherein an amount of the manganese (Mn) is in a range of 0.5 to 25 atom %.

23. The thin film transistor of claim 13, wherein the oxide comprises silicon (Si).

* * * * *